(12) United States Patent
Suzuki et al.

(10) Patent No.: US 10,270,041 B2
(45) Date of Patent: Apr. 23, 2019

(54) LIGHT-EMITTING ELEMENT, LIGHT-EMITTING DEVICE, ELECTRONIC DEVICE, AND LIGHTING DEVICE

(71) Applicant: Semiconductor Energy Laboratory Co., Ltd., Atsugi-shi, Kanagawa-ken (JP)

(72) Inventors: Tsunenori Suzuki, Kanagawa (JP); Yusuke Takita, Kanagawa (JP); Satoshi Seo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 162 days.

(21) Appl. No.: 15/234,158

(22) Filed: Aug. 11, 2016

(65) Prior Publication Data

US 2017/0062734 A1  Mar. 2, 2017

(30) Foreign Application Priority Data

Aug. 28, 2015 (JP) ................................ 2015-168476
Oct. 15, 2015 (JP) ................................ 2015-203894

(51) Int. Cl.
*H01L 51/50* (2006.01)
*H01L 51/00* (2006.01)

(52) U.S. Cl.
CPC ...... *H01L 51/0072* (2013.01); *H01L 51/5004* (2013.01); *H01L 51/006* (2013.01);
(Continued)

(58) Field of Classification Search
None
See application file for complete search history.

(56) References Cited

U.S. PATENT DOCUMENTS

| 8,203,262 B2 | 6/2012 | Seo et al. |
| 8,841,655 B2 | 9/2014 | Okamoto |
| 9,343,681 B2 | 5/2016 | Suzuki et al. |

(Continued)

FOREIGN PATENT DOCUMENTS

| CN | 001586095 A | 2/2005 |
| EP | 1444869 A | 8/2004 |

(Continued)

OTHER PUBLICATIONS

International Search Report (Application No. PCT/IB2016/054941), dated Dec. 6, 2016.
(Continued)

*Primary Examiner* — Gregory D Clark
(74) *Attorney, Agent, or Firm* — Fish & Richardson P.C.

(57) ABSTRACT

A light-emitting element including a first electrode, a second electrode, and an EL layer positioned therebetween is provided. The EL layer includes a stack of a hole-injection layer, a first layer, a second layer, a third layer, and a fourth layer; the hole-injection layer includes an organic acceptor; the first layer, the second layer and the third layer include first, second and third hole-transport materials, respectively; and the fourth layer includes a host material and a light-emitting material; the HOMO level of the second hole-transport material is deeper than that of the first hole-transport material; the HOMO level of the host material is deeper than that of the second hole-transport material; the HOMO level of the third hole-transport material is deeper than or equal to that of the host material; and a HOMO level difference between the second and third hole-transport materials is less than or equal to 0.3 eV.

28 Claims, 46 Drawing Sheets

(52) U.S. Cl.
CPC ...... *H01L 51/0052* (2013.01); *H01L 51/0054* (2013.01); *H01L 51/0059* (2013.01); *H01L 2251/552* (2013.01)

(56) References Cited

U.S. PATENT DOCUMENTS

| | | | |
|---|---|---|---|
| 2002/0050786 A1 | 5/2002 | Yamazaki et al. | |
| 2004/0245542 A1 | 12/2004 | Kim | |
| 2014/0001444 A1* | 1/2014 | Kim | H01L 51/5064 257/40 |
| 2014/0084273 A1 | 3/2014 | Nakayama et al. | |
| 2015/0041795 A1 | 2/2015 | Suzuki et al. | |
| 2015/0188057 A1 | 7/2015 | Itoi et al. | |
| 2016/0336519 A1 | 11/2016 | Seo et al. | |

FOREIGN PATENT DOCUMENTS

| | | | |
|---|---|---|---|
| JP | 2002-151269 A | 5/2002 | |
| JP | 2005-510025 | 4/2005 | |
| JP | 2009-177157 A1 | 8/2009 | |
| JP | 2011-009498 * | 1/2011 | ............ H01L 51/50 |
| JP | 2011-009498 | 1/2011 | |
| JP | 2014-167946 A | 9/2014 | |
| JP | 2015-128113 A | 7/2015 | |
| JP | 2015-128115 A | 7/2015 | |
| JP | 2015-144233 A | 8/2015 | |
| KR | 2003-0039100 A | 5/2003 | |
| KR | 2015-0018437 A | 2/2015 | |
| KR | 2015-0077269 A | 7/2015 | |
| TW | 201304232 | 1/2013 | |
| WO | WO-2003/043383 | 5/2003 | |
| WO | 2011/065136 A1 | 6/2011 | |
| WO | WO-2012/176674 | 12/2012 | |

OTHER PUBLICATIONS

Written Opinion (Application No. PCT/IB2016/054941), dated Dec. 6, 2016.

* cited by examiner

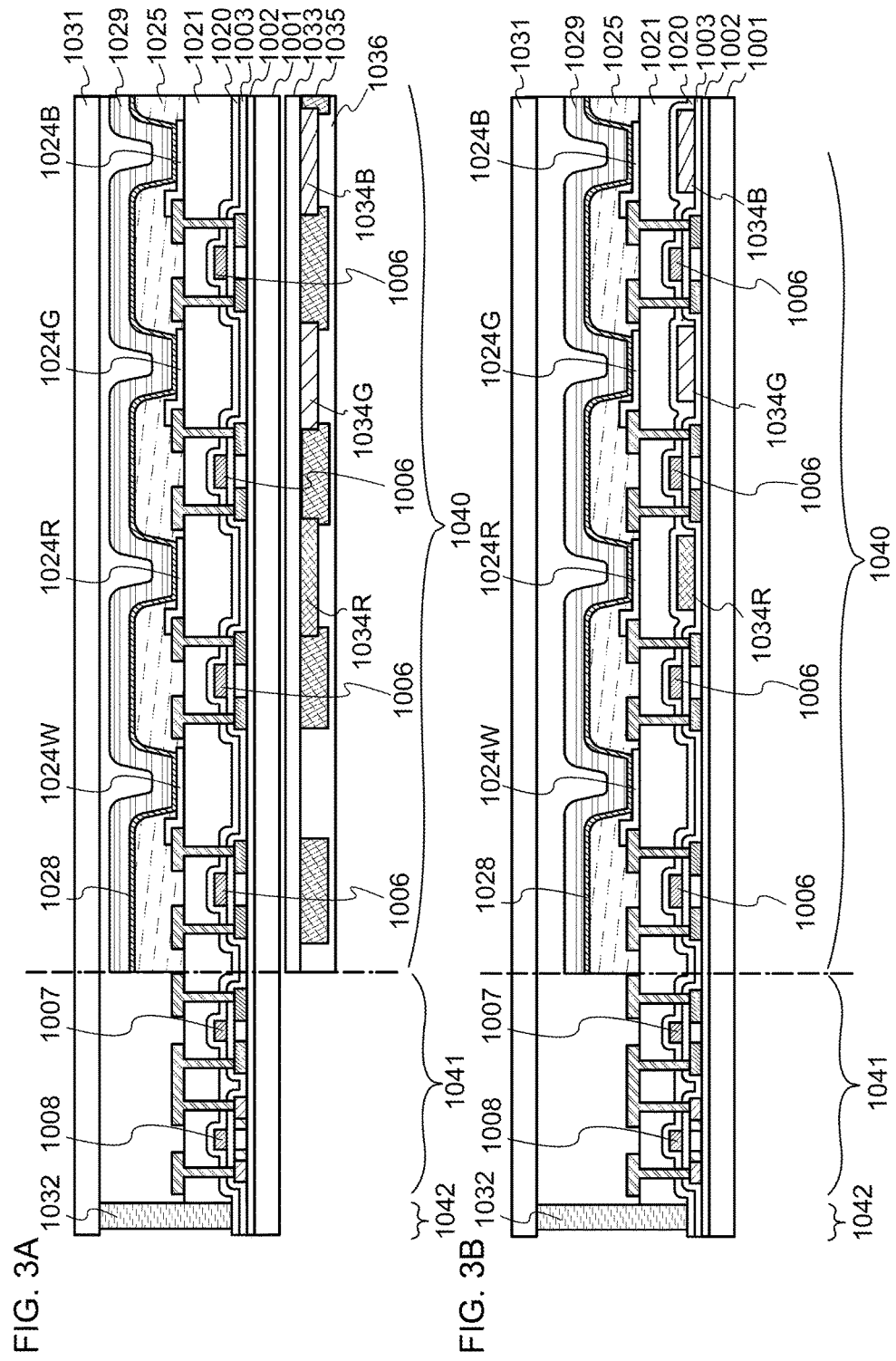

FIG. 7A
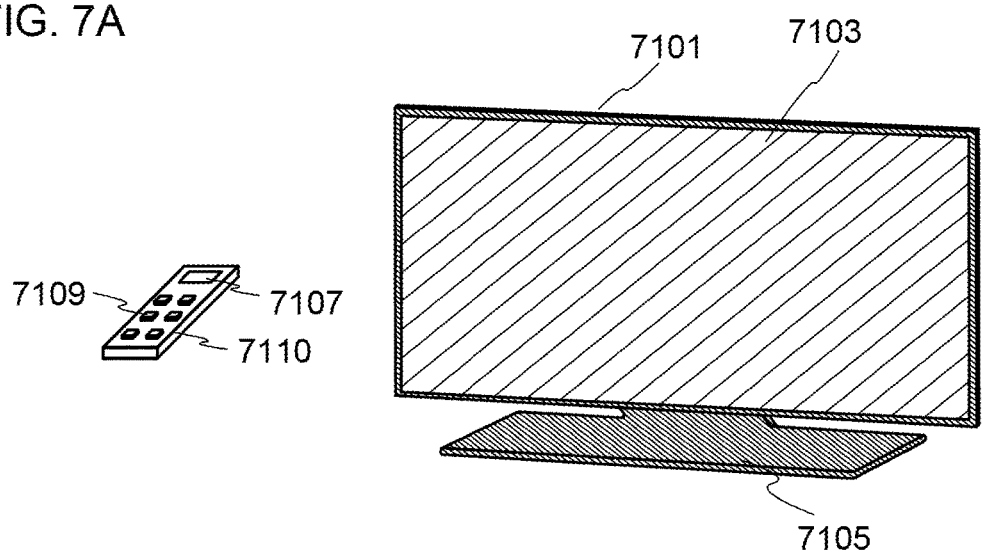
FIG. 7B1
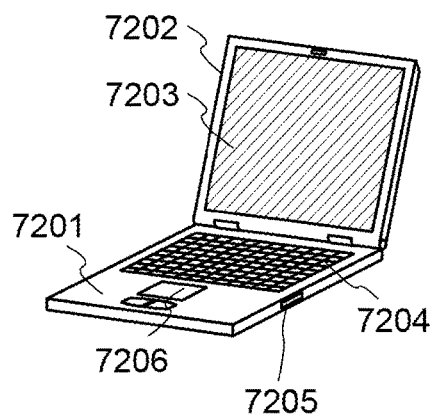
FIG. 7B2
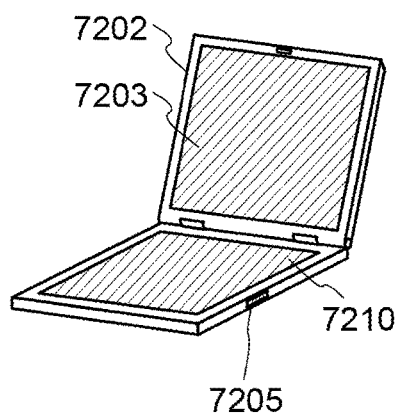
FIG. 7C
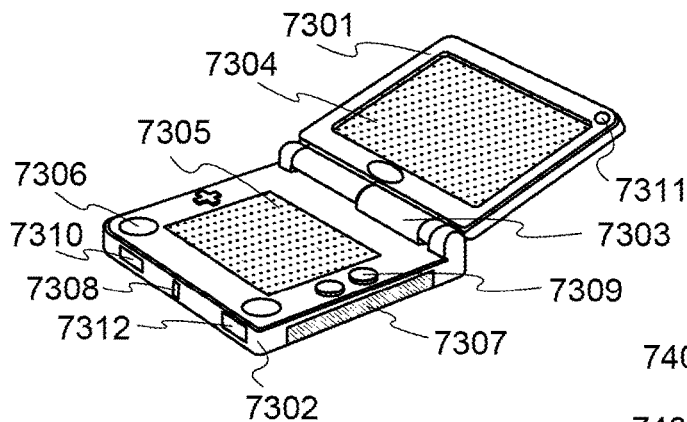
FIG. 7D
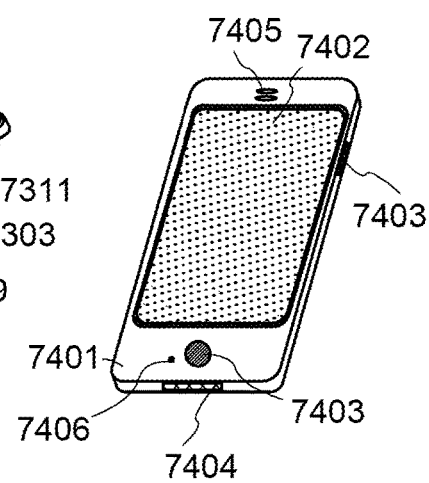

LIGHT-EMITTING ELEMENT, LIGHT-EMITTING DEVICE, ELECTRONIC DEVICE, AND LIGHTING DEVICE

TECHNICAL FIELD

One embodiment of the present invention relates to a light-emitting element, a display module, a lighting module, a display device, a light-emitting device, an electronic device, and a lighting device. Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for driving any of them, and a method for manufacturing any of them.

BACKGROUND ART

Light-emitting elements (organic EL elements) including organic compounds and utilizing electroluminescence (EL) have been put to more practical use. In the basic structure of such light-emitting elements, an organic compound layer containing a light-emitting material (an EL layer) is interposed between a pair of electrodes. Carriers are injected by application of voltage to the element, and recombination energy of the carriers is used, whereby light emission can be obtained from the light-emitting material.

The light-emitting elements are self-luminous elements and thus have advantages over liquid crystal displays, such as high visibility and no need for backlight when used as pixels of a display, and are suitable as flat panel display elements. In addition, it is also a great advantage that a display including such light-emitting elements can be manufactured as a thin and lightweight display. Furthermore, extremely high response speed is also a feature thereof.

In such light-emitting elements, light-emitting layers can be successively formed two-dimensionally, so that planar light emission can be obtained. Thus, a large-area light source can be easily formed. This feature is difficult to realize with point light sources typified by incandescent lamps and LEDs or linear light sources typified by fluorescent lamps. Thus, light-emitting elements also have great potential as planar light sources applied to lighting devices and the like.

Displays or lighting devices including light-emitting elements can be suitably used for a variety of electronic devices as described above, and research and development of light-emitting elements have progressed for higher efficiency or longer lifetimes.

An organic acceptor is given as an example of a material of a hole-injection layer that is used for facilitating injection of carriers, particularly injection of holes, to an EL layer. An organic acceptor is suitable for mass production because it can be easily formed by evaporation; therefore, the use of an organic acceptor spreads widely. However, when the LUMO level of an organic acceptor is distanced from the HOMO level of an organic compound included in a hole-transport layer, it is difficult to inject holes to an EL layer. Thus, in order to make the LUMO level of the organic acceptor closer to the HOMO level of the organic compound included in the hole-transport layer, a substance with a shallow HOMO level is used as the organic compound included in the hole-transport layer. In that case, the difference between the HOMO level of a host material used in the light-emitting layer and the HOMO level of the organic compound included in the hole-transport layer is large. Therefore, even when holes can be injected to the EL layer, it is difficult to inject holes from the hole-transport layer to the host material of the light-emitting layer.

Patent document 1 discloses a structure in which a hole-transport material whose HOMO level is between the HOMO level of a first hole-injection layer and the HOMO level of a host material is provided between a light-emitting layer and a first hole-transport layer in contact with the hole-injection layer.

Although characteristics of light-emitting elements have been improved remarkably, advanced requirements for various characteristics including efficiency and durability are not yet satisfied.

REFERENCE

Patent Document

[Patent Document 1] PCT International Publication No. WO2011/065136

DISCLOSURE OF INVENTION

An object of one embodiment of the present invention is to provide a novel light-emitting element. Another object of one embodiment of the present invention is to provide a light-emitting element with a long lifetime. Another object of one embodiment of the present invention is to provide a light-emitting element with high emission efficiency.

Another object of one embodiment of the present invention is to provide a highly reliable light-emitting device, a highly reliable electronic device, and a highly reliable display device. Another object of one embodiment of the present invention is to provide a light-emitting device, an electronic device, and a display device each with low power consumption.

It is only necessary that at least one of the above-described objects be achieved in the present invention.

A light-emitting element of one embodiment of the present invention includes a first electrode, a second electrode, and an EL layer. In the light-emitting element, the EL layer is positioned between the first electrode and the second electrode; the EL layer includes a hole-injection layer, a first layer, a second layer, a third layer, and a fourth layer; the hole-injection layer includes an organic acceptor; the hole-injection layer is positioned between the first electrode and the first layer; the second layer is positioned between the first layer and the third layer; the fourth layer is positioned between the third layer and the second electrode; the first layer includes a first hole-transport material; the second layer includes a second hole-transport material; the third layer includes a third hole-transport material; the fourth layer includes a host material and a light-emitting material; the HOMO level of the second hole-transport material is deeper than the HOMO level of the first hole-transport material; the HOMO level of the host material is deeper than the HOMO level of the second hole-transport material; the HOMO level of the third hole-transport material is deeper than or equal to the HOMO level of the host material; and a difference between the HOMO level of the second hole-transport material and the HOMO level of the third hole-transport material is less than or equal to 0.3 eV.

A light-emitting element of one embodiment of the present invention includes a first electrode, a second electrode, and an EL layer. In the light-emitting element, the EL layer is positioned between the first electrode and the second electrode; the EL layer includes a hole-injection layer, a first hole-transport layer, a second hole-transport layer, a third hole-transport layer, and a light-emitting layer; the hole-injection layer includes an organic acceptor; the first hole-transport layer includes a first hole-transport material; the second hole-transport layer includes a second hole-transport material; the third hole-transport layer includes a third hole-transport material; the light-emitting layer includes a host material and a light-emitting material; the HOMO level of the second hole-transport material is deeper than the HOMO level of the first hole-transport material; the HOMO level of the host material is deeper than the HOMO level of the second hole-transport material; the HOMO level of the third hole-transport material is deeper than or equal to the HOMO level of the host material; and a difference between the HOMO level of the second hole-transport material and the HOMO level of the third hole-transport material is less than or equal to 0.3 eV.

Another embodiment of the present invention is the light-emitting element with the above structure, in which the organic acceptor is 2,3,6,7,10,11-hexacyano-1,4,5,8,9,12-hexaazatriphenylene.

Another embodiment of the present invention is the light-emitting element with the above structure, in which the HOMO level of the first hole-transport material is greater than or equal to −5.4 eV.

Another embodiment of the present invention is the light-emitting element with the above structure, in which the difference between the HOMO level of the first hole-transport material and the HOMO level of the second hole-transport material is less than or equal to 0.3 eV.

Another embodiment of the present invention is the light-emitting element with the above structure, in which the difference between the HOMO level of the second hole-transport material and the HOMO level of the third hole-transport material is less than or equal to 0.2 eV.

Another embodiment of the present invention is the light-emitting element with the above structure, in which the difference between the HOMO level of the first hole-transport material and the HOMO level of the second hole-transport material is less than or equal to 0.2 eV.

Another embodiment of the present invention is the light-emitting element with the above structure, in which the HOMO level of the light-emitting material is higher than the HOMO level of the host material.

Another embodiment of the present invention is the light-emitting element with the above structure, in which the first hole-transport material is a substance with a fluorenylamine skeleton.

Another embodiment of the present invention is the light-emitting element with the above structure, in which the second hole-transport material is a substance with a triphenylamine skeleton.

Another embodiment of the present invention is the light-emitting element with the above structure, in which the third hole-transport material is a substance which does not include amine.

Another embodiment of the present invention is the light-emitting element with the above structure, in which the third hole-transport material includes a carbazole skeleton.

Another embodiment of the present invention is the light-emitting element with the above structure, in which the carbazole skeleton is a phenylcarbazole skeleton.

Another embodiment of the present invention is the light-emitting element with the above structure, in which the third hole-transport material includes a triphenylene skeleton.

Another embodiment of the present invention is the light-emitting element with the above structure, in which the third hole-transport material includes a naphthalene skeleton.

Another embodiment of the present invention is the light-emitting element with the above structure, in which the host material includes an anthracene skeleton.

Another embodiment of the present invention is the light-emitting element with the above structure, in which the host material includes a diphenylanthracene skeleton.

Another embodiment of the present invention is the light-emitting element with the above structure, in which the host material includes a carbazole skeleton.

Another embodiment of the present invention is the light-emitting element with the above structure, in which the carbazole skeleton is a benzocarbazole skeleton. It is particularly preferable that the carbazole skeleton be a dibenzocarbazole skeleton.

Another embodiment of the present invention is the light-emitting element with the above structure, in which the light-emitting material is a fluorescent substance.

Another embodiment of the present invention is the light-emitting element with the above structure, in which the light-emitting material emits blue fluorescence.

Another embodiment of the present invention is the light-emitting element with the above structure, in which the light-emitting material is a condensed aromatic diamine compound.

Another embodiment of the present invention is the light-emitting element with the above structure, in which the light-emitting material is a pyrenediamine compound.

Another embodiment of the present invention is a light-emitting device including the light-emitting element with the above structure and a transistor or a substrate.

Another embodiment of the present invention is an electronic device including the above light-emitting device and a sensor, an operation button, a speaker, or a microphone.

Another embodiment of the present invention is a lighting device including the above light-emitting device and a housing.

Note that the light-emitting device in this specification includes an image display device using a light-emitting element. The light-emitting device may be included in a module in which a light-emitting element is provided with a connector such as an anisotropic conductive film or a tape carrier package (TCP), a module in which a printed wiring board is provided at the end of a TCP, and a module in which an integrated circuit (IC) is directly mounted on a light-emitting element by a chip on glass (COG) method. The light-emitting device may also be included in lighting equipment or the like.

In one embodiment of the present invention, a novel light-emitting element can be provided. Alternatively, a light-emitting element with a long lifetime can be provided. Further alternatively, a light-emitting element with high emission efficiency can be provided.

In another embodiment of the present invention, a highly reliable light-emitting device, a highly reliable electronic device, and a highly reliable display device can be provided. In another embodiment of the present invention, a light-emitting device, an electronic device, and a display device each with low power consumption can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 3A and 3B are conceptual diagrams of an active matrix light-emitting device.
FIGS. 7A to 7D illustrate electronic devices.

BEST MODE FOR CARRYING OUT THE INVENTION

Embodiments of the present invention will be explained below with reference to the drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Embodiment 1

Figure 1A:
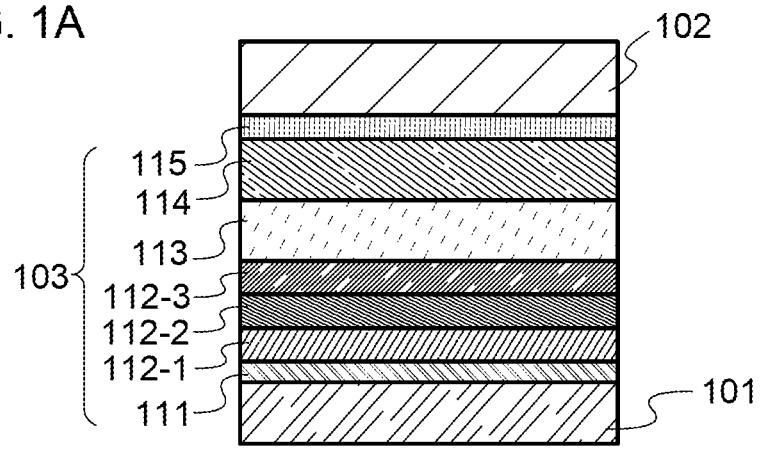
FIGS. 1A to 1C are schematic diagrams of light-emitting elements.

FIG. 1A illustrates a light-emitting element of one embodiment of the present invention. The light-emitting element of one embodiment of the present invention includes a first electrode 101, a second electrode 102, and an EL layer 103. The EL layer 103 includes a hole-injection layer 111, a first hole-transport layer 112-1, a second hole-transport layer 112-2, a third hole-transport layer 112-3, and a light-emitting layer 113 which are provided in this order from the first electrode 101 side. Furthermore, the EL layer 103 may further include an electron-transport layer 114 and an electron-injection layer 115.

In the light-emitting element of one embodiment of the present invention, the light-emitting layer 113 includes a host material and a light-emitting material; the hole-injection layer 111 includes an organic acceptor; and the first hole-transport layer 112-1, the second hole-transport layer 112-2, and the third hole-transport layer 112-3 include a first hole-transport material, a second hole-transport material, and a third hole-transport material, respectively.

The HOMO level of the host material is deeper than the HOMO level of the second hole-transport material, and the HOMO level of the second hole-transport material is deeper than the HOMO level of the first hole-transport material. The HOMO level of the third hole-transport material is deeper than or equal to the HOMO level of the host material. Note that the difference between the HOMO level of the second hole-transport material and the HOMO level of the third hole-transport material is less than or equal to 0.3 eV.

The organic acceptor is an organic compound with a deep LUMO level. When charge separation is caused between the organic acceptor and another organic compound whose HOMO level is close to the LUMO level of the organic acceptor, holes are generated in the organic compound. In other words, holes are generated in the first hole-transport material, which is in contact with the organic acceptor in the light-emitting element of one embodiment of the present invention. As the organic acceptor, a compound including an electron-withdrawing group (a halogen group or a cyano group), e.g., 7,7,8,8-tetracyano-2,3,5,6-tetrafluoroquinodimethane (abbreviation: $F_4$-TCNQ), 3,6-difluoro-2,5,7,7,8,8-hexacyanoquinodimethane, chloranil, or 2,3,6,7,10,11-hexacyano-1,4,5,8,9,12-hexaazatriphenylene (abbreviation: HAT-CN), can be used. HAT-CN is particularly preferable because it has a high acceptor property and exhibits stable film quality.

Although the difference between the LUMO level of the organic acceptor and the HOMO level of the first hole-transport material is not particularly limited because it depends on the strength of the acceptor property of the organic acceptor, holes can be injected when the difference between the levels is less than or equal to approximately 1 eV. Since the LUMO level of HAT-CN is estimated to −4.41 eV by cyclic voltammetry measurement, in the case where HAT-CN is used as the organic acceptor, the HOMO level of the first hole-transport material is preferably greater than or equal to −5.4 eV. Note that if the HOMO level of the first hole-transport material is too high, the hole-injection property for the second hole-transport material deteriorates. In addition, since the work function of an anode such as ITO is approximately −5 eV, the use of a material whose HOMO level is higher than −5 eV as the first hole-transport material brings a disadvantage. Therefore, the HOMO level of the first hole-transport material is preferably less than or equal to −5.0 eV.

Holes generated in the first hole-transport material move toward the second electrode 102 by an electric field to be injected to the second hole-transport layer 112-2. The HOMO level of the second hole-transport material included in the second hole-transport layer 112-2 is positioned between the HOMO level of the first hole-transport material and the HOMO level of the host material, which allows the holes to be injected from the first hole-transport layer 112-1 to the second hole-transport layer 112-2 easily. Note that to smoothly inject the holes, the difference in HOMO level between the hole-transport material and the second hole-transport material is preferably less than or equal to 0.3 eV; to inject the holes more easily, the difference is further preferably less than or equal to 0.2 eV.

The holes injected to the second hole-transport layer 112-2 move further toward the second electrode 102 to be injected to the third hole-transport layer 112-3. The HOMO level of the third hole-transport material included in the third hole-transport layer 112-3 is deeper than or equal to the HOMO level of the host material, and the difference in HOMO level between the third hole-transport material and the second hole-transport material is less than 0.35 eV (less than or equal to 0.3 eV with one significant figure). Since the difference between the HOMO level of the second hole-transport material and the HOMO level of the third hole-transport material is less than or equal to 0.3 eV, holes are smoothly injected from the second hole-transport layer 112-2 to the third hole-transport layer 112-3. Note that for more smooth hole injection, the difference between the HOMO level of the third hole-transport material and the HOMO level of the second hole-transport material is preferably less than 0.25 eV (less than or equal to 0.2 eV with one significant figure).

Since the HOMO level of the third hole-transport material is deeper than or equal to the HOMO level of the host material, no barrier exists when holes are injected from the hole-transport layer 112-3 to the light-emitting layer 113; furthermore, holes are likely to be injected directly not only to the light-emitting material but also to the host material. If holes enter the light-emitting material preferentially, movement of holes in the light-emitting layer becomes extremely difficult, and a light-emitting region is localized at the interface between the hole-transport layer and the light-emitting layer, which adversely affects the element lifetime. In contrast, when holes also enters the host material as in one embodiment of the present invention, the holes are transferred mainly in the host in the light-emitting layer while being moderately influenced by hole trapping in the light-emitting material; therefore, the light-emitting region can be expanded moderately, resulting in high efficiency and long lifetime. The moderate expansion of the light-emitting region means that holes are transferred in the light-emitting layer to some extent but do not penetrate the light-emitting layer. Accordingly, it is preferable that the host material have a hole-transport property, specifically, have an anthracene skeleton or a carbazole skeleton. An anthracene skeleton is particularly preferable because it is preferable that the host material have an electron-transport property. In other words, it is further preferable that the host material have both of an anthracene skeleton and a carbazole skeleton. The carbazole skeleton is preferably a benzocarbazole skeleton or dibenzocarbazole. This is because the HOMO level of any of these structures is higher than the HOMO level of carbazole by approximately 0.1 eV, which facilitates holes to enter the host material (as a result, the moderate expansion of the light-emitting region described above is facilitated). In this manner, including the third hole-transport layer 112-3 is one of the features of the light-emitting element of one embodiment of the present invention.

Here, in the case where the HOMO level of the light-emitting material is shallower than the HOMO level of the host material, when holes are injected to the light-emitting layer from the hole-transport material whose HOMO level is shallower than that of the host material, the holes are injected preferentially to the light-emitting material than to the host material. When holes are injected to the light-emitting material with a shallow HOMO level, the holes are trapped. The trap of holes inhibits holes from flowing, which causes problems such as accumulation of charge, acceleration of deterioration of the light-emitting layer due to localization of a recombination region, and reduction in light-emitting efficiency.

In contrast, in a light-emitting element which includes the third hole-transport layer 112-3 and in which the HOMO level of the third hole-transport material of the third hole-transport layer 112-3 is deeper than or equal to the HOMO level of the host material as in the light-emitting element of this embodiment, holes are preferentially injected to the host material first, not to the light-emitting material. As a result, the flow of holes is not inhibited, holes are moderately trapped in the light-emitting material, and the recombination region is dispersed, which results in various effects such as improvements in the reliability and light-emitting efficiency.

Next, examples of specific structures and materials of the above-described light-emitting element are described. As described above, the light-emitting element of one embodiment of the present invention includes the EL layer 103 that is sandwiched between the pair of electrodes (the first electrode 101 and the second electrode 102) and has a plurality of layers. In the EL layer 103, at least the hole-injection layer 111, the first hole-transport layer 112-1, the second hole-transport layer 112-2, the third hole-transport layer 112-3, and the light-emitting layer 113 are provided from the first electrode 101 side.

There is no particular limitation on the other layers included in the EL layer 103, and various layers such as a hole-injection layer, a hole-transport layer, an electron-injection layer, a carrier-blocking layer, an exciton-blocking layer, and a charge-generation layer can be employed.

Since the first electrode 101 is preferably formed using any of metals, alloys, conductive compounds with a high work function (specifically, a work function of 4.0 eV or more), mixtures thereof, and the like. Specific examples include indium oxide-tin oxide (ITO: indium tin oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is deposited by a sputtering method using a target obtained by adding 1 wt % to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 wt % to 5 wt % and 0.1 wt % to 1 wt %, respectively. Alternatively, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), or the like can be used. Graphene can also be used. Note that when a composite material described later is used for a layer which is in contact with the first electrode 101 in the EL layer 103, an electrode material can be selected regardless of its work function.

Figure 1B:
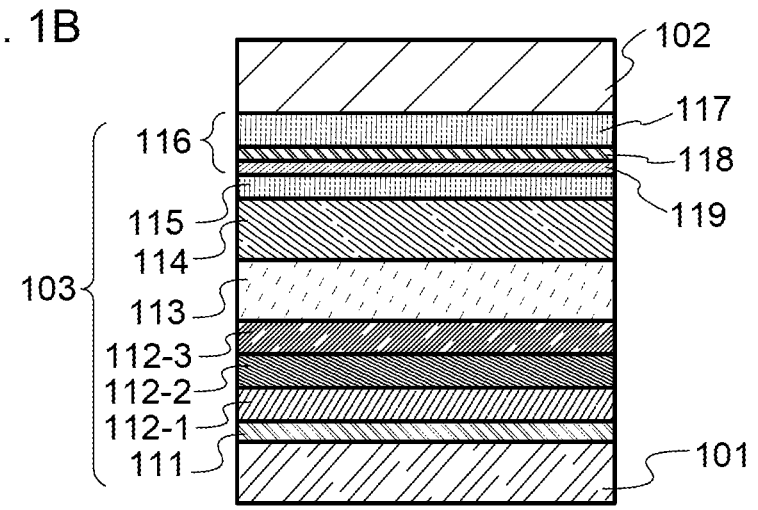

Two kinds of stacked layer structure of the EL layer 103 are described: a structure illustrated in FIG. 1A, which includes the electron-transport layer 114 and the electron-injection layer 115 in addition to the hole-injection layer 111, the first hole-transport layer 112-1, the second hole-transport layer 112-2, the third hole-transport layer 112-3, and the light-emitting layer 113; and a structure illustrated in FIG. 1B, which includes the electron-transport layer 114, the electron-injection layer 115, and a charge generation layer 116 in addition to the hole-injection layer 111, the first hole-transport layer 112-1, the second hole-transport layer 112-2, the third hole-transport layer 112-3, and the light-emitting layer 113. Materials for forming each layer are specifically described below.

The hole-injection layer 111 includes an organic acceptor. As the organic acceptor, a compound including an electron-withdrawing group (a halogen group or a cyano group), e.g., 7,7,8,8-tetracyano-2,3,5,6-tetrafluoroquinodimethane (abbreviation: $F_4$-TCNQ), 3,6-difluoro-2,5,7,7,8,8-hexacyano-quinodimethane, chloranil, or 2,3,6,7,10,11-hexacyano-1,4,5,8,9,12-hexaazatriphenylene (abbreviation: HAT-CN), can be used. A compound in which electron-withdrawing groups are bonded to a condensed aromatic ring having a plurality of hetero atoms, like HAT-CN, is preferable as the organic acceptor because it is thermally stable. The organic acceptor can extract an electron from an adjacent hole-transport layer (or hole-transport material) by at least application of an electric field.

The hole-injection layer 111 can improve the hole-injection property, which allows the light-emitting element to be driven at a low voltage. In addition, the organic acceptor is easy to use because it is easily formed by vapor deposition.

The first hole-transport layer 112-1, the second hole-transport layer 112-2, and the third hole-transport layer 112-3 form a hole-transport layer. The first to third hole-transport layers 112-1, 112-2, and 112-3 each include a hole-transport material with a hole-transport property; specifically, they include the first hole-transport material, the second hole-transport material, and the third hole-transport material, respectively. The hole-transport materials preferably have a hole mobility of higher than or equal to $1 \times 10^{-6}$ cm$^2$/Vs. The following relationships are satisfied between these materials: the HOMO level of the second hole-transport material is deeper than the HOMO level of the first hole-transport material, the HOMO level of the host material included in the light-emitting layer 113 is deeper than the HOMO level of the second hole-transport material, the HOMO level of the third hole-transport material is deeper than or equal to the HOMO level of the host material, and the difference between the HOMO level of the second hole-transport material and the HOMO level of the third hole-transport material is less than or equal to 0.3 eV. Note that the difference between the HOMO level of the second hole-transport material and the HOMO level of the third hole-transport material is preferably less than or equal to 0.2 eV.

As the first hole-transport material, a hole-transport material with a relatively shallow HOMO level is preferable. As such an organic compound, a substance which is triarylamine and has a fluorenylamine skeleton is preferable.

As the third hole-transport material, a hole-transport material with a relatively deep HOMO level is preferable. Since an organic compound including amine tends to have a shallow HOMO level, a hole-transport material without amine is preferable. Note that as such a hole-transport material, a hole-transport material having a carbazole skeleton is preferable. An organic compound having a carbazole skeleton and a triphenylene skeleton, an organic compound having a carbazole skeleton and a naphthalene skeleton, and the like can be preferably used.

As the second hole-transport material, a hole-transport material whose HOMO level is between the HOMO levels of the first and third hole-transport materials is preferable. Specifically, a hole-transport material which is triarylamine and has a triphenylamine skeleton is preferable. Note that it is preferable that a phenyl group of the triphenylamine skeleton do not form a fused structure.

The light-emitting layer 113 includes the host material and the light-emitting material. As the light-emitting material, any of fluorescent materials, phosphorescent materials, substances exhibiting thermally activated delayed fluorescence (TADF) may be used. Furthermore, the light-emitting layer 113 may be a single layer or include a plurality of layers containing different light-emitting materials. Note that in one embodiment of the present invention, the light-emitting layer 113 can be preferably used as long as it emits fluorescent, specifically, blue fluorescent.

Examples of a material which can be used as a fluorescent light-emitting substance in the light-emitting layer 113 are described below. Fluorescent substances other than those given below can also be used.

Examples of the fluorescent substance include 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl) ethenyl]-4H-pyran-4-ylidene}propanedinitrile (abbreviation: BisDCJTM). Condensed aromatic diamine compounds typified by pyrenediamine compounds such as 1,6FLPAPrn and 1,6mMemFLPAPrn are particularly preferable because of their high hole-trapping properties, high emission efficiency, and high reliability.

Examples of a material which can be used as a phosphorescent light-emitting substance in the light-emitting layer 113 are as follows.

The examples include organometallic iridium complexes having 4H-triazole skeletons, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), and tris[4-(3-biphenyl)-5-isopropyl-3-phenyl-4H-1,2,4-triazolato]iridium(III) (abbreviation: [Ir(iPrptz-3b)$_3$]); organometallic iridium complexes having 1H-triazole skeletons, such as tris[3-methyl-1-(2-methylphenyl)-5-phenyl-1H-1,2,4-triazolato]iridium(III) (abbreviation: [Ir(Mptzl-mp)$_3$]) and tris(1-methyl-5-phenyl-3-propyl-1H-1,2,4-triazolato)iridium(III) (abbreviation: [Ir(Prptzl-Me)$_3$]); organometallic iridium complexes having imidazole skeletons, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic iridium complexes in which aphenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)). These are compounds emitting blue phosphorescence and have an emission peak at 440 nm to 520 nm.

Other examples include organometallic iridium complexes having pyrimidine skeletons, such as tris(4-methyl-6-phenylpyrimidinato)iridium(III) (abbreviation: [Ir(mppm)$_3$]), tris(4-t-butyl-6-phenylpyrimidinato)iridium (III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), and (acetylacetonato)bis(4,6-diphenylpyrimidinato)iridium(III) (abbreviation: [Ir(dppm)$_2$(acac)]); organometallic iridium complexes having pyrazine skeletons, such as (acetylacetonato)bis(3,5-dimethyl-2-phenylpyrazinato)iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having pyridine skeletons, such as tris(2-phenylpyridinato-N,C$^{2'}$)iridium(III) (abbreviation: [Ir(ppy)$_3$]), bis(2-phenylpyridinato-N,C$^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium (III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); and rare earth metal complexes such as tris(acetylacetonato)(monophenanthroline)terbium(III) (abbreviation: [Tb(acac)$_3$(Phen)]). These are mainly compounds emitting green phosphorescence and have an emission peak at 500 nm to 600 nm. Note that organometallic iridium complexes having pyrimidine skeletons have distinctively high reliability and emission efficiency and thus are especially preferable.

Other examples include organometallic iridium complexes having pyrimidine skeletons, such as (diisobutyrylmethanato)bis[4,6-bis(3-methylphenyl)pyrimidinato] iridium(III) (abbreviation: [Ir(5mdppm)$_2$(dibm)]), bis[4,6-bis(3-methylphenyl)pyrimidinato](dipivaloylmethanato) iridium(III) (abbreviation: [Ir(5mdppm)$_2$(dpm)]), bis[4,6-di (naphthalen-1-yl)pyrimidinato](dipivaloylmethanato) iridium(III) (abbreviation: [Ir(d1npm)$_2$(dpm)]); organometallic iridium complexes having pyrazine skeletons, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), and (acetylacetonato)bis[2,3-bis(4-fluorophenyl)quinoxalinato]iridium(III) (abbreviation: [Ir(Fdpq)$_2$(acac)]); organometallic iridium complexes having pyridine skeletons, such as tris(1-phenylisoquinolinato-N,C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrin platinum (II) (abbreviation: PtOEP); and rare earth metal complexes such as tris(1,3-diphenyl-1,3-propanedionato)(monophenanthroline)europium(III) (abbreviation: [Eu(DBM)$_3$(Phen)]) and tris[1-(2-thenoyl)-3,3,3-trifluoroacetonato](monophenanthroline)europium(III) (abbreviation: [Eu(TTA)$_3$(Phen)]). These are compounds emitting red phosphorescence and have an emission peak at 600 nm to 700 nm. Furthermore, organometallic iridium complexes having pyrazine skeletons can provide red light emission with favorable chromaticity.

As well as the above phosphorescent compounds, known phosphorescent materials may be selected and used.

Examples of the TADF material include a fullerene, a derivative thereof, an acridine derivative such as proflavine, eosin, or the like, and a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF$_2$(OEP)), an etioporphyrin-tin fluoride complex (SnF$_2$(Etio I)), and an octaethylporphyrin-platinum chloride complex (PtCl$_2$(OEP)), which are shown in the following structural formulae.

[Chemical Formulae 1]

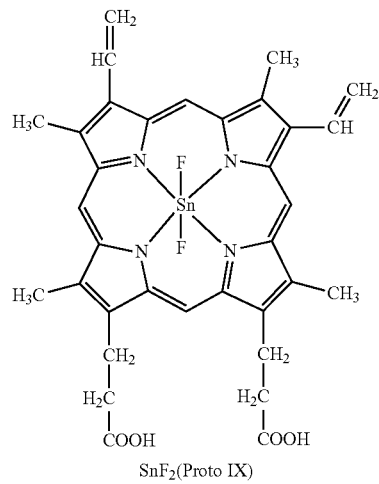

SnF$_2$(Proto IX)

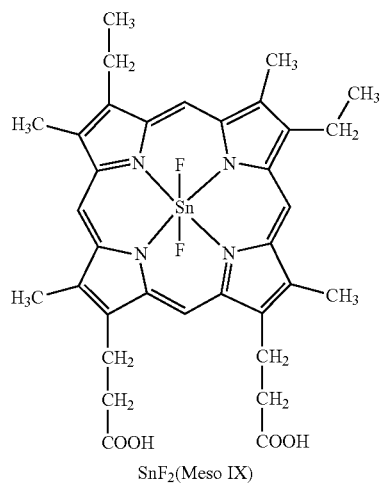

SnF$_2$(Meso IX)

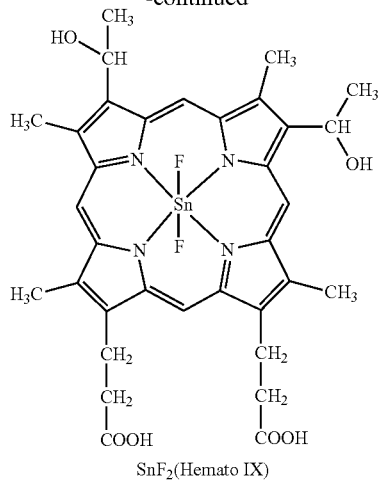

SnF₂(Hemato IX)

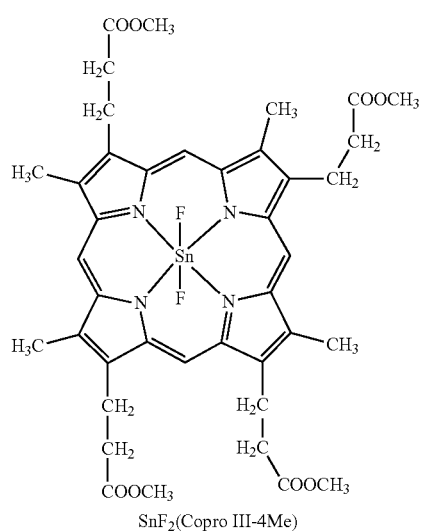

SnF₂(Copro III-4Me)

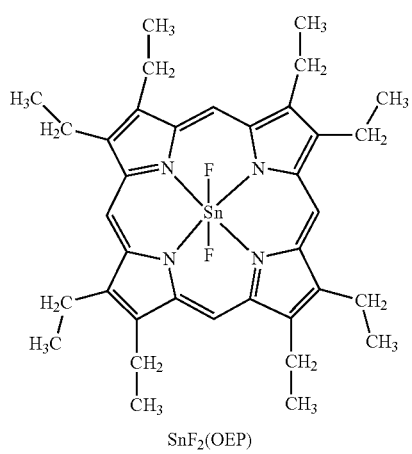

SnF₂(OEP)

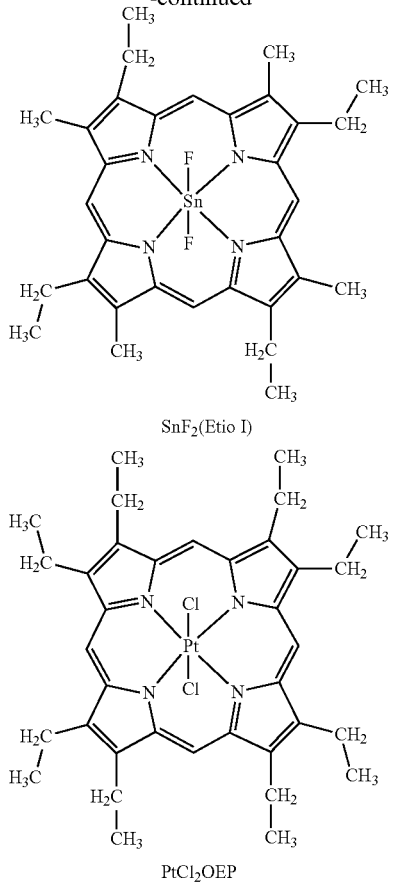

SnF₂(Etio I)

PtCl₂OEP

Alternatively, a heterocyclic compound having both of a π-electron rich heteroaromatic ring and a π-electron deficient heteroaromatic ring, such as 2-(biphenyl-4-yl)-4,6-bis (12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) shown in the following structural formulae, can be used. The heterocyclic compound is preferable because of having the π-electron rich heteroaromatic ring and the π-electron deficient heteroaromatic ring, for which the electron-transport property and the hole-transport property are high. Note that a substance in which the π-electron rich heteroaromatic ring is directly bonded to the π-electron deficient heteroaromatic ring is particularly preferably used because the donor property of the π-electron rich heteroaromatic ring and the acceptor property of the π-electron deficient heteroaromatic ring are both increased, the energy difference between the $S_1$ level and the $T_1$ level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring.
[Chemical Formulae 2]
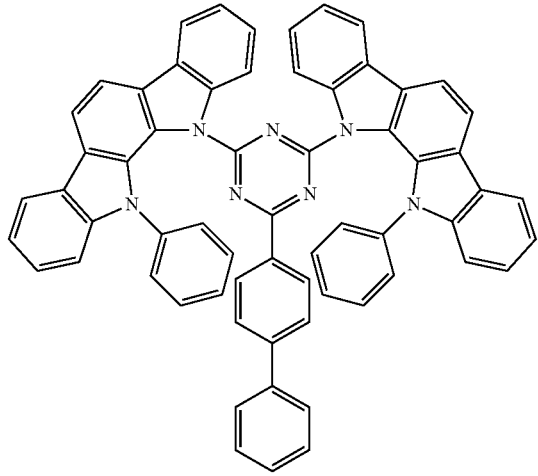
PIC-TRZ
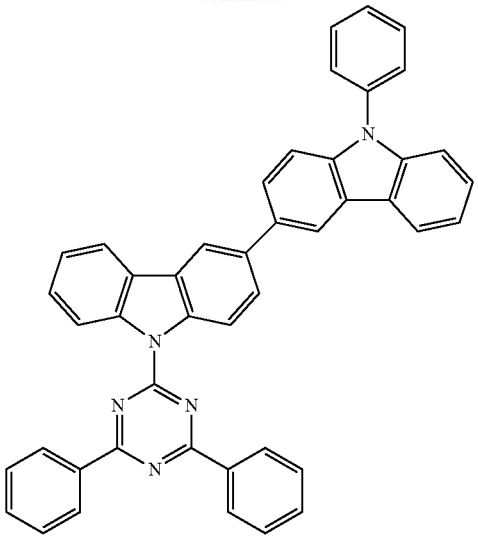
PCCzTzn
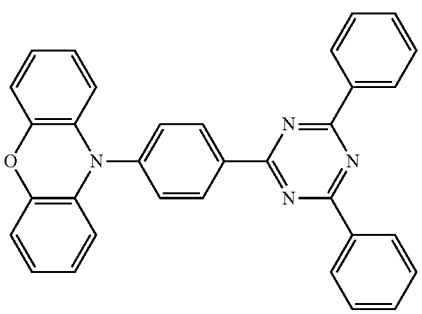
PXZ-TRZ
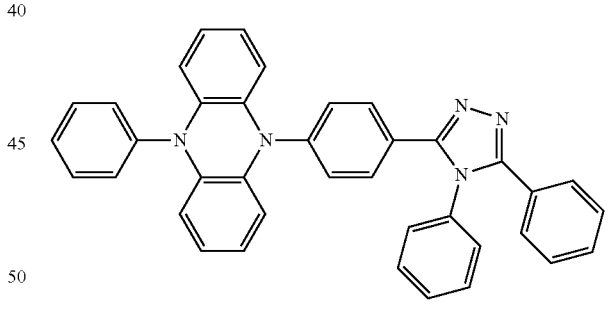
PPZ-3TPT
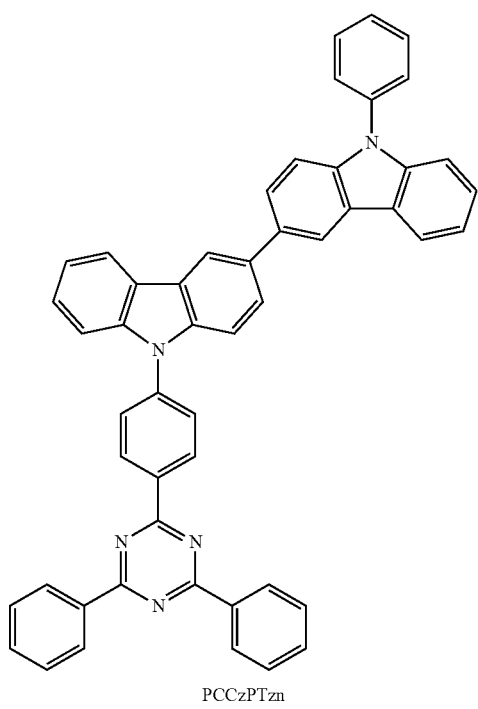
PCCzPTzn
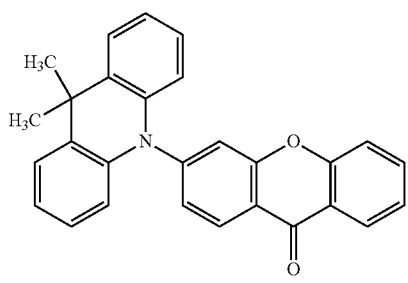
ACRXTN

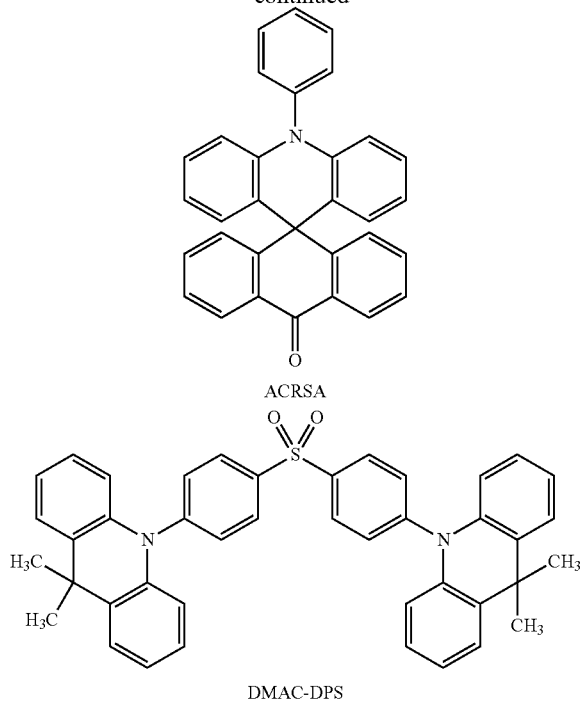

ACRSA

DMAC-DPS

As the host material of the light-emitting layer, various carrier-transport materials such as materials with an electron-transport property and materials with a hole-transport property can be used.

The following are examples of materials having a hole-transport property: compounds having aromatic amine skeletons, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having thiophene skeletons, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compounds having aromatic amine skeletons and the compounds having carbazole skeletons are preferred because these compounds are highly reliable and have a high hole-transport property and contribute to a reduction in drive voltage.

The following are examples of materials having an electron-transport property: metal complexes such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds having pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compounds having diazine skeletons and the heterocyclic compounds having pyridine skeletons are highly reliable and preferred. In particular, the heterocyclic compounds having diazine (pyrimidine or pyrazine) skeletons have a high electron-transport property and contribute to a decrease in drive voltage.

In the case where a fluorescent substance is used as the light-emitting material, a material having an anthracene skeleton is preferable as the host material. The use of a substance having an anthracene skeleton as the host material for the fluorescent substance makes it possible to obtain a light-emitting layer with high emission efficiency and high durability. Most of materials having an anthracene skeleton have a deep HOMO level; therefore, such a material can be preferably used in one embodiment of the present invention. As the substance having an anthracene skeleton used as the host material, a substance with a diphenylanthracene skeleton, in particular, a substance with a 9,10-diphenylanthracene skeleton, is preferable because it is chemically stable. The host material preferably has a carbazole skeleton because the hole-injection and hole-transport properties are increased; further preferably, the host material has a benzocarbazole skeleton in which a benzene ring is further condensed to carbazole because the HOMO level thereof is higher than carbazole by approximately 0.1 eV and thus holes enter the host material easily. In particular, the host material preferably includes a dibenzocarbazole skeleton because the HOMO level thereof is higher than that of carbazole by approximately 0.1 eV so that holes enter the host material easily, the hole-transport property is improved, and the heat resistance is increased. Accordingly, a substance which has both of a 9,10-diphenylanthracene skeleton and a carbazole skeleton (or a benzocarbazole or dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN) 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). In particular, CzPA, cgDBCzPA, 2mBnfPPA, and PCzPA are preferable choices because of their excellent characteristics.

Note that the light-emitting element of one embodiment of the present invention is preferably applied to a light-emitting element that emits blue fluorescence.

Note that the host material may be a mixture of a plurality of kinds of substances, and in the case of using a mixed host material, it is preferable to mix a material having an electron-transport property with a material having a hole-transport property. By mixing the material having an electron-transport property with the material having a hole-transport property, the transport property of the light-emitting layer 113 can be easily adjusted and a recombination region can be easily controlled. The ratio of the content of the material having a hole-transport property to the content of the material having an electron-transport property may be 1:9 to 9:1.

An exciplex may be formed by these mixed materials. It is preferable that the combination of these materials be selected so as to form an exciplex that exhibits light emission whose wavelength overlaps with a wavelength of a lowest-energy-side absorption band of the light-emitting material, in which case energy is transferred smoothly, light emission can be obtained efficiently, and the drive voltage is reduced.

The electron-transport layer 114 is a layer containing a substance with an electron-transport property. As the substance having an electron-transport property, it is possible to use any of the above-listed substances having electron-transport properties that can be used as the host material.

An alkali metal, an alkaline earth metal, or a compound thereof such as lithium fluoride (LiF), cesium fluoride (CsF), or calcium fluoride ($CaF_2$) may be provided as the electron-injection layer 115 between the electron-transport layer 114 and the second electrode 102. For example, an electride or a layer that is formed using a substance having an electron-transport property and that contains an alkali metal, an alkaline earth metal, or a compound thereof can be used. Examples of the electride include a substance in which electrons are added at high concentration to calcium oxide-aluminum oxide.

Instead of the electron-injection layer 115, the charge-generation layer 116 may be provided (FIG. 1B). The charge-generation layer 116 refers to a layer capable of injecting holes into a layer in contact with the cathode side of the charge-generation layer 116 and electrons into a layer in contact with the anode side thereof when a potential is applied. The charge-generation layer 116 includes at least a p-type layer 117. The p-type layer 117 is preferably formed using any of the composite materials given above as examples of materials that can be used for the hole-injection layer 111. The p-type layer 117 may be formed by stacking a film containing the above-described acceptor material as a material included in the composite material and a film containing a hole-transport material. When a potential is applied to the p-type layer 117, electrons are injected into the electron-transport layer 114 and holes are injected into the second electrode 102 serving as a cathode; thus, the light-emitting element operates.

Note that the charge-generation layer 116 preferably includes either an electron-relay layer 118 or an electron-injection buffer layer 119 or both in addition to the p-type layer 117.

The electron-relay layer 118 contains at least the substance having an electron-transport property and has a function of preventing an interaction between the electron-injection buffer layer 119 and the p-type layer 117 and smoothly transferring electrons. The LUMO level of the substance having an electron-transport property contained in the electron-relay layer 118 is preferably between the LUMO level of the substance having an acceptor property in the p-type layer 117 and the LUMO level of a substance contained in a layer of the electron-transport layer 114 in contact with the charge-generation layer 116. As a specific value of the energy level, the LUMO level of the substance having an electron-transport property in the electron-relay layer 118 is preferably higher than or equal to −5.0 eV, more preferably higher than or equal to −5.0 eV and lower than or equal to −3.0 eV. Note that as the substance having an electron-transport property in the electron-relay layer 118, a phthalocyanine-based material or a metal complex having a metal-oxygen bond and an aromatic ligand is preferably used.

A substance having a high electron-injection property can be used for the electron-injection buffer layer 119. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

In the case where the electron-injection buffer layer 119 contains the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having an electron-transport property, a material similar to the above-described material used for the electron-transport layer 114 can be used.

For the second electrode 102, any of metals, alloys, electrically conductive compounds, and mixtures thereof which have a low work function (specifically, a work function of 3.8 eV or less) or the like can be used. Specific examples of such a cathode material are elements belonging to Groups 1 and 2 of the periodic table, such as alkali metals (e.g., lithium (Li) and cesium (Cs)), magnesium (Mg), calcium (Ca), and strontium (Sr), alloys thereof (e.g., MgAg and AlLi), rare earth metals such as europium (Eu) and ytterbium (Yb), alloys thereof, and the like. However, when the electron-injection layer is provided between the second electrode 102 and the electron-transport layer, for the second electrode 102, any of a variety of conductive materials such as Al, Ag, ITO, or indium oxide-tin oxide containing silicon or silicon oxide can be used regardless of the work function. Films of these conductive materials can be formed by a dry method such as a vacuum evaporation method or a sputtering method, an inkjet method, a spin coating method, or the like. In addition, the electrode may be formed by a wet method using a sol-gel method, or by a wet method using paste of a metal material.

Any of a variety of methods can be used to form the EL layer 103 regardless of whether it is a dry process or a wet process. For example, a vacuum evaporation method, a gravure printing method, an offset printing method, a screen printing method, an inkjet method, a spin coating method, or the like may be used.

Different methods may be used to form the electrodes or the layers described above.

The structure of the layers provided between the first electrode 101 and the second electrode 102 is not limited to the above-described structure. Preferably, a light-emitting region where holes and electrons recombine is positioned away from the first electrode 101 and the second electrode 102 so that quenching due to the proximity of the light-emitting region and a metal used for electrodes and carrier-injection layers can be prevented.

Furthermore, in order that transfer of energy from an exciton generated in the light-emitting layer can be suppressed, preferably, the hole-transport layer and the electron-transport layer which are in contact with the light-emitting layer 113, particularly a carrier-transport layer closer to the recombination region in the light-emitting layer 113, are formed using a material having a wider band gap than the light-emitting material of the light-emitting layer or the light-emitting material included in the light-emitting layer.

Next, an embodiment of a light-emitting element with a structure in which a plurality of light-emitting units are stacked (this type of light-emitting element is also referred to as a stacked element or a tandem element) is described with reference to FIG. 1C. In this light-emitting element, a plurality of light-emitting units are provided between an anode and a cathode. One light-emitting unit has a structure similar to that of the EL layer 103, which is illustrated in FIG. 1A. In other words, the light-emitting element illustrated in FIG. 1C is a light-emitting element including a plurality of light-emitting units; each of the light-emitting elements illustrated in FIGS. 1A and 1B is a light-emitting element including a single light-emitting unit.

Figure 1C:
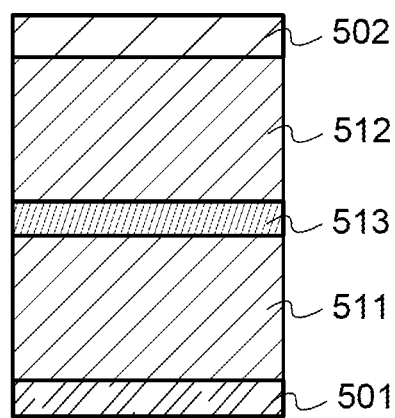

In FIG. 1C, a first light-emitting unit 511 and a second light-emitting unit 512 are stacked between a first electrode 501 and a second electrode 502, and a charge-generation layer 513 is provided between the first light-emitting unit 511 and the second light-emitting unit 512. The first electrode 501 and the second electrode 502 correspond, respectively, to the first electrode 101 and the second electrode 102 illustrated in FIG. 1A, and the materials given in the description for FIG. 1A can be used. Furthermore, the first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied between the first electrode 501 and the second electrode 502. That is, in FIG. 1C, the charge-generation layer 513 injects electrons into the first light-emitting unit 511 and holes into the second light-emitting unit 512 when a voltage is applied so that the potential of the first electrode becomes higher than the potential of the second electrode.

The charge-generation layer 513 preferably has a structure similar to the charge-generation layer 116 described with reference to FIG. 1B. Since the composite material of an organic compound and a metal oxide is superior in carrier-injection property and carrier-transport property, low-voltage driving or low-current driving can be achieved. Note that when a surface of a light-emitting unit on the anode side is in contact with the charge-generation layer 513, the charge-generation layer 513 can also serve as a hole-injection layer in the light-emitting unit and a hole-injection layer is not necessarily formed in the light-emitting unit.

In the case where the electron-injection buffer layer 119 is provided, the electron-injection buffer layer 119 serves as the electron-injection layer in the light-emitting unit on the anode side which is in contact with the electron-injection buffer layer 119 and the light-emitting unit on the anode side does not necessarily further need an electron-injection layer.

The light-emitting element having two light-emitting units is described with reference to FIG. 1C; however, the present invention can be similarly applied to a light-emitting element in which three or more light-emitting units are stacked. With a plurality of light-emitting units partitioned by the charge-generation layer 513 between a pair of electrodes as in the light-emitting element according to this embodiment, it is possible to provide a light-emitting element which can emit light with high luminance with the current density kept low and has a long lifetime. Moreover, a light-emitting device having low power consumption, which can be driven at low voltage, can be manufactured.

Furthermore, when emission colors of light-emitting units are made different, light emission of a desired color can be provided from the light-emitting element as a whole. For example, in a light-emitting element having two light-emitting units, the emission colors of the first light-emitting unit may be red and green and the emission color of the second light-emitting unit may be blue, so that the light-emitting element can emit white light as the whole element.

The above-described structure can be combined with any of the structures in this embodiment and the other embodiments.

Embodiment 2

In this embodiment, a light-emitting device including the light-emitting element described in Embodiment 1 is described.

Figure 2A:
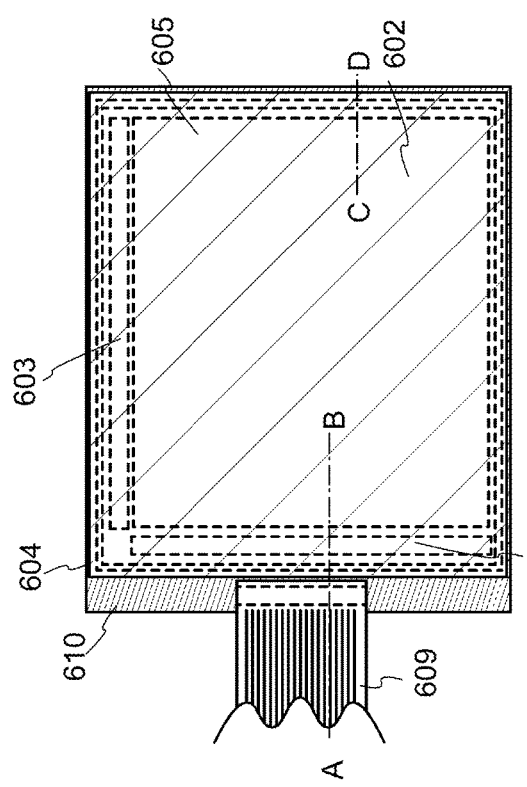
FIGS. 2A and 2B are conceptual diagrams of an active matrix light-emitting device.
Figure 2B:
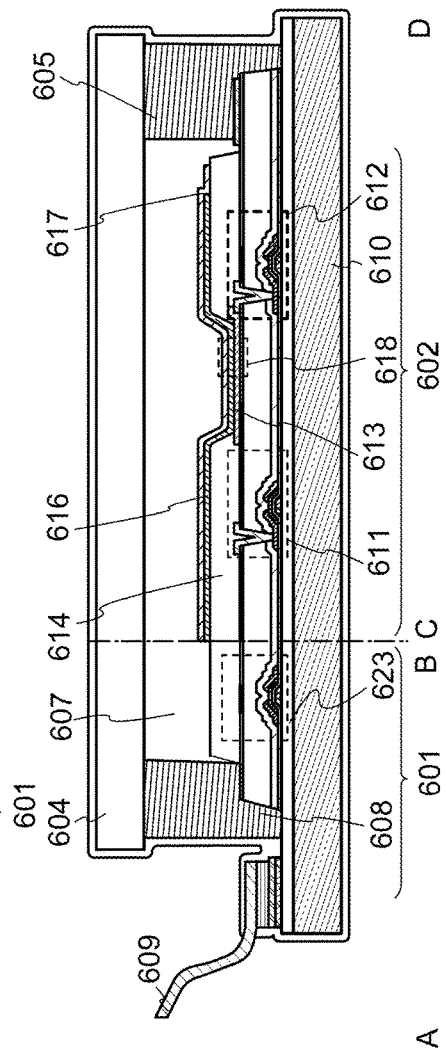

In this embodiment, the light-emitting device manufactured using the light-emitting element described in Embodiment 1 is described with reference to FIGS. 2A and 2B. Note that FIG. 2A is a top view of the light-emitting device and FIG. 2B is a cross-sectional view taken along the lines A-B and C-D in FIG. 2A. This light-emitting device includes a driver circuit portion (source line driver circuit) 601, a pixel portion 602, and a driver circuit portion (gate line driver circuit) 603, which are to control light emission of a light-emitting element and illustrated with dotted lines. Reference numeral 604 denotes a sealing substrate; 605, a sealing material; and 607, a space surrounded by the sealing material 605.

Reference numeral 608 denotes a lead wiring for transmitting signals to be input to the source line driver circuit 601 and the gate line driver circuit 603 and receiving signals such as a video signal, a clock signal, a start signal, and a reset signal from a flexible printed circuit (FPC) 609 serving as an external input terminal. Although only the FPC is illustrated here, a printed wiring board (PWB) may be attached to the FPC. The light-emitting device in the present specification includes, in its category, not only the light-emitting device itself but also the light-emitting device provided with the FPC or the PWB.

Next, a cross-sectional structure is described with reference to FIG. 2B. The driver circuit portions and the pixel portion are formed over an element substrate 610; FIG. 2B shows the source line driver circuit 601, which is a driver circuit portion, and one pixel in the pixel portion 602.

The element substrate 610 may be a substrate containing glass, quartz, an organic resin, a metal, an alloy, or a semiconductor or a plastic substrate formed of fiber reinforced plastic (FRP), poly(vinyl fluoride) (PVF), polyester, or acrylic.

The structure of transistors used in pixels and driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the driver circuit portion 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that to cover an end portion of the first electrode 613, an insulator 614 is formed, for which a positive photosensitive acrylic resin film is used here.

In order to improve coverage with an EL layer or the like which is formed later, the insulator 614 is formed to have a curved surface with curvature at its upper or lower end portion. For example, in the case where positive photosensitive acrylic is used as a material of the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in Embodiment 1. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 is transmitted through the second electrode 617, a stack of a thin metal film and a transparent conductive film (e.g., ITO, indium oxide containing zinc oxide at 2 wt % to 20 wt %, indium tin oxide containing silicon, or zinc oxide (ZnO)) is preferably used for the second electrode 617.

Note that the light-emitting element is formed with the first electrode 613, the EL layer 616, and the second electrode 617. The light-emitting element is the light-emitting element described in Embodiment 1. In the light-emitting device of this embodiment, the pixel portion, which includes a plurality of light-emitting elements, may include both the light-emitting element described in Embodiment 1 and a light-emitting element having a different structure.

The sealing substrate 604 is attached to the element substrate 610 with the sealing material 605, so that a light-emitting element 618 is provided in the space 607 surrounded by the element substrate 610, the sealing substrate 604, and the sealing material 605. The space 607 may be filled with a filler, or may be filled with an inert gas (such as nitrogen or argon), or the sealing material. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material not be permeable to moisture or oxygen as much as possible. As the sealing substrate 604, a glass substrate, a quartz substrate, or a plastic substrate formed of fiber reinforced plastic (FRP), poly(vinyl fluoride) (PVF), polyester, and acrylic can be used.

Although not illustrated in FIGS. 2A and 2B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, the material may contain aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, aluminum nitride, hafnium nitride, silicon nitride, tantalum nitride, titanium nitride, niobium nitride, molybdenum nitride, zirconium nitride, gallium nitride, a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting device manufactured using the light-emitting element described in Embodiment 1 can be obtained.

The light-emitting device in this embodiment is manufactured using the light-emitting element described in Embodiment 1 and thus can have favorable characteristics. Specifically, since the light-emitting element described in Embodiment 1 has a long lifetime, the light-emitting device can have high reliability. Since the light-emitting device using the light-emitting element described in Embodiment 1 has high emission efficiency, the light-emitting device can achieve low power consumption.

FIGS. 3A and 3B each illustrate an example of a light-emitting device in which full color display is achieved by formation of a light-emitting element exhibiting white light emission and with the use of coloring layers (color filters) and the like. In FIG. 3A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting elements, a partition 1025, an EL layer 1028, a second electrode 1029 of the light-emitting elements, a sealing substrate 1031, a sealing material 1032, and the like are illustrated.

In FIG. 3A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 3A, light emitted from part of the light-emitting layer does not pass through the coloring layers, while light emitted from the other part of the light-emitting layer passes through the coloring layers. Since light which does not pass through the coloring layers is white and light which passes through any one of the coloring layers is red, green, or blue, an image can be displayed using pixels of the four colors.

FIG. 3B illustrates an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 4:
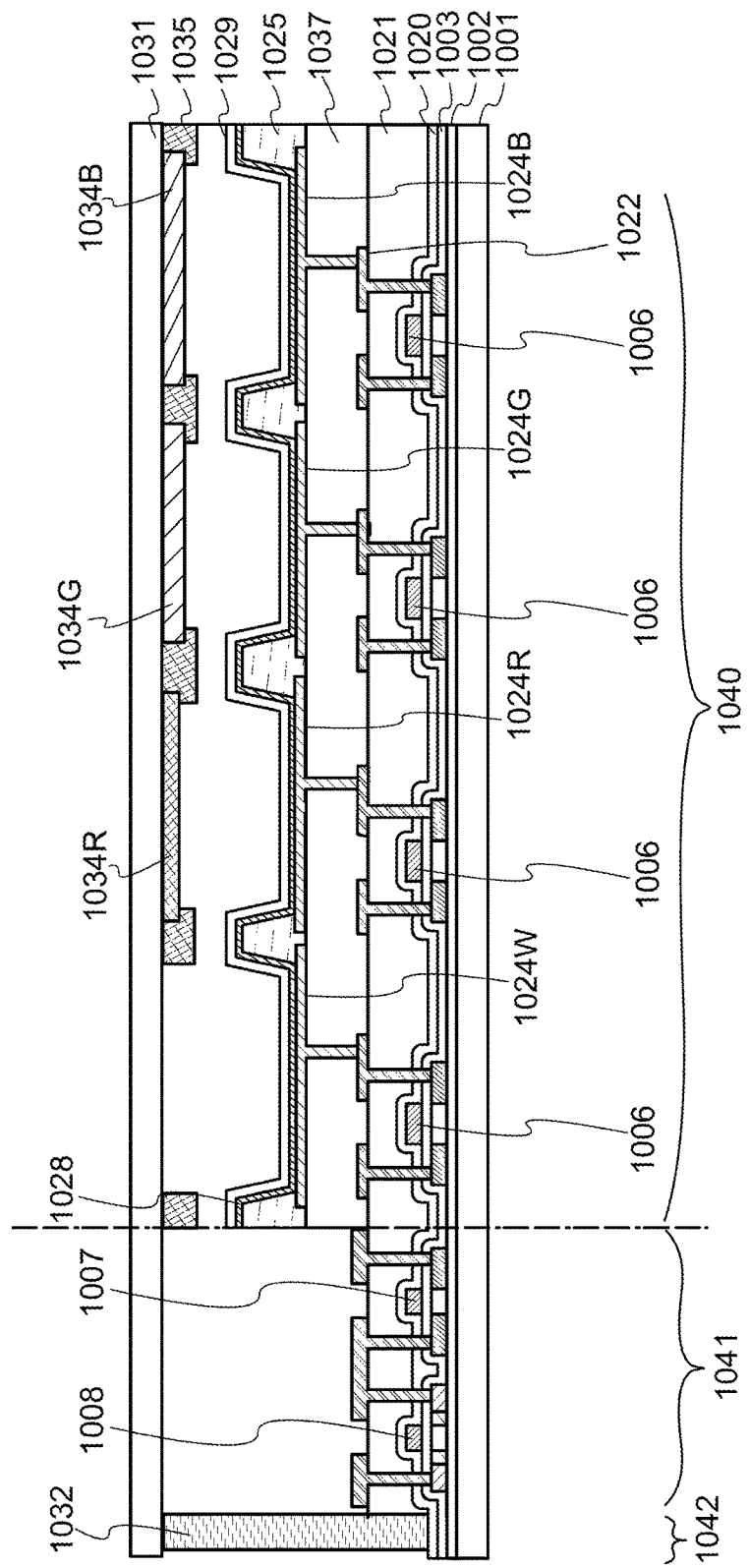
FIG. 4 is a conceptual diagram of an active matrix light-emitting device.

The above-described light-emitting device is a light-emitting device having a structure in which light is extracted from the substrate 1001 side where FETs are formed (a bottom emission structure), but may be a light-emitting device having a structure in which light is extracted from the sealing substrate 1031 side (a top emission structure). FIG. 4 is a cross-sectional view of a light-emitting device having a top emission structure. In this case, a substrate which does not transmit light can be used as the substrate 1001. The process up to the step of forming a connection electrode which connects the FET and the anode of the light-emitting element is performed in a manner similar to that of the light-emitting device having a bottom emission structure. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The first electrodes 1024W, 1024R, 1024G, and 1024B of the light-emitting elements each serve as an anode here, but may serve as a cathode. Furthermore, in the case of a light-emitting device having a top emission structure as illustrated in FIG. 4, the first electrodes are preferably reflective electrodes. The EL layer 1028 is formed to have a structure similar to the structure of the EL layer 103, which is described in Embodiment 1, with which white light emission can be obtained.

In the case of a top emission structure as illustrated in FIG. 4, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 which is positioned between pixels. The coloring layers (the red coloring layer 1034R, the green coloring layer 1034G, and the blue coloring layer 1034B) and the black matrix may be covered with the overcoat layer 1036. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting device having a top emission structure, a microcavity structure can be favorably employed. A light-emitting element with a microcavity structure is formed with the use of a reflective electrode as the first electrode and a semi-transmissive and semi-reflective electrode as the second electrode. The light-emitting element with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity of 40% to 100%, preferably 70% to 100%, and a resistivity of $1 \times 10^{-2}$ Ωcm or lower. In addition, the semi-transmissive and semi-reflective electrode has a visible light reflectivity of 20% to 80%, preferably 40% to 70%, and a resistivity of $1 \times 10^{-2}$ Ωcm or lower.

Light emitted from the light-emitting layer included in the EL layer is reflected and resonated by the reflective electrode and the semi-transmissive and semi-reflective electrode.

In the light-emitting element, by changing thicknesses of the transparent conductive film, the composite material, the carrier-transport material, and the like, the optical path length between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated.

Note that light that is reflected back by the reflective electrode (first reflected light) considerably interferes with light that directly enters the semi-transmissive and semi-reflective electrode from the light-emitting layer (first incident light). For this reason, the optical path length between the reflective electrode and the light-emitting layer is preferably adjusted to $(2n-1)\lambda/4$ (n is a natural number of 1 or larger and $\lambda$ is a wavelength of color to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting element described above may be combined with a plurality of EL layers; for example, a light-emitting element may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting device which displays images with subpixels of four colors, red, yellow, green, and blue, the light-emitting device can have favorable characteristics because the luminance can be increased owing to yellow light emission and each subpixel can employ a microcavity structure suitable for wavelengths of the corresponding color.

The light-emitting device in this embodiment is manufactured using the light-emitting element described in Embodiment 1 and thus can have favorable characteristics. Specifically, since the light-emitting element described in Embodiment 1 has a long lifetime, the light-emitting device can have high reliability. Since the light-emitting device using the light-emitting element described in Embodiment 1 has high emission efficiency, the light-emitting device can achieve low power consumption.

Figure 5A:
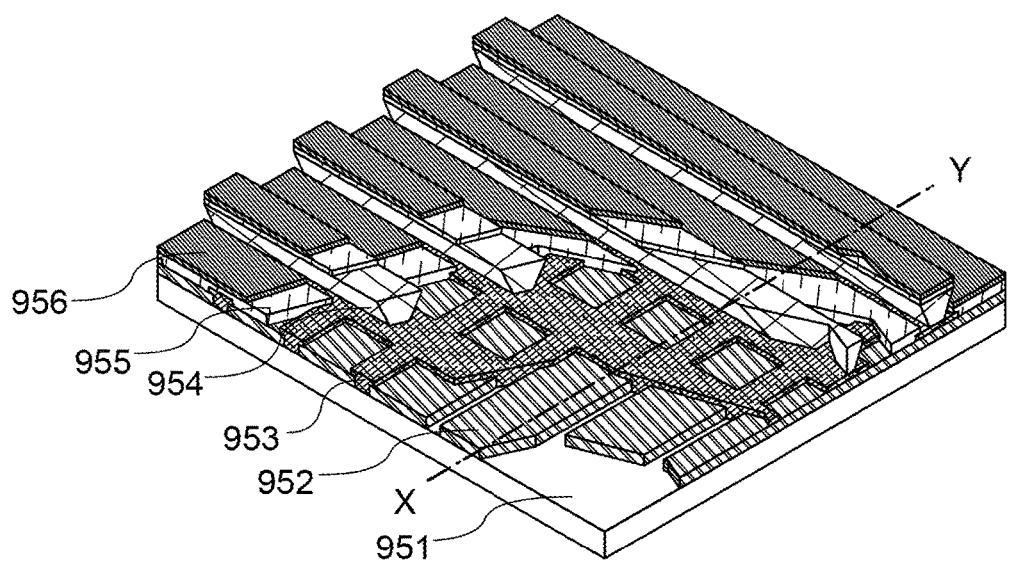
FIGS. 5A and 5B are conceptual diagrams of a passive matrix light-emitting device.
Figure 5B:
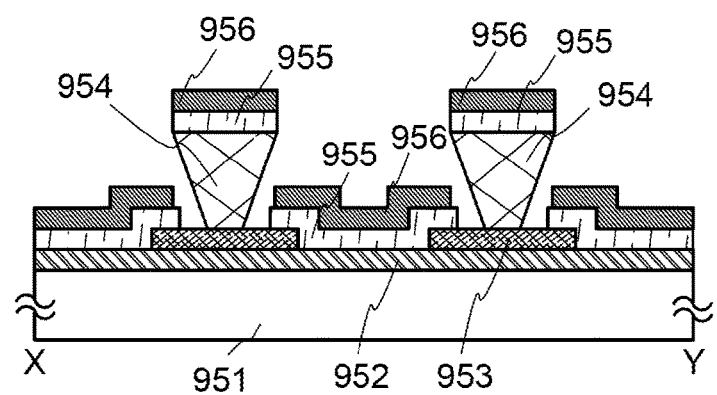

An active matrix light-emitting device is described above, whereas a passive matrix light-emitting device is described below. FIGS. 5A and 5B illustrate a passive matrix light-emitting device manufactured using the present invention. Note that FIG. 5A is a perspective view of the light-emitting device, and FIG. 5B is a cross-sectional view taken along the line X-Y in FIG. 5A. In FIGS. 5A and 5B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 thus provided can prevent defects in the light-emitting element due to static electricity or others. The passive-matrix light-emitting device also includes the light-emitting element described in Embodiment 1; thus, the light-emitting device can have high reliability or low power consumption.

Since many minute light-emitting elements arranged in a matrix in the light-emitting device described above can each be controlled, the light-emitting device can be suitably used as a display device for displaying images.

This embodiment can be freely combined with any of the other embodiments.

Embodiment 3

Figure 6A:
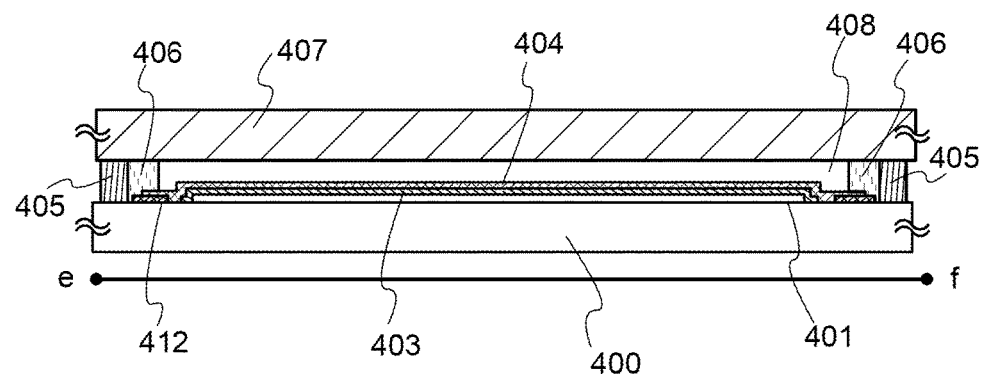
FIGS. 6A and 6B illustrate a lighting device.
Figure 6B:
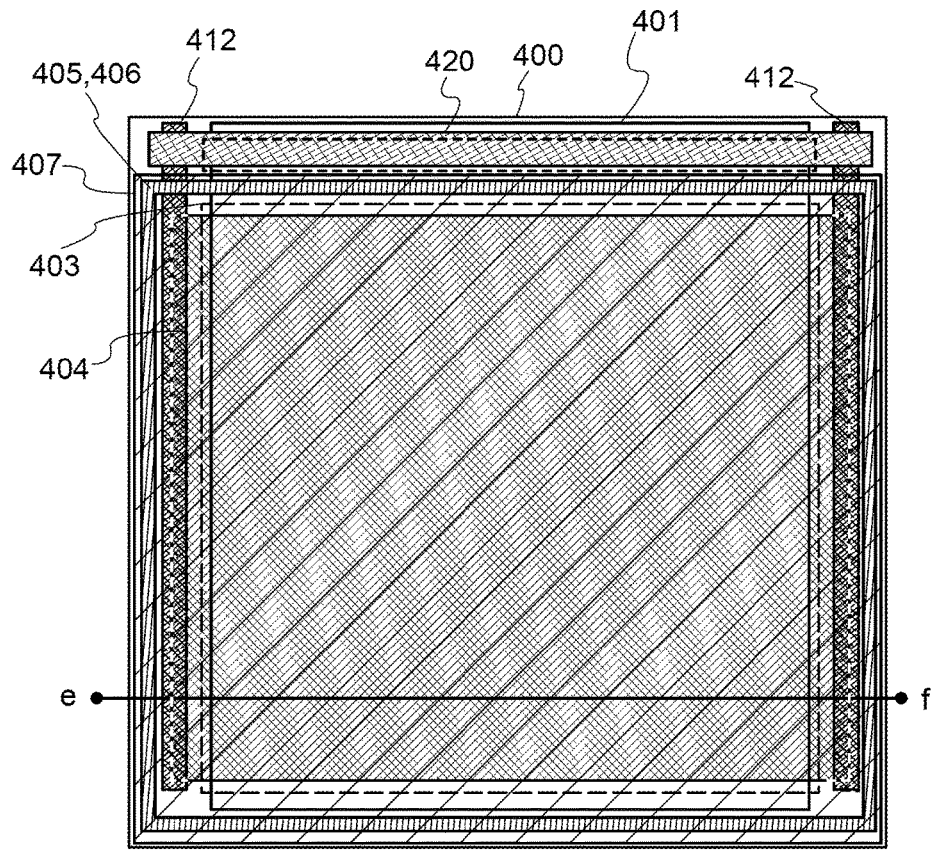

In this embodiment, an example in which the light-emitting element described in Embodiment 1 is used for a lighting device will be described with reference to FIGS. 6A and 6B. FIG. 6B is a top view of the lighting device, and FIG. 6A is a cross-sectional view taken along the line e-f in FIG. 6B.

In the lighting device in this embodiment, a first electrode 401 is formed over a substrate 400 which is a support and has a light-transmitting property. The first electrode 401 corresponds to the first electrode 101 in Embodiment 1. When light is extracted through the first electrode 401 side, the first electrode 401 is formed using a material having a light-transmitting property.

A pad 412 for applying voltage to a second electrode 404 is provided over the substrate 400.

An EL layer 403 is formed over the first electrode 401. The structure of the EL layer 403 corresponds to, for example, the structure of the EL layer 103 in Embodiment 1, or the structure in which the light-emitting units 511 and 512 and the charge-generation layer 513 are combined. Refer to the descriptions for the structure.

The second electrode 404 is formed to cover the EL layer 403. The second electrode 404 corresponds to the second electrode 102 in Embodiment 1. The second electrode 404 is formed using a material having high reflectance when light is extracted through the first electrode 401 side. The second electrode 404 is connected to the pad 412, whereby voltage is applied.

As described above, the lighting device described in this embodiment includes a light-emitting element including the first electrode 401, the EL layer 403, and the second electrode 404. Since the light-emitting element is a light-emitting element with high emission efficiency, the lighting device in this embodiment can be a lighting device having low power consumption.

The substrate 400 provided with the light-emitting element having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not shown in FIG. 6B) can be mixed with a desiccant which enables moisture to be adsorbed, increasing reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes as an EL element the light-emitting element described in Embodiment 1; thus, the light-emitting device can have high reliability. In addition, the light-emitting device can consume less power.

Embodiment 4

In this embodiment, examples of electronic devices each including the light-emitting element described in Embodiment 1 are described. The light-emitting element described in Embodiment 1 has a long lifetime and high reliability. As a result, the electronic devices described in this embodiment can each include a light-emitting portion having high reliability.

Examples of the electronic devices to which the above light-emitting element is applied include television devices (also referred to as TV or television receivers), monitors for computers and the like, cameras such as digital cameras and digital video cameras, digital photo frames, mobile phones (also referred to as cell phones or mobile phone devices), portable game machines, portable information terminals, audio playback devices, large game machines such as pachinko machines, and the like. Specific examples of these electronic devices are given below.

FIG. 7A illustrates an example of a television device. In the television device, a display portion 7103 is incorporated in a housing 7101. Here, the housing 7101 is supported by a stand 7105. Images can be displayed on the display portion 7103, and in the display portion 7103, the light-emitting elements described in Embodiment 1 are arranged in a matrix.

Operation of the television device can be performed with an operation switch of the housing 7101 or a separate remote controller 7110. With operation keys 7109 of the remote controller 7110, channels and volume can be controlled and images displayed on the display portion 7103 can be controlled. The remote controller 7110 may be provided with a display portion 7107 for displaying data output from the remote controller 7110.

Note that the television device is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 7B1 illustrates a computer, which includes a main body 7201, a housing 7202, a display portion 7203, a keyboard 7204, an external connection port 7205, a pointing device 7206, and the like. Note that this computer is manufactured by arranging light-emitting elements described in Embodiment 1 in a matrix in the display portion 7203. The computer illustrated in FIG. 7B1 may have a structure illustrated in FIG. 7B2. The computer illustrated in FIG. 7B2 is provided with a second display portion 7210 instead of the keyboard 7204 and the pointing device 7206. The second display portion 7210 has a touch screen, and input can be performed by operation of images, which are displayed on the second display portion 7210, with a finger or a dedicated pen. The second display portion 7210 can also display images other than the display for input. The display portion 7203 may also have a touch screen. Connecting the two screens with a hinge can prevent troubles; for example, the screens can be prevented from being cracked or broken while the computer is being stored or carried.

FIG. 7C illustrates a portable game machine having two housings, a housing 7301 and a housing 7302, which are connected with a joint portion 7303 so that the portable game machine can be folded. The housing 7301 incorporates a display portion 7304 in which the light-emitting elements described in Embodiment 1 are arranged in a matrix, and the housing 7302 incorporates a display portion 7305. In addition, the portable game machine illustrated in FIG. 7C includes a speaker portion 7306, a recording medium insertion portion 7307, an LED lamp 7308, input means (an operation key 7309, a connection terminal 7310, a sensor 7311 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the display portion in which the light-emitting elements described in Embodiment 1 are arranged in a matrix is used as either the display portion 7304 or the display portion 7305, or both, and the structure can include other accessories as appropriate. The portable game machine illustrated in FIG. 7C has a function of reading out a program or data stored in a recoding medium to display it on the display portion, and a function of sharing information with another portable game machine by wireless communication. Note that functions of the portable game machine illustrated in FIG. 7C are not limited to them, and the portable game machine can have various functions.

FIG. 7D illustrates an example of a portable terminal. The mobile phone is provided with a display portion 7402 incorporated in a housing 7401, operation buttons 7403, an external connection port 7404, a speaker 7405, a microphone 7406, and the like. Note that the mobile phone 7400 has the display portion 7402 in which the light-emitting elements described in Embodiment 1 are arranged in a matrix.

When the display portion 7402 of the portable terminal illustrated in FIG. 7D is touched with a finger or the like, data can be input into the portable terminal. In this case, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting information such as characters. The third mode is a display-and-input mode in which two modes of the display mode and the input mode are combined.

For example, in the case of making a call or creating an e-mail, a character input mode is selected for the display portion 7402 so that characters displayed on a screen can be input. In this case, it is preferable to display a keyboard or number buttons on almost the entire screen of the display portion 7402.

When a sensing device including a sensor such as a gyroscope or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touch on the display portion 7402 or operation with the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by the display portion 7402 while in touch with the palm or the finger, whereby personal authentication can be performed. Furthermore, by providing a backlight or a sensing light source which emits near-infrared light in the display portion, an image of a finger vein, or a palm vein can be taken.

Note that the structure described in this embodiment can be combined with any of the structures described in Embodiments 1 to 4 as appropriate.

As described above, the application range of the light-emitting device including the light-emitting element described in Embodiment 1 is wide so that this light-emitting device can be applied to electronic devices in a variety of fields. By using the light-emitting element described in Embodiment 1, an electronic device having high reliability can be obtained.

Figure 8:
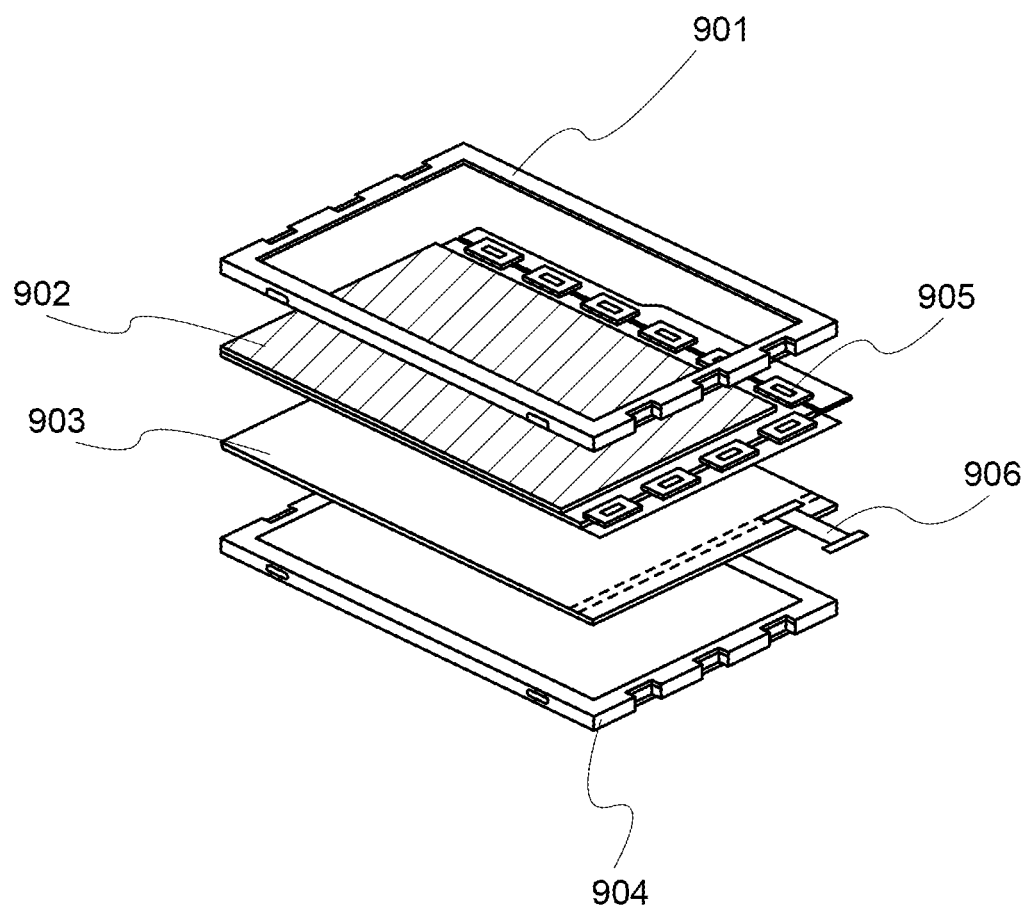
FIG. 8 illustrates a light source device.

FIG. 8 illustrates an example of a liquid crystal display device using the light-emitting element described in Embodiment 1 for a backlight. The liquid crystal display device illustrated in FIG. 8 includes a housing 901, a liquid crystal layer 902, a backlight unit 903, and a housing 904. The liquid crystal layer 902 is connected to a driver IC 905. The light-emitting element described in Embodiment 1 is used for the backlight unit 903, to which current is supplied through a terminal 906.

The light-emitting element described in Embodiment 1 is used for the backlight of the liquid crystal display device; thus, the backlight can have reduced power consumption. In addition, the use of the light-emitting element described in Embodiment 1 enables manufacture of a planar-emission lighting device and further a larger-area planar-emission lighting device; therefore, the backlight can be a larger-area backlight, and the liquid crystal display device can also be a larger-area device. Furthermore, the light-emitting device including the light-emitting element described in Embodiment 1 can be thinner than a conventional one; accordingly, the display device can also be thinner.

Figure 9:
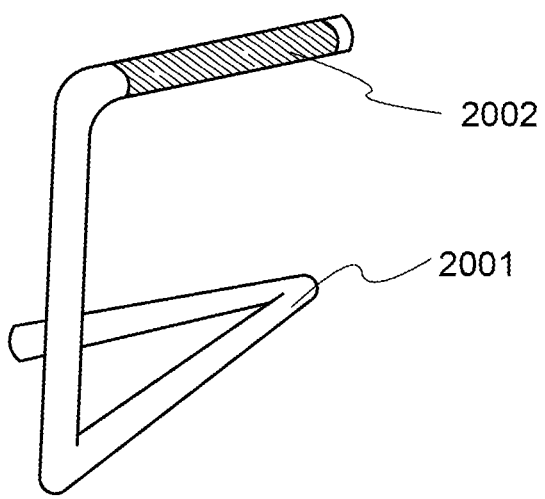
FIG. 9 illustrates a lighting device.

FIG. 9 illustrates an example in which the light-emitting element described in Embodiment 1 is used for a table lamp which is a lighting device. The table lamp illustrated in FIG. 9 includes a housing 2001 and a light source 2002, and the lighting device described in Embodiment 3 may be used for the light source 2002.

Figure 10:
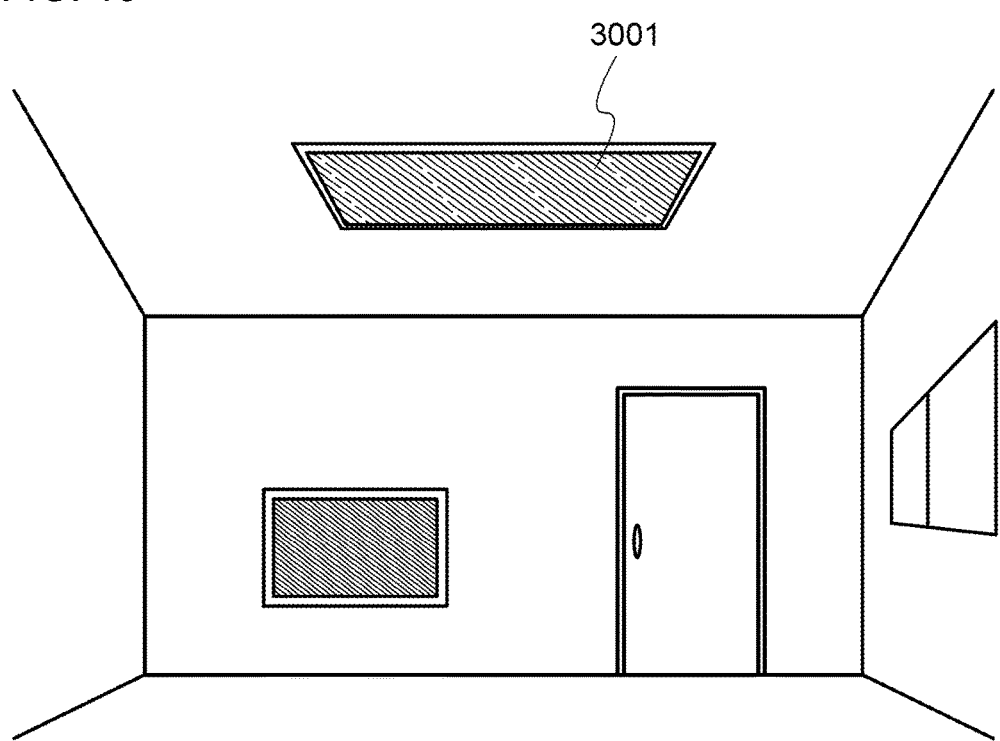
FIG. 10 illustrates a lighting device.

FIG. 10 illustrates an example in which the light-emitting element described in Embodiment 1 is used for an indoor lighting device 3001. Since the light-emitting element described in Embodiment 1 has high reliability, the lighting device can have high reliability. Furthermore, since the light-emitting element described in Embodiment 1 can have a large area, the light-emitting element can be used for a large-area lighting device. Furthermore, since the light-emitting element described in Embodiment 1 is thin, the light-emitting element can be used for a lighting device having a reduced thickness.

Figure 11:
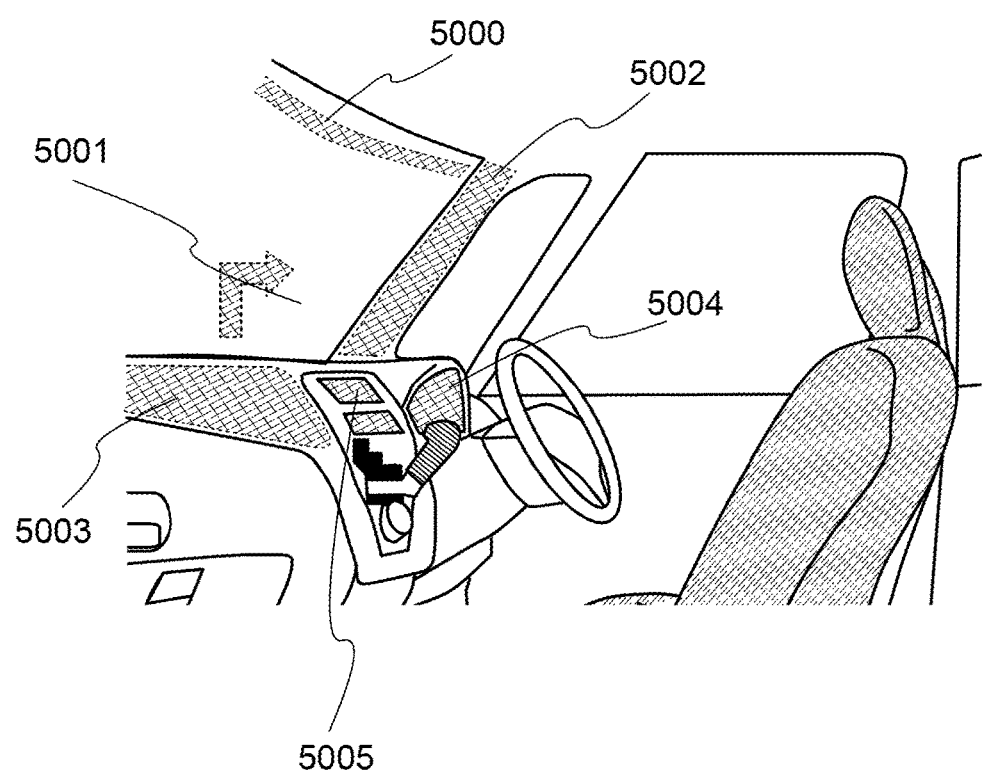
FIG. 11 illustrates in-vehicle display devices and lighting devices.

The light-emitting element described in Embodiment 1 can also be used for an automobile windshield or an automobile dashboard. FIG. 11 illustrates one mode in which the light-emitting element described in Embodiment 1 is used for an automobile windshield and an automobile dashboard. Display regions 5000 to 5005 each include the light-emitting element described in Embodiment 1.

The display region 5000 and the display region 5001 are display devices provided in the automobile windshield in which the light-emitting elements described in Embodiment 1 are incorporated. The light-emitting elements described in Embodiment 1 can be formed into what is called a see-through display device, through which the opposite side can be seen, by including a first electrode and a second electrode formed of electrodes having a light-transmitting property. Such see-through display devices can be provided even in the automobile windshield, without hindering the vision. Note that in the case where a driving transistor or the like is provided, a transistor having a light-transmitting property, such as an organic transistor using an organic semiconductor material or a transistor using an oxide semiconductor, is preferably used.

The display region 5002 is a display device provided in a pillar portion in which the light-emitting elements described in Embodiment 1 are incorporated. The display region 5002 can compensate for the view hindered by the pillar portion by showing an image taken by an imaging unit provided in the car body. Similarly, the display region 5003 provided in the dashboard can compensate for the view hindered by the car body by showing an image taken by an imaging unit provided in the outside of the car body, which leads to elimination of blind areas and enhancement of safety. Showing an image so as to compensate for the area which a driver cannot see makes it possible for the driver to confirm safety easily and comfortably.

The display region 5004 and the display region 5005 can provide a variety of kinds of information such as navigation data, a speedmeter, a tachometer, a mileage, a fuel level, a gearshift state, and air-condition setting. The content or layout of the display can be freely changed by a user as appropriate. Note that such information can also be shown by the display regions 5000 to 5003. The display regions 5000 to 5005 can also be used as lighting devices.

Figure 12A:
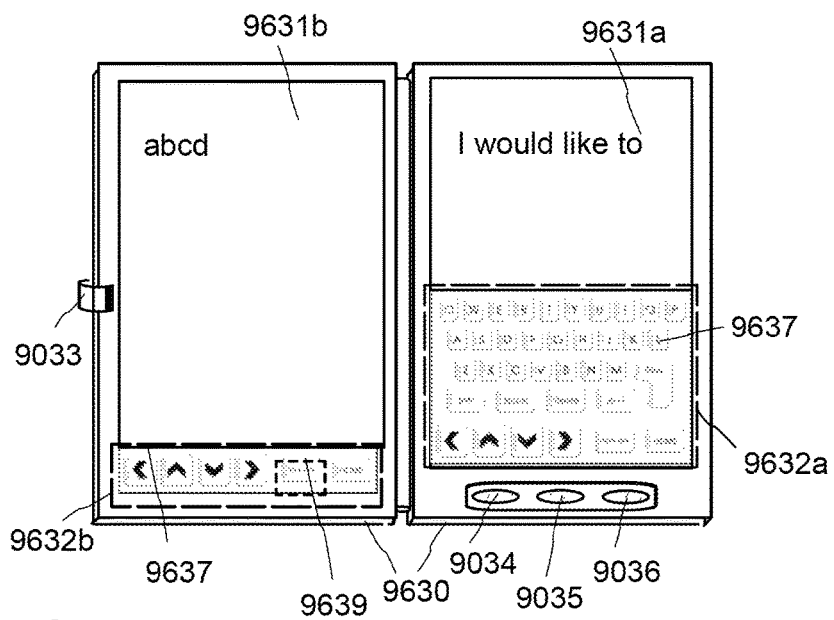
FIGS. 12A to 12C illustrate an electronic device.
Figure 12B:
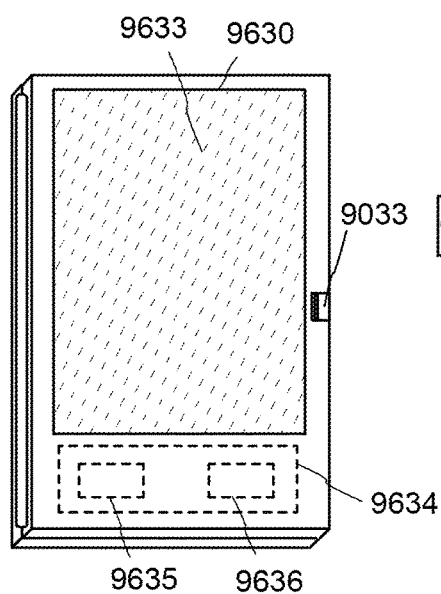

FIGS. 12A and 12B illustrate an example of a foldable tablet terminal. FIG. 12A illustrates the tablet terminal which is unfolded. The tablet terminal includes a housing 9630, a display portion 9631a, a display portion 9631b, a display mode switch 9034, a power switch 9035, a power-saving mode switch 9036, a clasp 9033, and an operation switch 9038. Note that in the tablet terminal, one or both of the display portion 9631a and the display portion 9631b is/are formed using a light-emitting device which includes the light-emitting element described in Embodiment 1.

Part of the display portion 9631a can be a touchscreen region 9632a and data can be input when a displayed operation key 9637 is touched. Although half of the display portion 9631a has only a display function and the other half has a touchscreen function, one embodiment of the present invention is not limited to the structure. The whole display portion 9631a may have a touchscreen function. For example, a keyboard can be displayed on the entire region of the display portion 9631a so that the display portion 9631a is used as a touchscreen, and the display portion 9631b can be used as a display screen.

Like the display portion 9631a, part of the display portion 9631b can be a touchscreen region 9632b. When a switching button 9639 for showing/hiding a keyboard on the touchscreen is touched with a finger, a stylus, or the like, the keyboard can be displayed on the display portion 9631b.

Touch input can be performed in the touchscreen region 9632a and the touchscreen region 9632b at the same time.

The display mode switch 9034 can switch the display between portrait mode, landscape mode, and the like, and between monochrome display and color display, for example. The power-saving mode switch 9036 can control display luminance in accordance with the amount of external light in use of the tablet terminal sensed by an optical sensor incorporated in the tablet terminal. Another sensing device including a sensor such as a gyroscope or an acceleration sensor for sensing inclination may be incorporated in the tablet terminal, in addition to the optical sensor.

Although FIG. 12A illustrates an example in which the display portion 9631a and the display portion 9631b have the same display area, one embodiment of the present invention is not limited to the example. The display portion 9631a and the display portion 9631b may have different display areas and different display quality. For example, higher definition images may be displayed on one of the display portions 9631a and 9631b.

FIG. 12B illustrates the tablet terminal which is folded. The tablet terminal in this embodiment includes the housing 9630, a solar cell 9633, a charge and discharge control circuit 9634, a battery 9635, and a DCDC converter 9636. In FIG. 12B, a structure including the battery 9635 and the DCDC converter 9636 is illustrated as an example of the charge and discharge control circuit 9634.

Since the tablet terminal is foldable, the housing 9630 can be closed when the tablet terminal is not in use. As a result, the display portion 9631a and the display portion 9631b can be protected, thereby providing a tablet terminal with high endurance and high reliability for long-term use.

The tablet terminal illustrated in FIGS. 12A and 12B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that a structure in which the solar cell 9633 is provided on one or both surfaces of the housing 9630 is preferable because the battery 9635 can be charged efficiently.

Figure 12C:
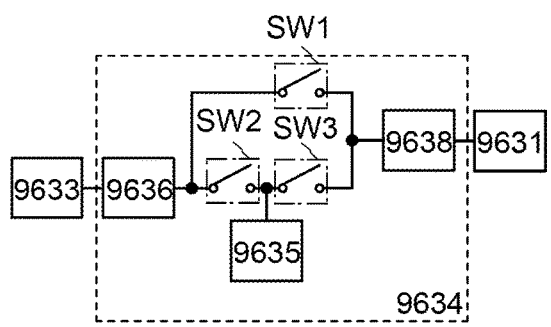

The structure and operation of the charge and discharge control circuit 9634 illustrated in FIG. 12B will be described with reference to a block diagram of FIG. 12C. FIG. 12C illustrates the solar cell 9633, the battery 9635, the DCDC converter 9636, a converter 9638, switches SW1 to SW3, and a display portion 9631. The battery 9635, the DCDC converter 9636, the converter 9638, and the switches SW1 to SW3 correspond to the charge and discharge control circuit 9634 illustrated in FIG. 12B.

First, description is made on an example of the operation in the case where power is generated by the solar cell 9633 with the use of external light. The voltage of the power generated by the solar cell is raised or lowered by the DCDC converter 9636 so as to be voltage for charging the battery 9635. Then, when power from the solar cell 9633 is used for the operation of the display portion 9631, the switch SW1 is turned on and the voltage of the power is raised or lowered by the converter 9638 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation means, the power generation means is not particularly limited, and the battery 9635 may be charged by another power generation means such as a piezoelectric element or a thermoelectric conversion element (Peltier element). The battery 9635 may be charged by a non-contact power transmission module capable of performing charging by transmitting and receiving power wirelessly (without contact), or any of the other charge means used in combination, and the power generation means is not necessarily provided.

One embodiment of the present invention is not limited to the tablet terminal having the shape illustrated in FIGS. 12A to 12C as long as the display portion 9631 is included.

Figure 13A:
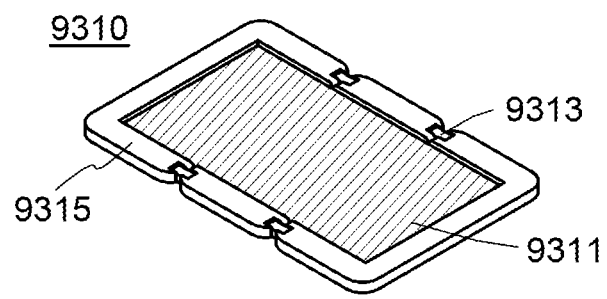
FIGS. 13A to 13C illustrate an electronic device.
Figure 13B:
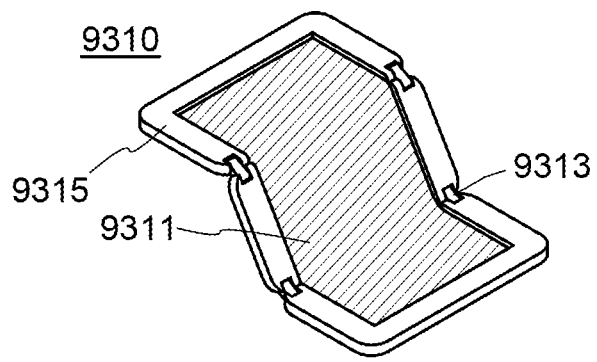
Figure 13C:
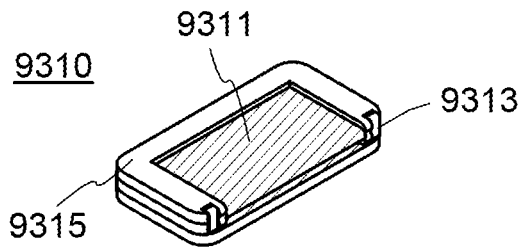

FIGS. 13A to 13C illustrate a foldable portable information terminal 9310. FIG. 13A illustrates the portable information terminal 9310 that is opened. FIG. 13B illustrates the portable information terminal 9310 that is being opened or being folded. FIG. 13C illustrates the portable information terminal 9310 that is folded. The portable information terminal 9310 is highly portable when folded. When the portable information terminal 9310 is opened, a seamless large display region is highly browsable.

A display panel 9311 is supported by three housings 9315 joined together by hinges 9313. The display panel 9311 may be a touch panel (an input/output device) including a touch sensor (an input device). By bending the display panel 9311 at a connection portion between two housings 9315 with the use of the hinges 9313, the portable information terminal 9310 can be reversibly changed in shape from an opened state to a folded state. The light-emitting device of one embodiment of the present invention can be used for the display panel 9311. A display region 9312 in the display panel 9311 includes a display region that is positioned at a side surface of the portable information terminal 9310 that is folded. On the display region 9312, information icons, frequently-used applications, file shortcuts to programs, and the like can be displayed, and confirmation of information and start of application can be smoothly performed.

Example 1

In this example, a light-emitting element 1 that is one embodiment of the present invention described in Embodiment 1 and a comparative light-emitting element 1 are described. Structural formulae of organic compounds used in the light-emitting element 1 and the comparative light-emitting element 1 are shown below.

[Chemical Formulae 3]

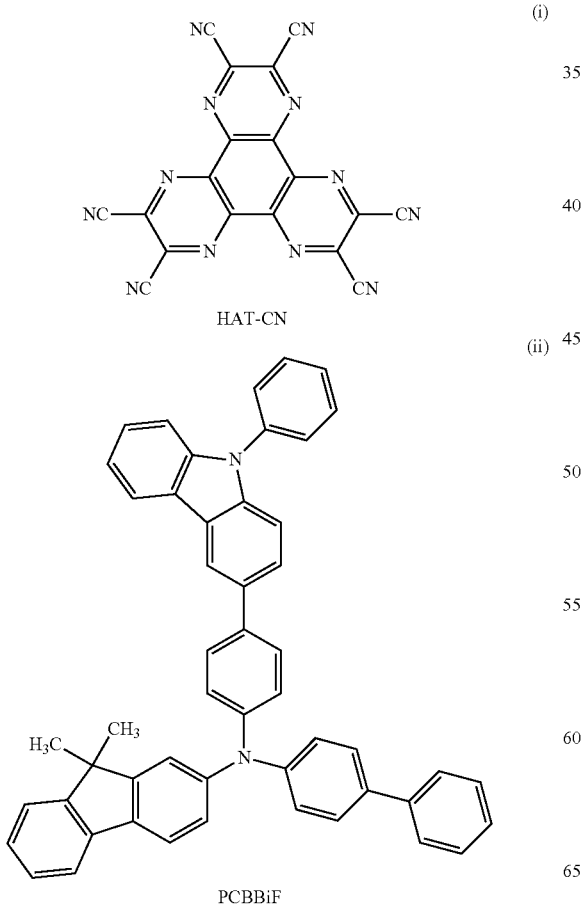

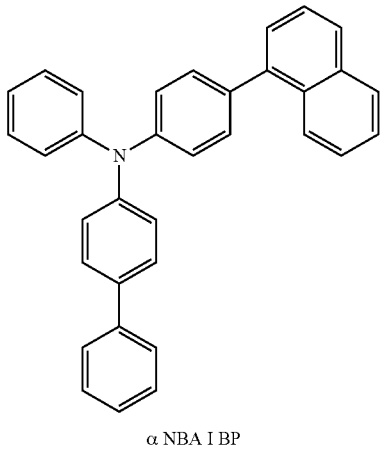

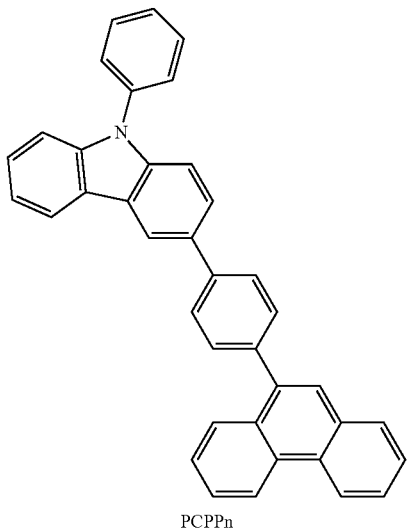

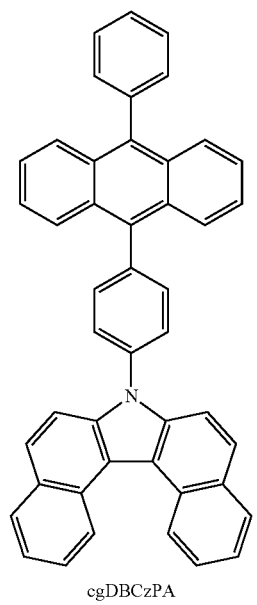

-continued

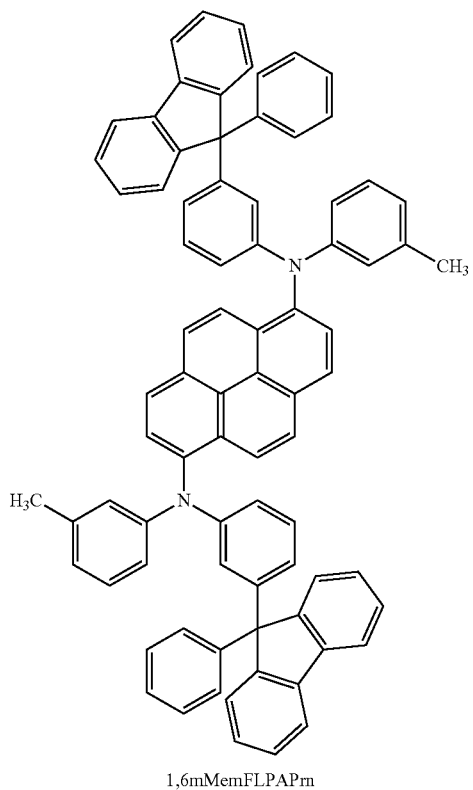

1,6mMemFLPAPrn

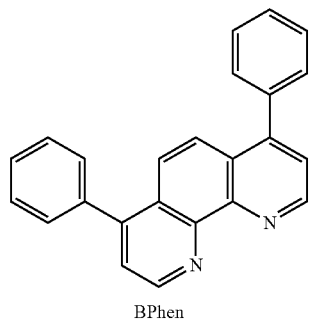

BPhen (Method for Fabricating Light-Emitting Element 1)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (ii) was deposited to a thickness of 20 nm over the hole-injection layer 111 by evaporation, whereby the first hole-transport layer 112-1 was formed; 4-(1-naphthyl)-4'-phenyltriphenylamine (abbreviation: αNBA1BP) represented by the structural formula (iii) was deposited to a thickness of 5 nm over the first hole-transport layer 112-1 by evaporation, whereby the second hole-transport layer 112-2 was formed; and 3-[4-(9-phenanthryl)-phenyl]-9-phenyl-9H-carbazole (abbreviation: PCPPn) represented by the structural formula (iv) was deposited to a thickness of 5 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis (3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the second electrode 102. Through the above-described steps, the light-emitting element 1 of this example was fabricated.

(Method for Fabricating Comparative Light-Emitting Element 1)

The comparative light-emitting element 1 was fabricated in a manner similar to that of the light-emitting element 1 except that a 25-nm-thick PCBBiF was deposited instead of the first hole-transport layer 112-1 and the second hole-transport layer 112-2 in the light-emitting element. That is, the comparative light-emitting element 1 did not include the second hole-transport layer 112-2.

The element structures of the light-emitting element 1 and the comparative light-emitting element 1 are shown in the following table.

TABLE 1

| | Hole-injection layer | Hole-transport layer | | | Light-emitting layer | Electron-transport layer | | Electron-injection layer |
|---|---|---|---|---|---|---|---|---|
| | | 1 | 2 | 3 | | | | |
| | 5 nm | 20 nm | 5 nm | 5 nm | 25 nm | 10 nm | 15 nm | 1 nm |
| Light-emitting element 1 | HAT-CN | PCBBiF | αNBA1BP | PCPPn | cgDBCzPA:1,6mMemFLPAPrn (1:0.03) | cgDBCzPA | BPhen | LiF |
| Comparative light-emitting element 1 | | PCBBiF | | | | | | |

The light-emitting element 1 and the comparative light-emitting element 1 were each sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of these light-emitting elements were measured. Note that the measurements were performed at room temperature (in an atmosphere kept at 25° C.).

Figure 14:
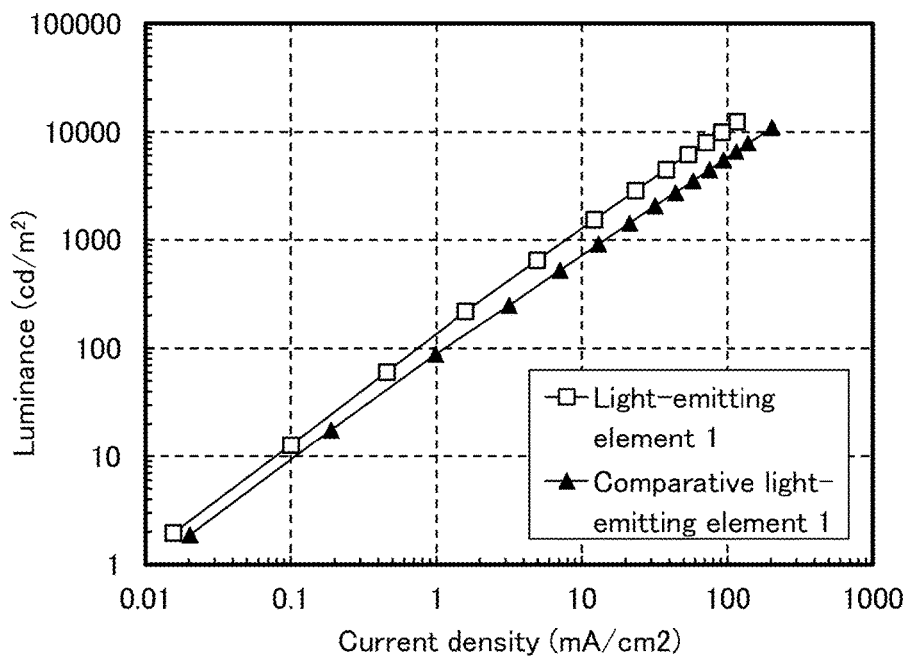
FIG. 14 shows luminance-current density characteristics of a light-emitting element 1.
Figure 15:
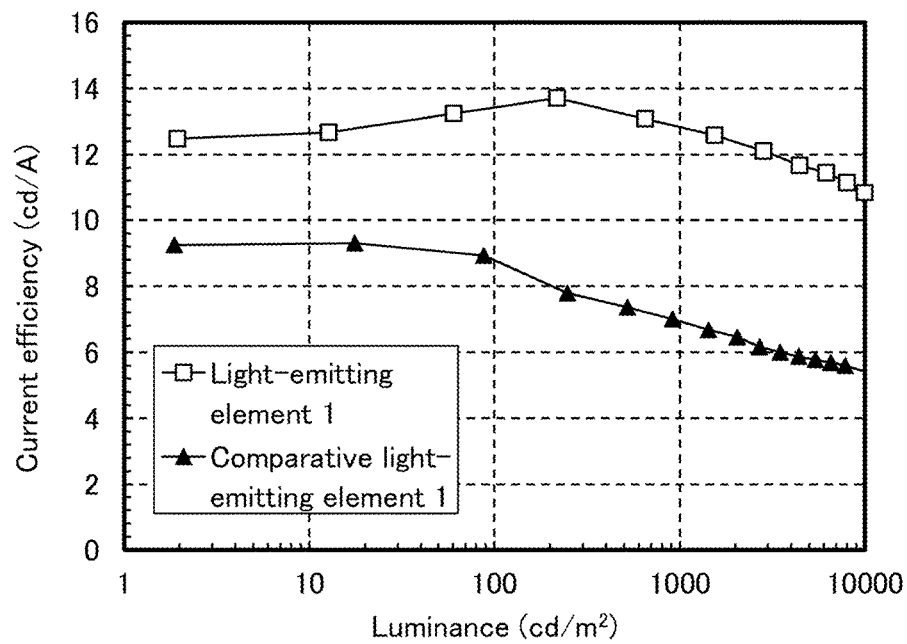
FIG. 15 shows current efficiency-luminance characteristics of the light-emitting element 1.
Figure 16:
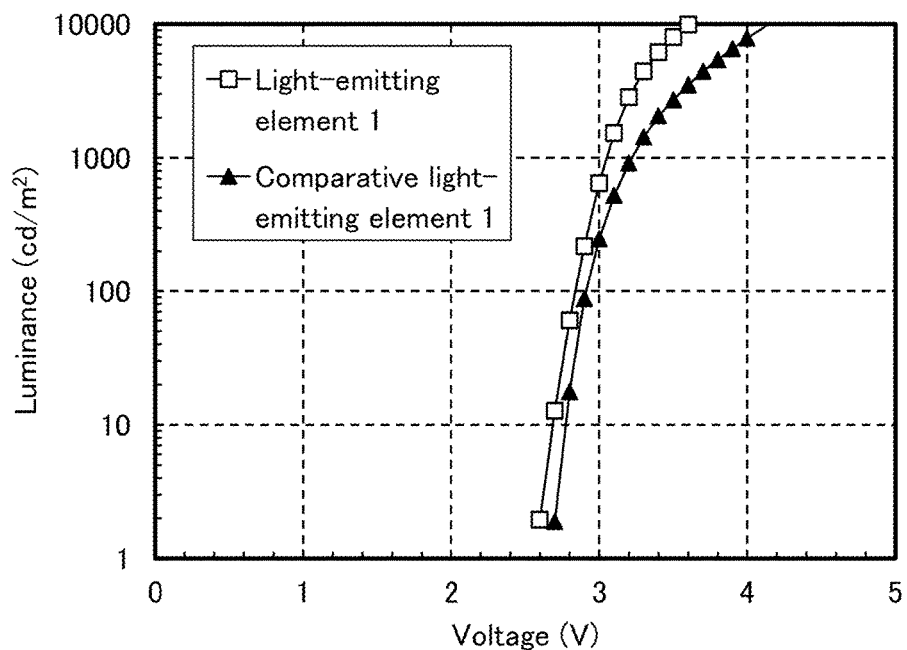
FIG. 16 shows luminance-voltage characteristics of the light-emitting element 1.
Figure 17:
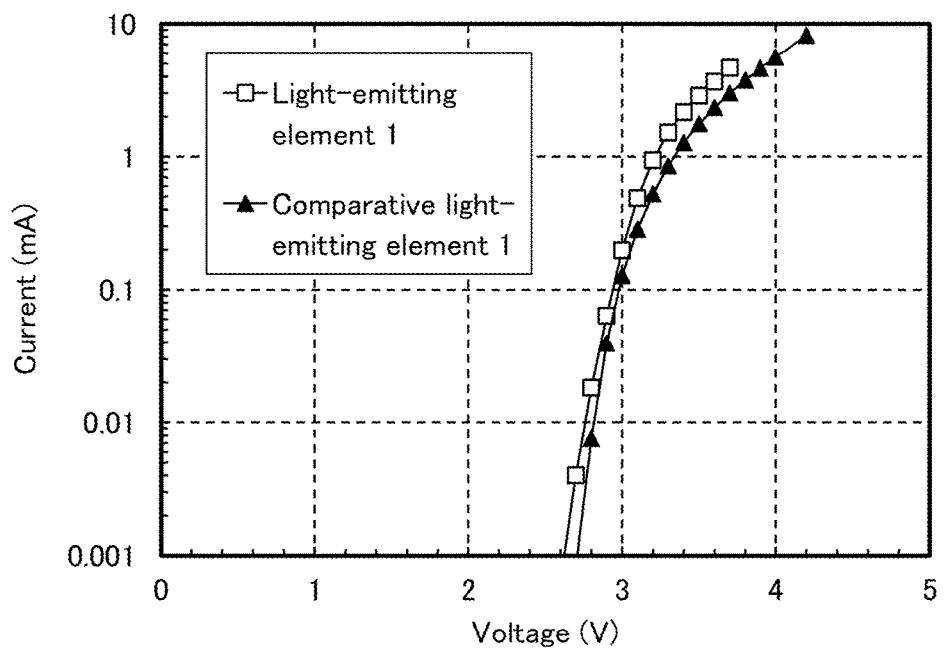
FIG. 17 shows current-voltage characteristics of the light-emitting element 1.
Figure 18:
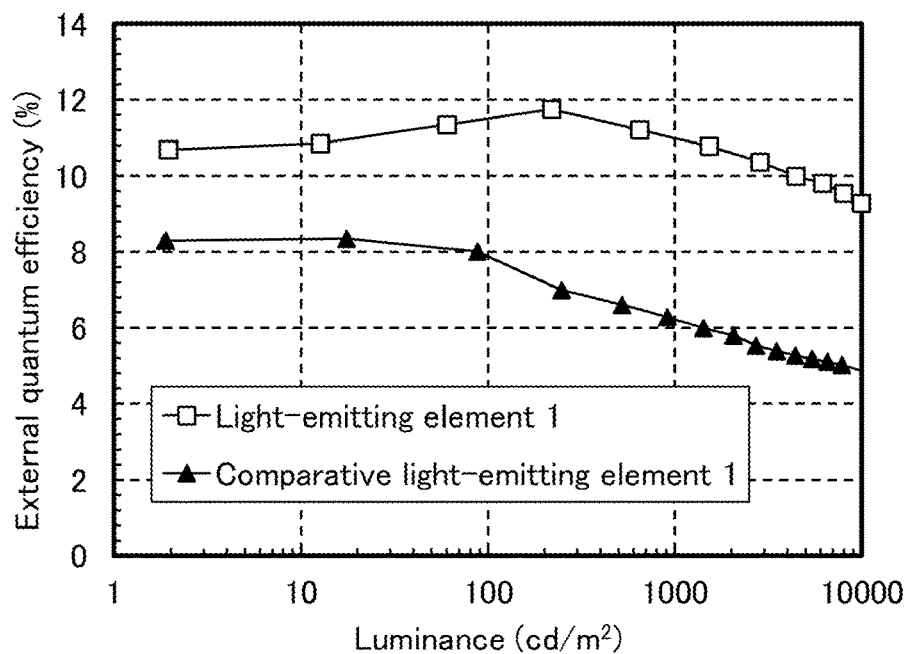
FIG. 18 shows external quantum efficiency-luminance characteristics of the light-emitting element 1.
Figure 19:
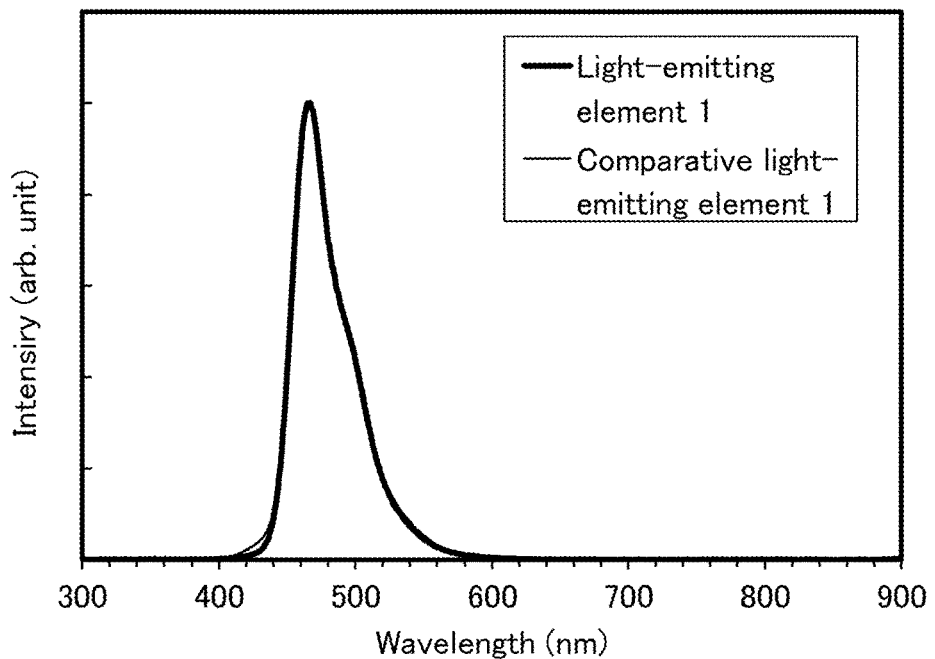
FIG. 19 shows an emission spectrum of the light-emitting element 1.

FIG. 14 shows luminance-current density characteristics of the light-emitting element 1 and the comparative light-emitting element 1. FIG. 15 shows current efficiency-luminance characteristics thereof. FIG. 16 shows luminance-voltage characteristics thereof. FIG. 17 shows current-voltage characteristics thereof. FIG. 18 shows external quantum efficiency-luminance characteristics thereof. FIG. 19 shows emission spectra thereof. Table 2 shows main characteristics of the light-emitting elements at approximately 1000 cd/m².

TABLE 2

| | Voltage (V) | Current (mA) | Current density (mA/cm²) | Chromaticity x | Chromaticity y | Current efficiency (cd/A) | External quantum efficiency (%) |
|---|---|---|---|---|---|---|---|
| Light-emitting element 1 | 3.0 | 0.20 | 5 | 0.14 | 0.17 | 13.1 | 11.2 |
| Comparative light-emitting element 1 | 3.2 | 0.52 | 13 | 0.14 | 0.17 | 7.0 | 6.3 |

FIG. 14, FIG. 15, FIG. 16, FIG. 17, FIG. 18, FIG. 19, and Table 2 verify that the light-emitting element 1 of one embodiment of the present invention was a blue light-emitting element which had favorable driving voltage and efficiency as compared to the comparative light-emitting element 1 without the second hole-transport layer 112-2.

Figure 20:
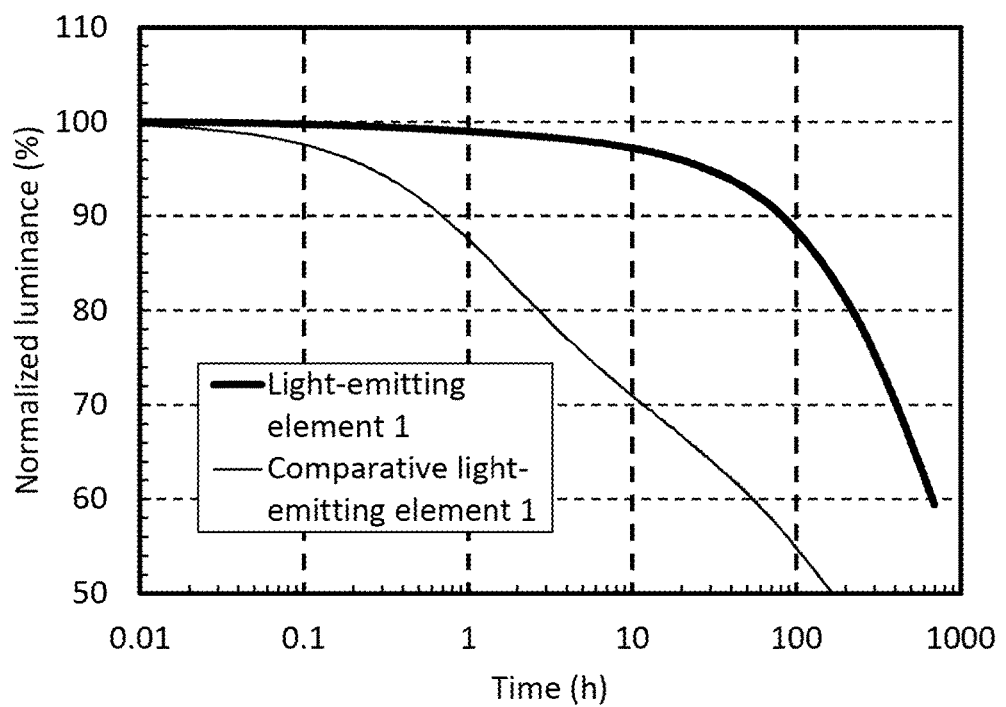
FIG. 20 shows time dependence of normalized luminance of the light-emitting element 1.

FIG. 20 shows a change in luminance of the light-emitting element with driving time under the conditions where the initial luminance was 5000 cd/m² and the current density was constant. As shown in FIG. 20, a decrease in luminance with accumulation of driving time of the light-emitting element 1 of one embodiment of the present invention is extremely smaller than that of the comparative light-emitting element 1; therefore, the light-emitting element 1 has a long lifetime.

The HOMO levels of the first to third hole-transport materials, the host material, and the light emitting material of the light-emitting element of this example are shown in Table 3. Note that the HOMO level and the LUMO level were obtained through a cyclic voltammetry (CV) measurement. A calculation method is shown below.

An electrochemical analyzer (ALS model 600A or 600C, manufactured by BAS Inc.) was used as a measurement apparatus. As for a solution used in the CV measurement, dehydrated dimethylformamide (DMF) (manufactured by Aldrich, 99.8%, catalog number: 22705-6) was used as a solvent, and tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration thereof was 100 mmol/L. Further, the object to be measured was also dissolved in the solvent such that the concentration thereof was 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was performed at room temperature (20° C. to 25° C.). In addition, the scan speed at the CV measurement was set to 0.1 V/sec, and an oxidation potential Ea [V] and a reduction potential Ec [V] with respect to the reference electrode were measured. Note that Ea represents an intermediate potential of an oxidation-reduction wave, and Ec represents an intermediate potential of a reduction-oxidation wave. Here, the potential energy of the reference electrode used in this example with respect to the vacuum level is found to be −4.94 [eV], and thus, the HOMO level and the LUMO level can be obtained from the following formula: HOMO level [eV]=−4.94−Ea and LUMO level [eV]=−4.94−Ec.

TABLE 3

|  | First hole-tranport layer | Second hole-transport layer | Third hole-transport layer | Light-emitting layer | |
| --- | --- | --- | --- | --- | --- |
|  |  |  |  | Host material | Light-emitting material |
| Material | PCBBiF | αNBA1BP | PCPPn | cgDBCzPA | 1,6mMemFLPAPrn |
| HOMO level (eV) | −5.36 | −5.52 | −5.80 | −5.69 | −5.40 |

As shown in the above table, as for the materials used in the light-emitting element 1, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

The HOMO level of PCBBiF that is the first hole-transport material is as shallow as −5.36 eV and can easily cause charge separation by interacting with the LUMO level (−4.41 eV) of HAT-CN.

Here, the HOMO level of cgDBCzPA that is the host material is −5.69 eV and its difference from the HOMO level of PCBBiF is 0.33 eV. On the other hand, the HOMO level of 1,6mMemFLPAPrn that is the light-emitting material is −5.40 eV and its difference from the HOMO level of PCBBiF is 0.04 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting element 1, the second hole-transport material whose HOMO level is shallower than the HOMO level of the host material but deeper than the HOMO level of the first hole-transport material is used as the second hole-transport layer 112-2, whereby holes are first injected from the first hole-transport layer 112-1 to the second hole-transport layer 112-2. The HOMO level of αNBA1BP that is the second hole-transport material is −5.52 eV and its difference from the HOMO level of PCBBiF that is the first hole-transport material is as small as 0.16 eV. Accordingly, holes are smoothly injected from the first hole-transport layer 112-1 to the second hole-transport layer 112-2.

If holes are injected from the second hole-transport layer 112-2 to the light-emitting layer 113, a barrier of approximately 0.17 eV exists between the second hole-transport material and the host material. With such a difference, holes are usually injected without problems. Meanwhile, the HOMO level of the light-emitting material included in the light-emitting layer 113 is −5.40 eV, and thus a barrier to hole injection from the second hole-transport material to the light-emitting material does not exist. Therefore, holes are preferentially injected to the light-emitting material than to the host material eventually. As described above, direct injection of holes to the light-emitting material is likely to cause disadvantages such as acceleration of deterioration and reduction in emitting efficiency.

Thus, in the light-emitting element 1 that was the light-emitting element of one embodiment of the present invention, the third hole-transport layer 112-3 was further provided between the second hole-transport layer 112-2 and the light-emitting layer 113. The HOMO level of PCPPn that is the third hole-transport material included in the third hole-transport layer 112-3 is −5.80 eV, which is deeper than the HOMO level of the host material. Thus, holes are preferentially injected to the host material because there is no barrier to hole injection to the host material and also because of the mixing ratio between the host material and the light-emitting material. In addition, the difference in the HOMO level between the second hole-transport material and the third hole-transport material is 0.28 eV (less than or equal to 0.3 e V with one significant figure), and thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting element had favorable emitting efficiency.

Meanwhile, since the second hole-transport layer 112-2 does not exist in the comparative light-emitting element 1, there is a large difference in HOMO level between the first hole-transport layer 112-1 and the third hole-transport layer 112-3. Accordingly, holes are less likely to be injected to the light-emitting layer 113, which results in increased driving voltage and causes disadvantages such as accumulation of electrons at the interface between the light-emitting layer 113 and the hole-transport layer, and leakage of electrons to the hole-transport layer. Accumulation of electrons causes localization of the light-emitting region, whereby the lifetime of the light-emitting element might be adversely affected. In addition, because of the leakage of electrons to the hole-transport layer, carrier recombination occurs also in the hole-transport layer, whereby the emission efficiency might be reduced owing to relative reduction of the probability of light emission of a dopant, and the lifetime might be reduced owing to the deterioration of the hole-transport material. Because the above-described disadvantages were effectively reduced in the light-emitting element 1 of one embodiment of the present invention, excellent characteristics were achieved.

Example 2
In this example, light-emitting elements 2 to 3 that are the light-emitting elements of embodiments of the present invention described in Embodiment 1 are described. Structural formulae of organic compounds used for the light-emitting elements 2 and 3 are shown below.
[Chemical Formulae 4]
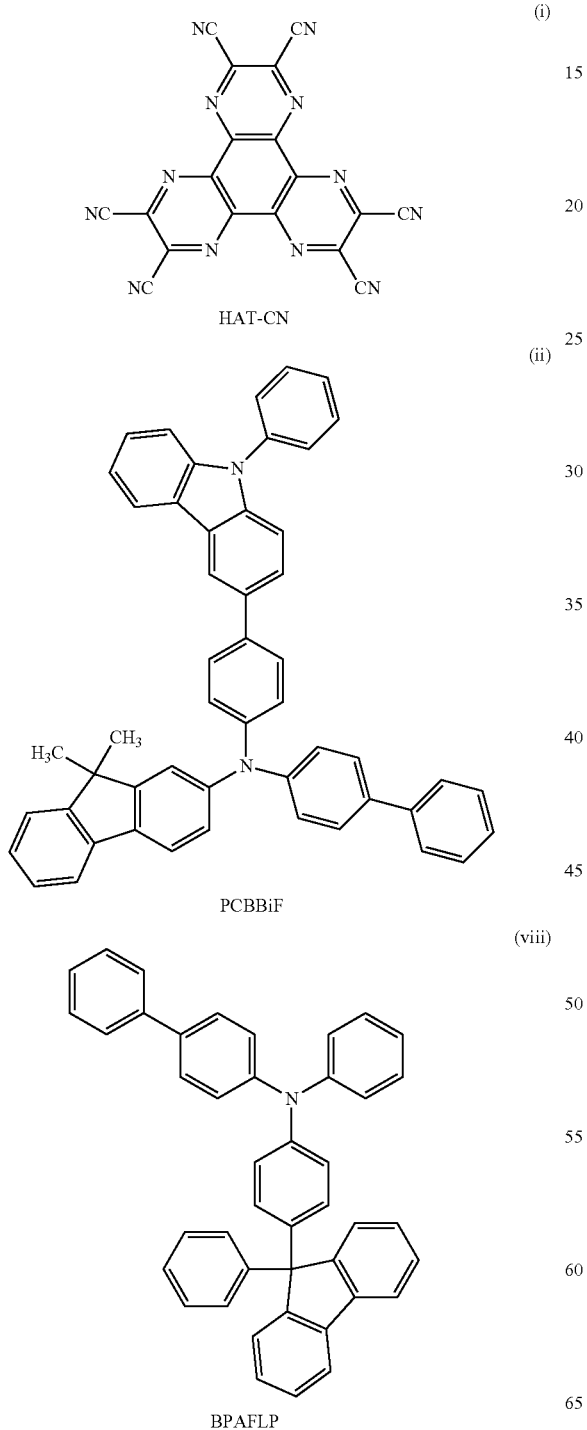
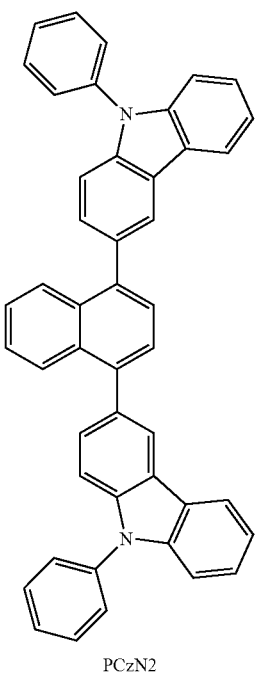
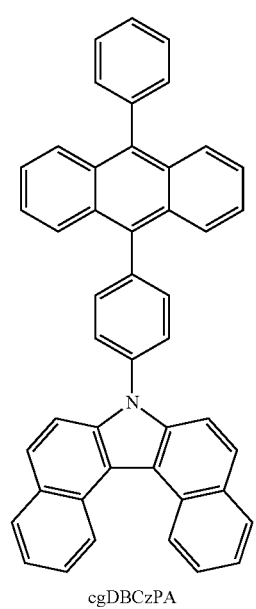

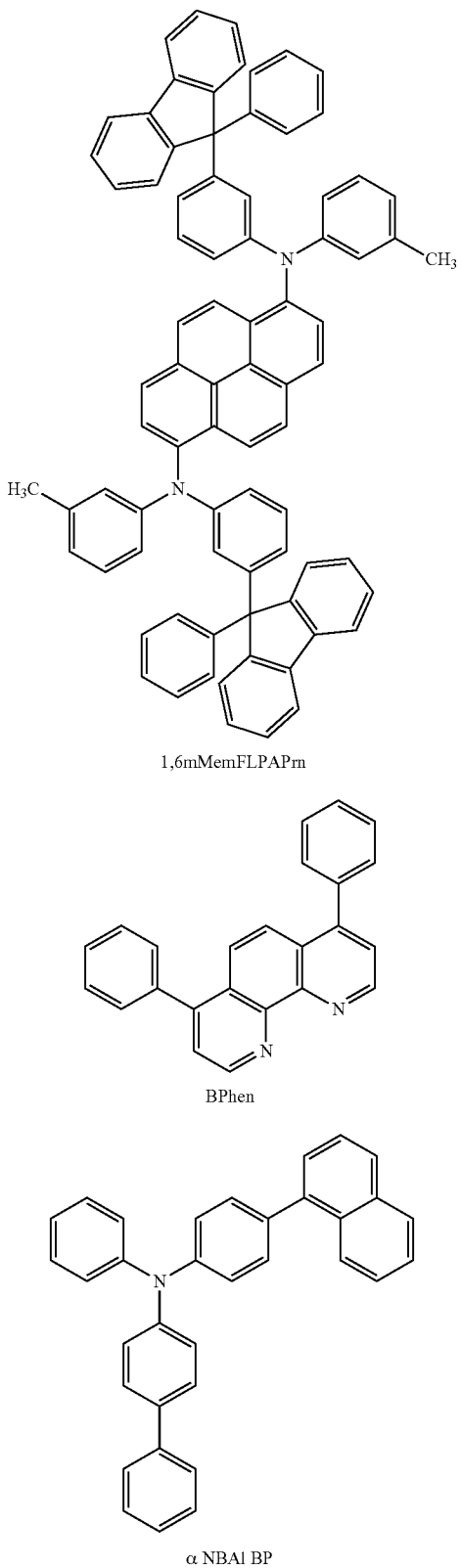

(vi) 1,6mMemFLPAPrn (vii) BPhen (iii) αNBA1BP (Method for Fabricating Light-Emitting Element 2)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (ii) was deposited to a thickness of 10 nm over the hole-injection layer 111 by evaporation, whereby the first hole-transport layer 112-1 was formed; 4-phenyl-4'-(9-phenylfluoren-9-yl)triphenylamine (abbreviation: BPAFLP) represented by the structural formula (viii) was deposited to a thickness of 5 nm over the first hole-transport layer 112-1 by evaporation, whereby the second hole-transport layer 112-2 was formed; and 3,3'-(naphthalen-1,4-diyl)bis(9-phenyl-9H-carbazole) (abbreviation: PCzN2) represented by the structural formula (ix) was deposited to a thickness of 15 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis(3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the second electrode 102. Through the above-described steps, the light-emitting element 2 of this example was fabricated.

(Method for Fabricating Light-Emitting Element 3)

A light-emitting element 3 was fabricated in a manner similar to that of the light-emitting element 2 except that αNBA1BP is used in place of BPAFLP of the second hole-transport layer 112-2 of the light-emitting element 2.

The element structures of the light-emitting elements 2 and 3 are shown in the following table.

TABLE 4

| | Hole-injection layer | Hole-transport layer | | | Light-emitting layer | Electron-transport layer | | Electron-injection layer |
|---|---|---|---|---|---|---|---|---|
| | | 1 | 2 | 3 | | | | |
| | 5 nm | 10 nm | 5 nm | 15 nm | 25 nm | 10 nm | 15 nm | 1 nm |
| Light-emitting element 2 | HAT-CN | PCBBiF | BPAFLP | PCzN2 | cgDBCzPA:1,6mMemFLPAPrn (1:0.03) | cgDBCzPA | BPhen | LiF |
| Light-emitting element 3 | HAT-CN | PCBBiF | αNBA1BP | PCzN2 | cgDBCzPA:1,6mMemFLPAPrn (1:0.03) | cgDBCzPA | BPhen | LiF |

The light-emitting elements 2 and 3 were each sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of these light-emitting elements were measured. Note that the measurements were performed at room temperature (in an atmosphere kept at 25° C.).

Figure 21:
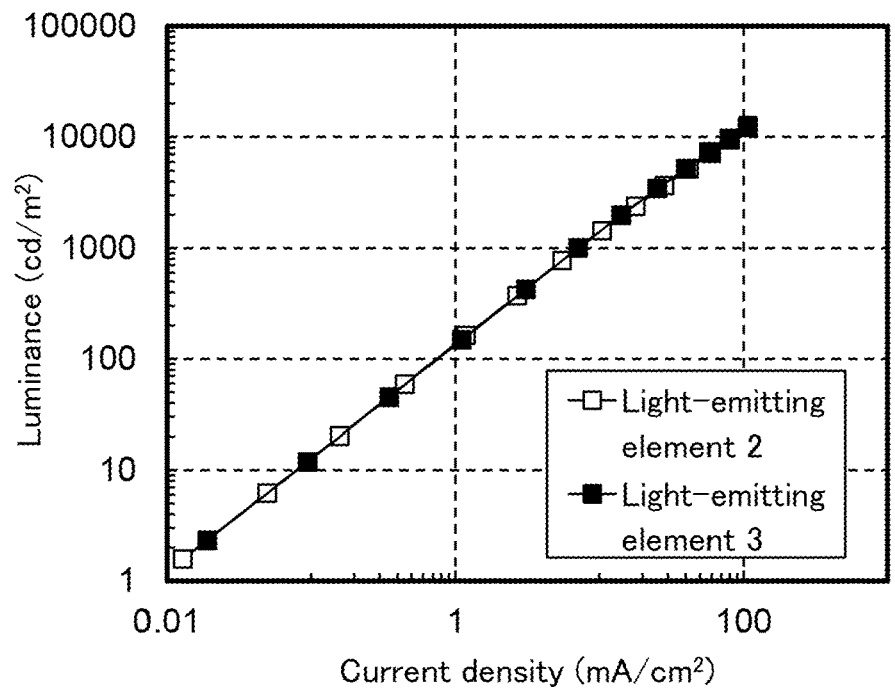
FIG. 21 shows luminance-current density characteristics of light-emitting elements 2 and 3.
Figure 22:
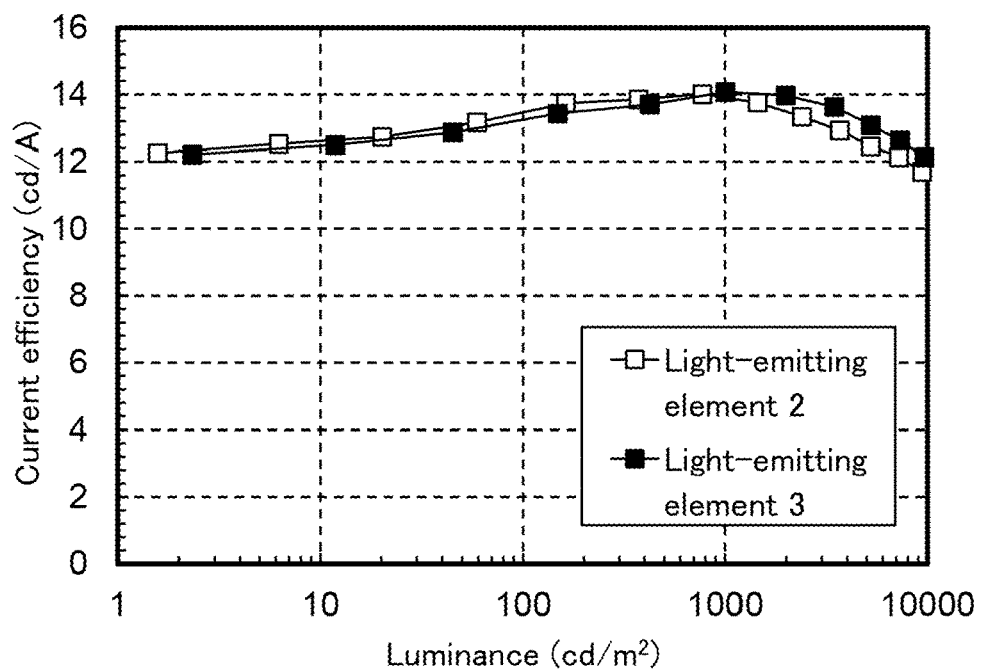
FIG. 22 shows current efficiency-luminance characteristics of the light-emitting elements 2 and 3.
Figure 23:
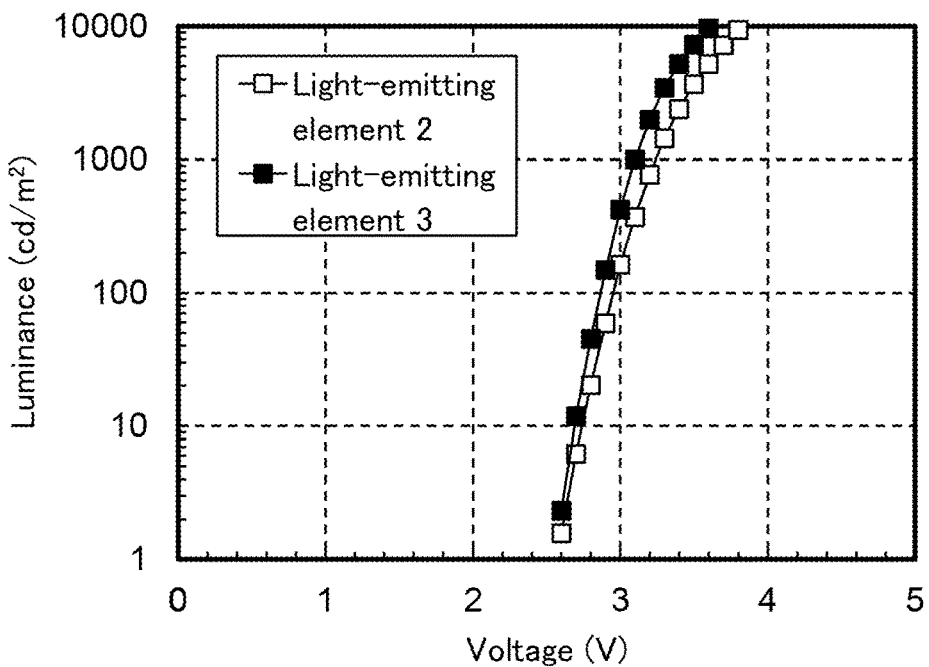
FIG. 23 shows luminance-voltage characteristics of the light-emitting elements 2 and 3.
Figure 24:
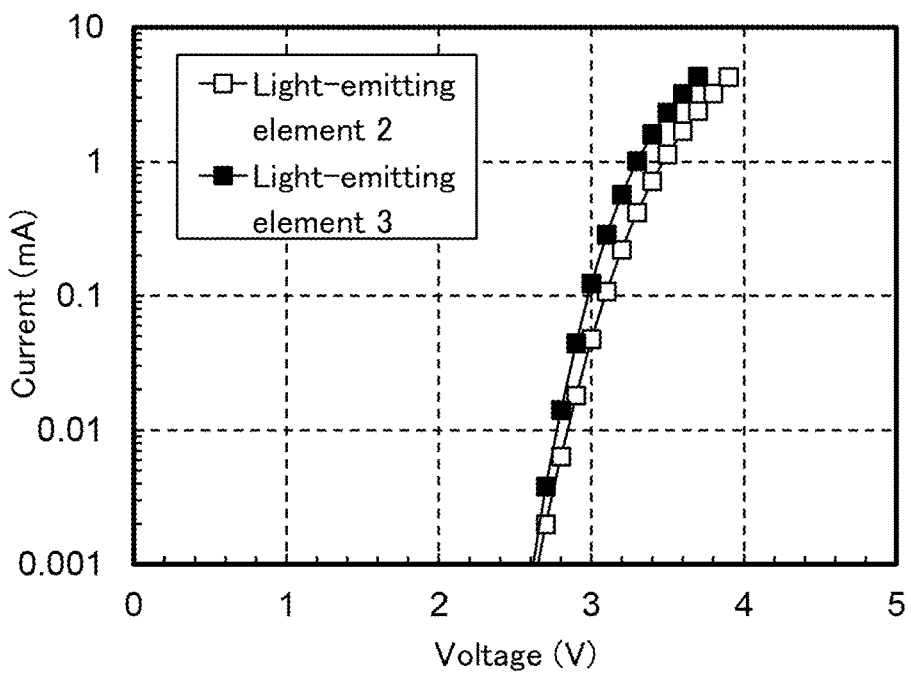
FIG. 24 shows current-voltage characteristics of the light-emitting elements 2 and 3.
Figure 25:
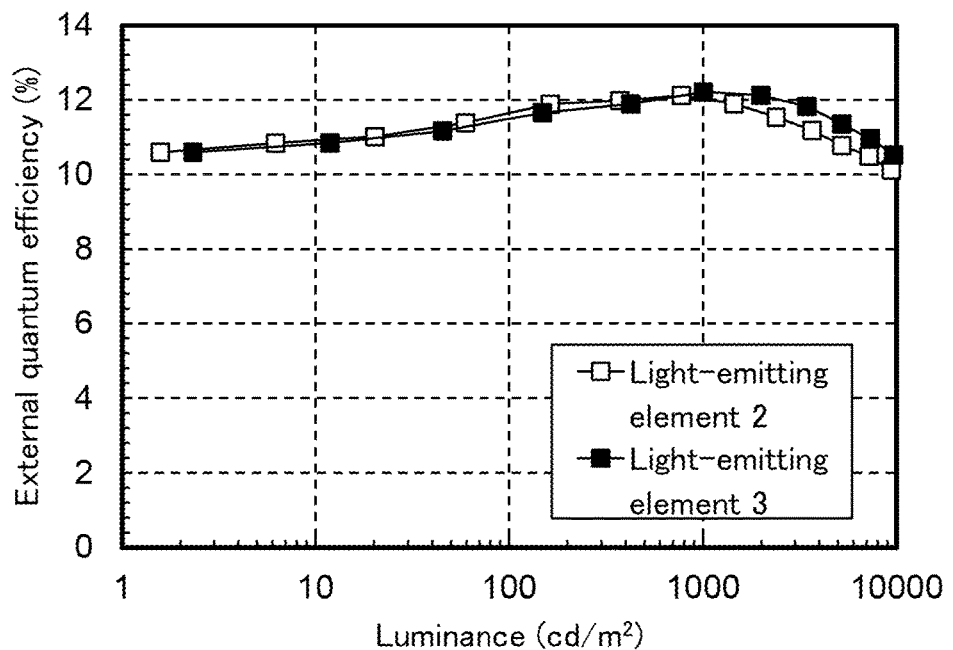
FIG. 25 shows external quantum efficiency-luminance characteristics of the light-emitting elements 2 and 3.
Figure 26:
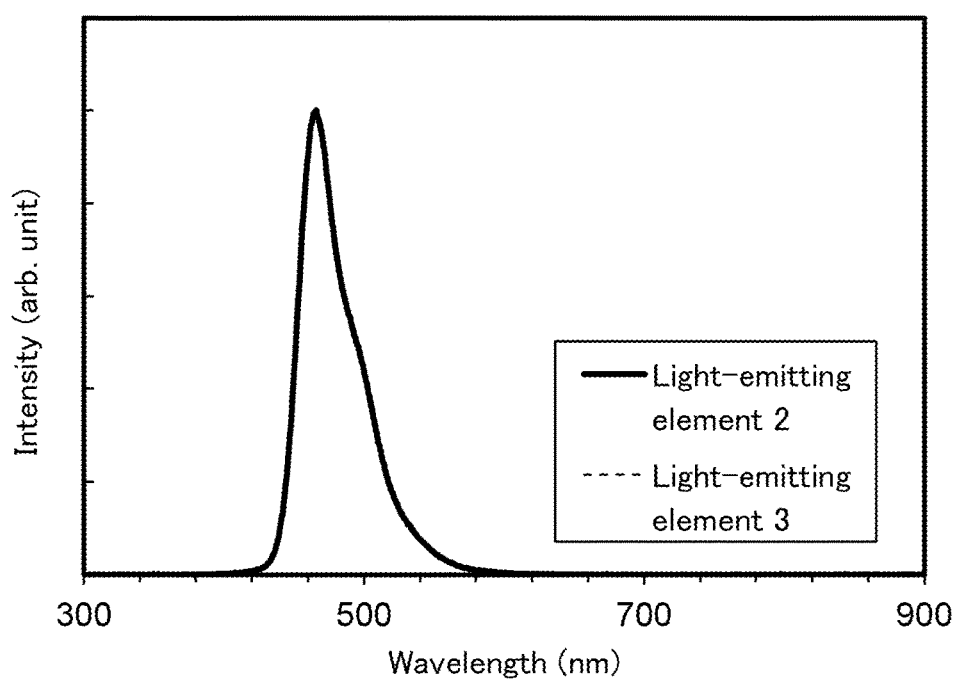
FIG. 26 shows emission spectra of the light-emitting elements 2 and 3.

FIG. 21 shows luminance-current density characteristics of the light-emitting elements 2 and 3. FIG. 22 shows current efficiency-luminance characteristics thereof. FIG. 23 shows luminance-voltage characteristics thereof. FIG. 24 shows current-voltage characteristics thereof. FIG. 25 shows external quantum efficiency-luminance characteristics thereof. FIG. 26 shows emission spectra thereof. Table 5 shows main characteristics of the light-emitting elements at approximately 1000 cd/m$^2$.

TABLE 5

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting element 2 | 3.2 | 0.22 | 6 | 0.14 | 0.17 | 14.0 | 12.1 |
| Light-emittin element 3 | 3.1 | 0.29 | 7 | 0.14 | 0.17 | 14.1 | 12.2 |

FIG. 21, FIG. 22, FIG. 23, FIG. 24, FIG. 25, FIG. 26, and Table 5 verify that any of the light-emitting elements was a blue light-emitting element which had favorable characteristics.

Figure 27:
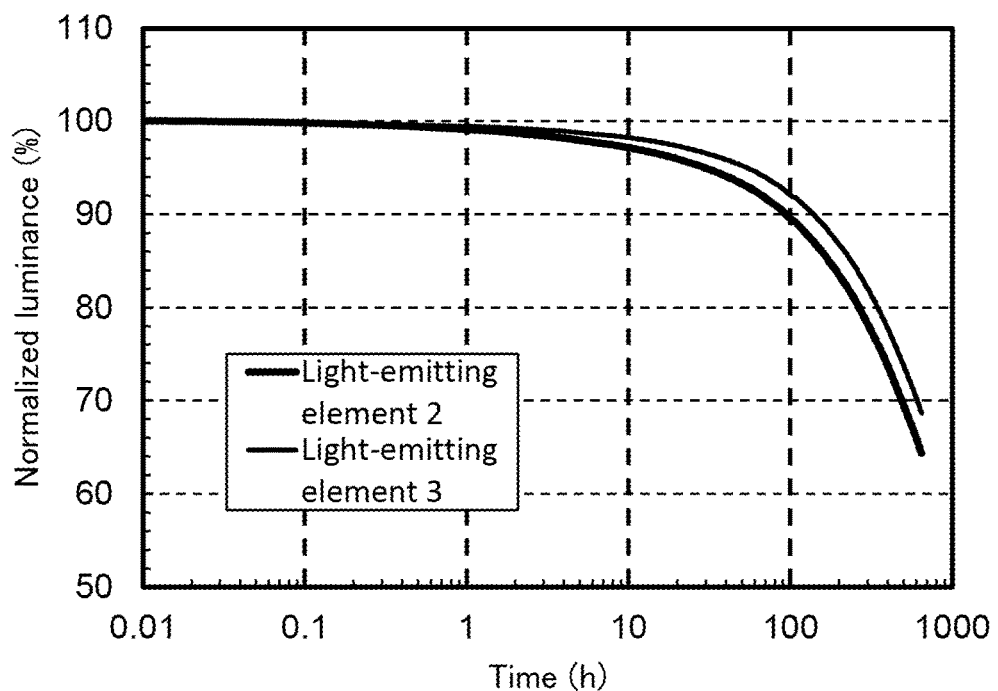
FIG. 27 shows time dependence of normalized luminance of the light-emitting elements 2 and 3.

FIG. 27 shows a change in luminance of the light-emitting element with driving time under the conditions where the initial luminance was 5000 cd/m$^2$ and the current density was constant. As shown in FIG. 27, a decrease in luminance with accumulation of driving time of the light-emitting elements 1 and 2 of one embodiment of the present invention is small; therefore, the light-emitting elements 2 and 3 have a long lifetime.

The HOMO levels of the first to third hole-transport materials, the host material, and the light emitting material of the light-emitting elements of this example are shown in the following table. Note that the HOMO level and the LUMO level were obtained through a cyclic voltammetry (CV) measurement. A calculation method was the same as that described in Example 1.

TABLE 6

| | | | | | Light-emitting layer | |
|---|---|---|---|---|---|---|
| Light-emitting element 2 | | | | | | |
| | | First hole-tranport layer | Second hole-transport layer | Third hole-transport layer | Host material | Light-emitting material |
| | Material | PCBBiF | BPAFLP | PCzN2 | cgDBCzPA | 1,6mMemFLPAPrn |
| | HOMO level (eV) | −5.36 | −5.51 | −5.71 | −5.69 | −5.40 |

TABLE 7

| | Light-emitting element 3 | | | | |
| --- | --- | --- | --- | --- | --- |
| | | | | Light-emitting layer | |
| | First hole-tranport layer | Second hole-transport layer | Third hole-transport layer | Host material | Light-emitting material |
| Material | PCBBiF | αNBA1BP | PCzN2 | cgDBCzPA | 1,6mMemFLPAPrn |
| HOMO level (eV) | −5.36 | −5.52 | −5.71 | −5.69 | −5.40 |

As shown in the above table, as for the materials used in the light-emitting elements 2 and 3, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

The HOMO level of PCBBiF that is the first hole-transport material is as shallow as −5.36 eV and can easily cause charge separation by interacting with the LUMO level (−4.41 eV) of HAT-CN.

Here, the HOMO level of cgDBCzPA that is the host material is −5.69 eV and its difference from the HOMO level of PCBBiF is 0.33 eV. On the other hand, the HOMO level of 1,6mMemFLPAPrn that is the light-emitting material is −5.40 eV and its difference from the HOMO level of PCBBiF is 0.04 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting elements 2 and 3, the second hole-transport material whose HOMO level is shallower than the HOMO level of the host material but deeper than the HOMO level of the first hole-transport material is used as the second hole-transport layer 112-2, whereby holes are first injected from the first hole-transport layer 112-1 to the second hole-transport layer 112-2. The HOMO level of BPAFLP that is the second hole-transport material of the light-emitting element 2 is −5.51 eV and its difference from the HOMO level of PCBBiF that is the first hole-transport material is as small as 0.15 eV. The HOMO level of αNBA1BP that is the second hole-transport material of the light-emitting element 3 is −5.52 eV and its difference from the HOMO level of PCBBiF that is the first hole-transport material is as small as 0.16 eV. Accordingly, holes are smoothly injected from the first hole-transport layer 112-1 to the second hole-transport layer 112-2.

If holes are injected from the second hole-transport layer 112-2 to the light-emitting layer 113, a barrier of approximately 0.17 eV to 0.18 eV exists between the second hole-transport material and the host material. With such a difference, holes are usually injected without problems. Meanwhile, the HOMO level of the light-emitting material included in the light-emitting layer 113 is −5.40 eV, and thus a barrier does not exist between the second hole-transport material and the light-emitting material. Therefore, holes are preferentially injected to the light-emitting material than to the host material eventually. As described above, direct injection of holes to the light-emitting material is likely to cause disadvantages such as acceleration of deterioration and reduction in emission efficiency.

Thus, in the light-emitting elements 2 and 3 that were the light-emitting elements of embodiments of the present invention, the third hole-transport layer 112-3 was further provided between the second hole-transport layer 112-2 and the light-emitting layer 113. The HOMO level of PCzN2 that is the third hole-transport material included in the third hole-transport layer 112-3 is −5.71 eV, which is substantially the same as (slightly deeper than) the HOMO level of the host material. Thus, holes are preferentially injected to the host material because there is no barrier to hole injection to the host material and also because of the mixing ratio between the host material and the light-emitting material. In addition, the difference in the HOMO level between the second hole-transport material and the third hole-transport material is 0.20 eV or 0.19 eV (less than or equal to 0.3 e V with one significant figure), and thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting elements had favorable emission efficiency.

Example 3

In this example, a light-emitting element 4 which is the light-emitting element of an embodiment of the present invention described in Embodiment 1 is described. Structural formulae of organic compounds used for the light-emitting element 4 are shown below.

[Chemical Formulae 5]
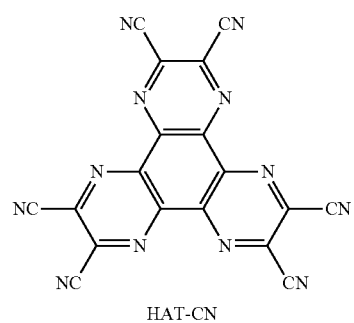
HAT-CN (i)
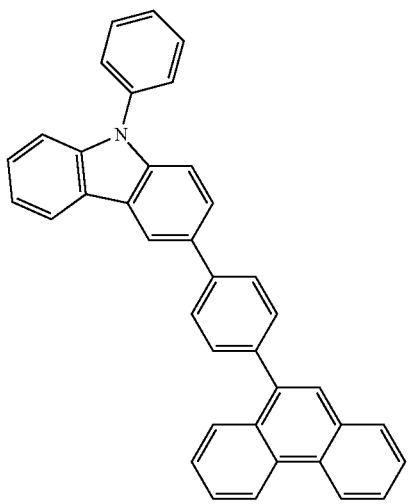
PCPPn (iv)
PCBBiF (ii)
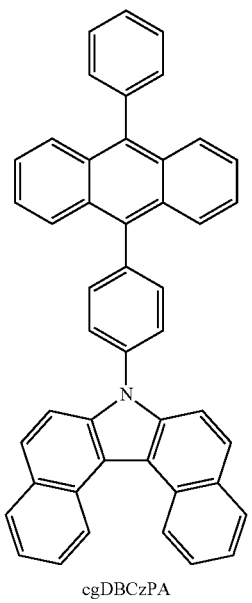
cgDBCzPA (v)
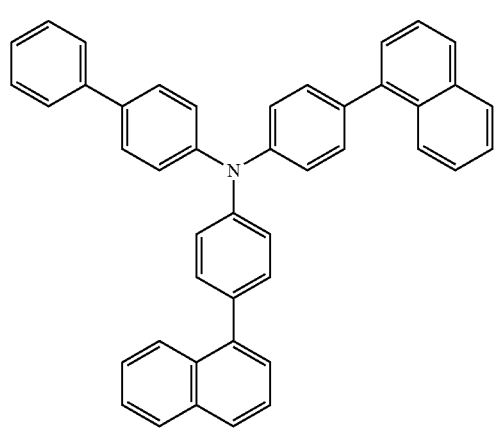
α NBB1BP (x)

-continued

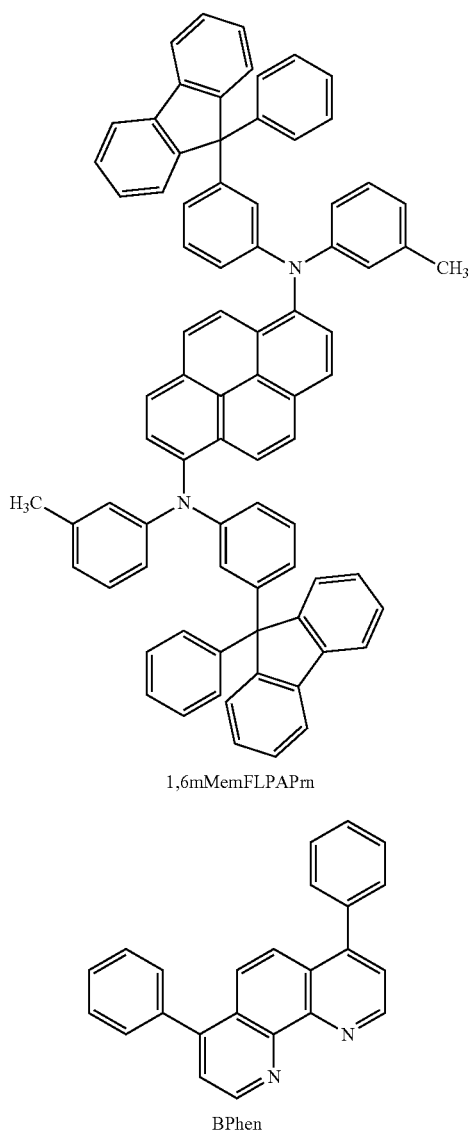

1,6mMemFLPAPrn (vii)

BPhen (Method for Fabricating Light-Emitting Element 4)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (ii) was deposited to a thickness of 20 nm over the hole-injection layer 111 by evaporation, whereby the first hole-transport layer 112-1 was formed; 4,4'-di-(1-naphthyl)-4''-phenyltriphenylamine (abbreviation: αNBB1BP) represented by the structural formula (x) was deposited to a thickness of 5 nm over the first hole-transport layer 112-1 by evaporation, whereby the second hole-transport layer 112-2 was formed; and 3-[4-(9-phenanthryl)-phenyl]-9-phenyl-9H-carbazole (abbreviation: PCPPn) represented by the structural formula (iv) was deposited to a thickness of 5 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis (3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the second electrode 102. Through the above-described steps, the light-emitting element 4 of this example was fabricated.

The element structure of the light-emitting element 4 is shown in the following table.

TABLE 8

| Hole-injection layer | Hole-transport layer | | | Light-emitting layer | Electron-transport layer | | Electron-injection layer |
|---|---|---|---|---|---|---|---|
| | 1 | 2 | 3 | | | | |
| 5 nm | 20 nm | 5 nm | 5 nm | 25 nm | 10 nm | 15 nm | 1 nm |
| HAT-CN | PCBBiF | αNBB1BP | PCPPn | cgDBCzPA:1,6mMemFLPAPrn (1:0.03) | cgDBCzPA | BPhen | LiF |

The light-emitting element 4 was sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of the light-emitting element were measured. Note that the measurements were performed at room temperature (in an atmosphere kept at 25° C.).

Figure 28:
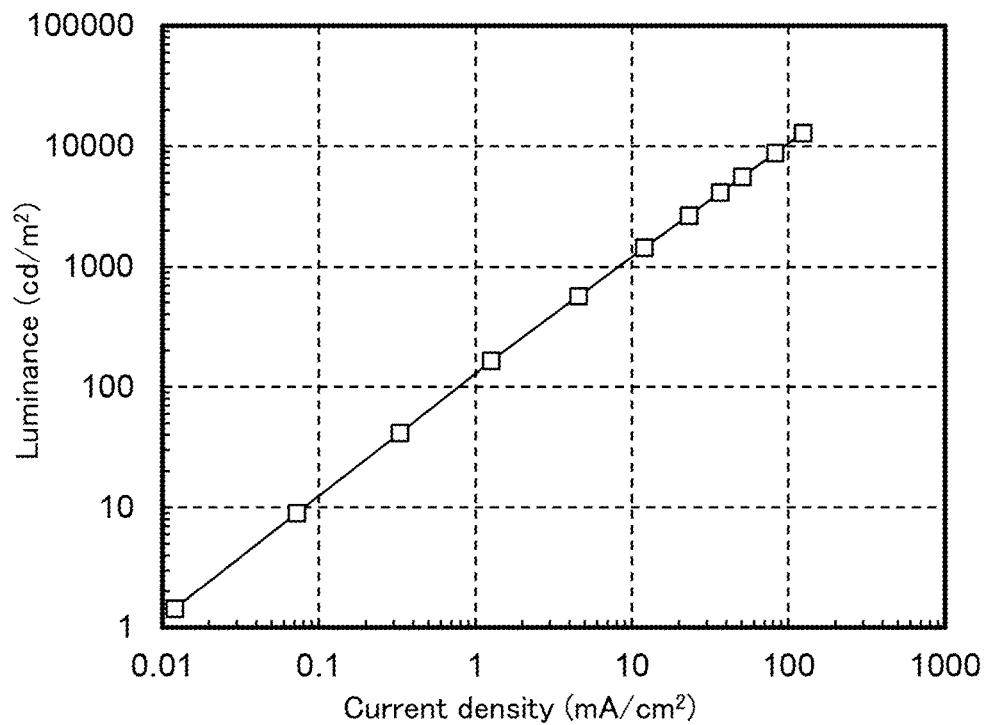
FIG. 28 shows luminance-current density characteristics of a light-emitting element 4.
Figure 29:
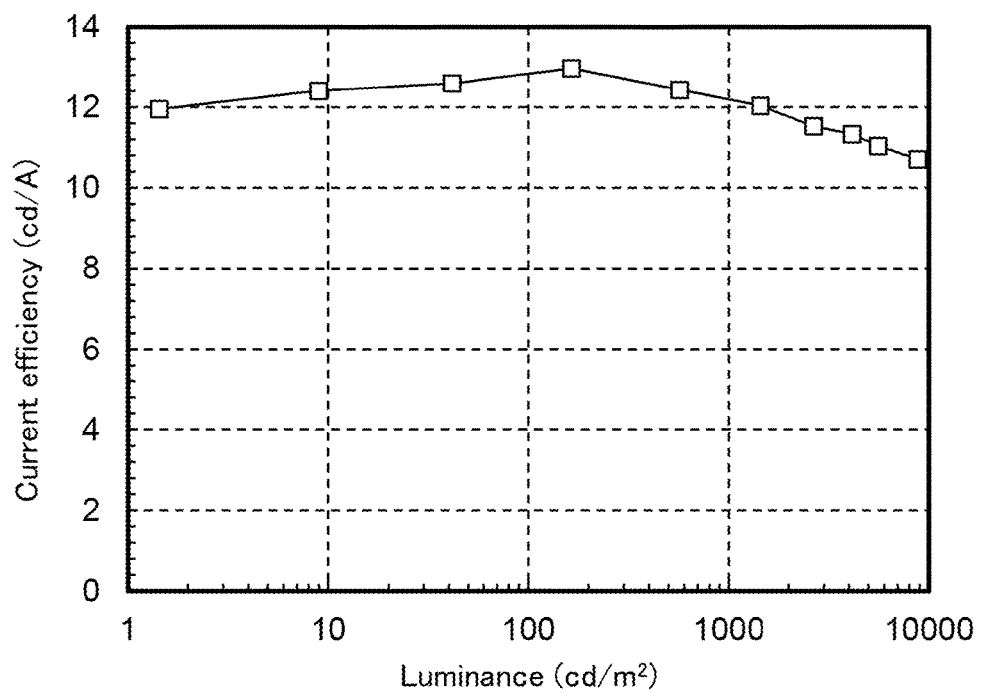
FIG. 29 shows current efficiency-luminance characteristics of the light-emitting element 4.
Figure 30:
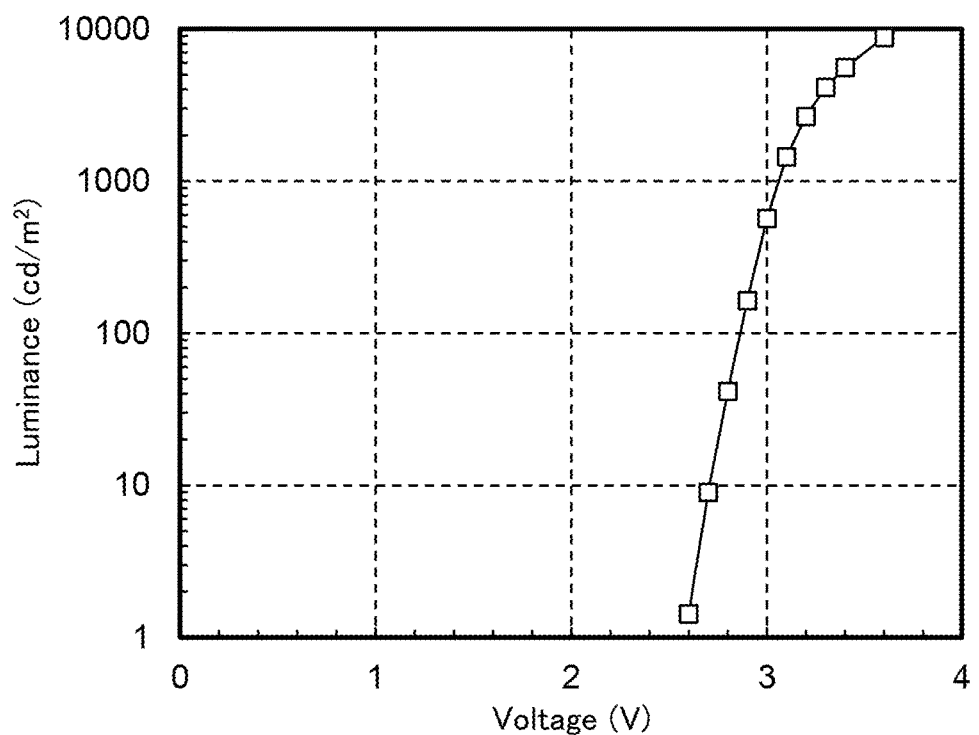
FIG. 30 shows luminance-voltage characteristics of the light-emitting element 4.
Figure 31:
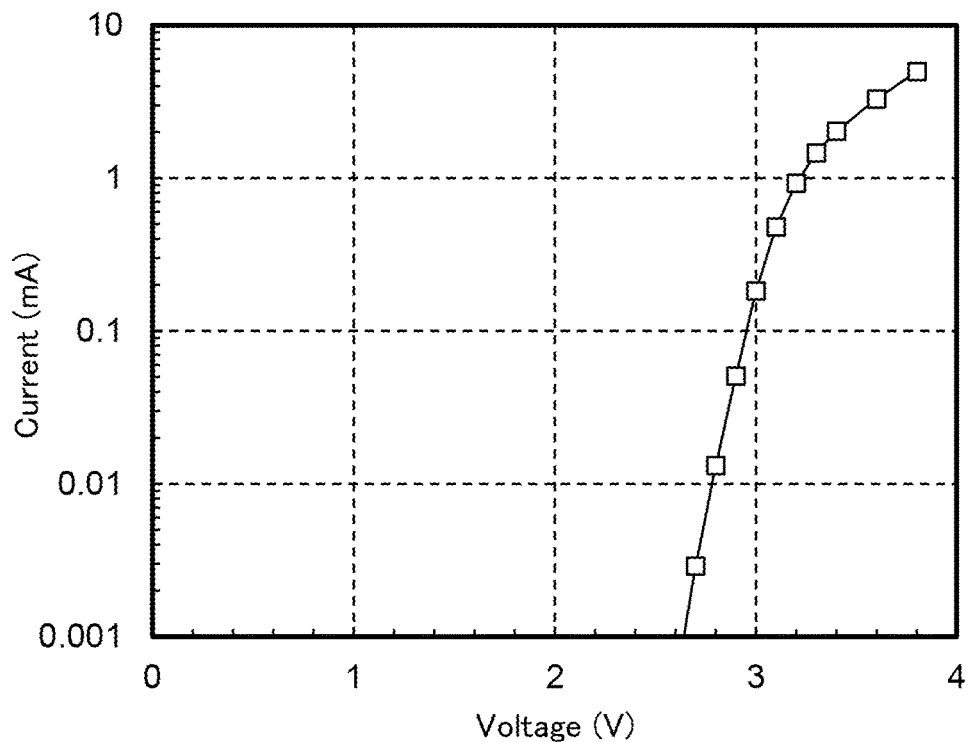
FIG. 31 shows current-voltage characteristics of the light-emitting element 4.
Figure 32:
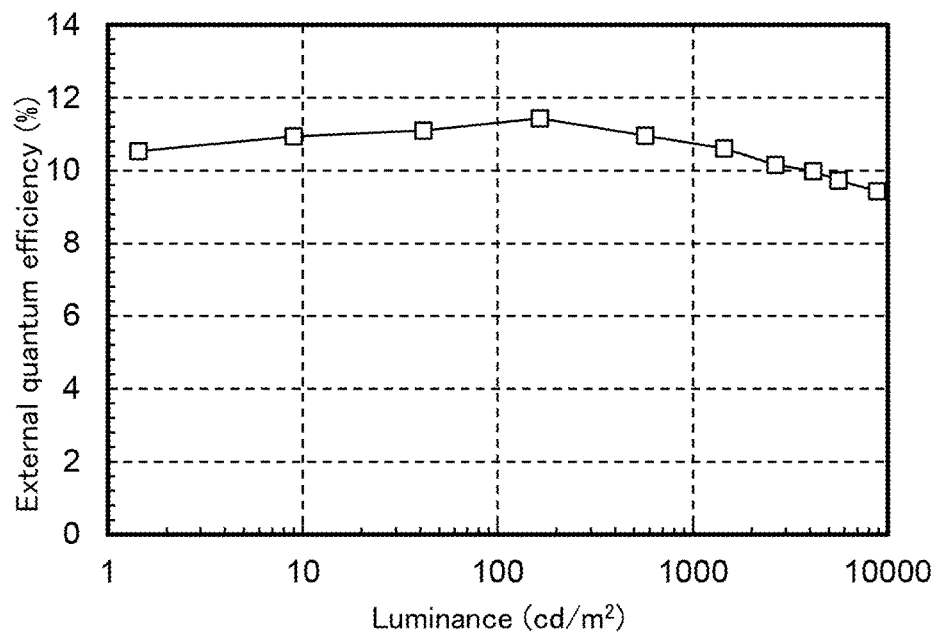
FIG. 32 shows external quantum efficiency-luminance characteristics of the light-emitting element 4.
Figure 33:
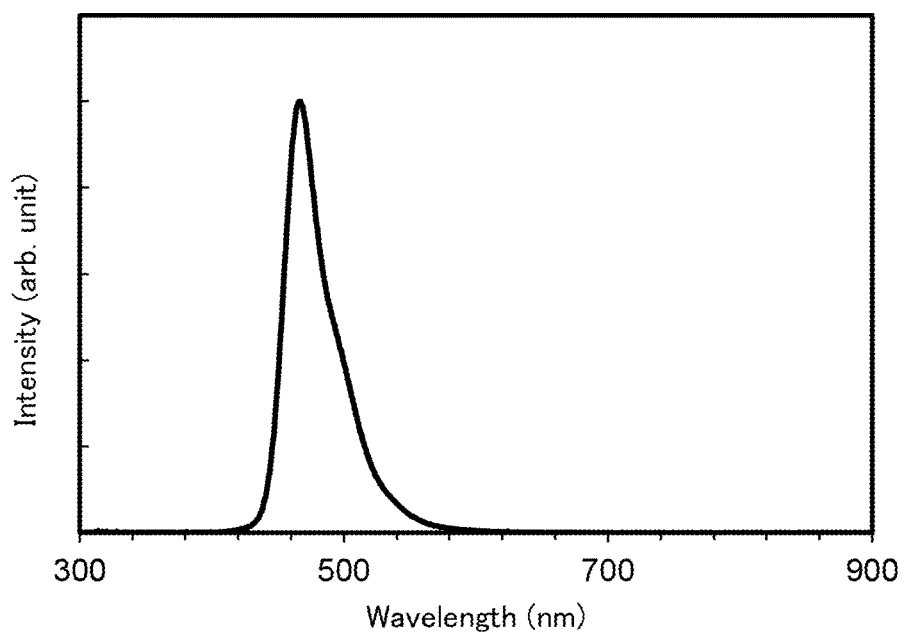
FIG. 33 shows an emission spectrum of the light-emitting element 4.

FIG. 28 shows luminance-current density characteristics of the light-emitting element 4. FIG. 29 shows current efficiency-luminance characteristics thereof. FIG. 30 shows luminance-voltage characteristics thereof. FIG. 31 shows current-voltage characteristics thereof. FIG. 32 shows external quantum efficiency-luminance characteristics thereof. FIG. 33 shows emission spectra thereof. Table 9 shows main characteristics of the light-emitting element at approximately 1000 cd/m$^2$.

TABLE 9

| Voltage (V) | Current (mA) | Current density (mA/cm$^2$) | Chromaticity x | Chromaticity y | Current efficiency (cd/A) | External quantum efficiency (%) |
|---|---|---|---|---|---|---|
| 3.0 | 0.18 | 5 | 0.14 | 0.17 | 12.4 | 11.0 |

FIG. 28, FIG. 29, FIG. 30, FIG. 31, FIG. 32, FIG. 33, and Table 9 verify that the light-emitting element 4 was a blue light-emitting element which had favorable characteristics.

Figure 34:
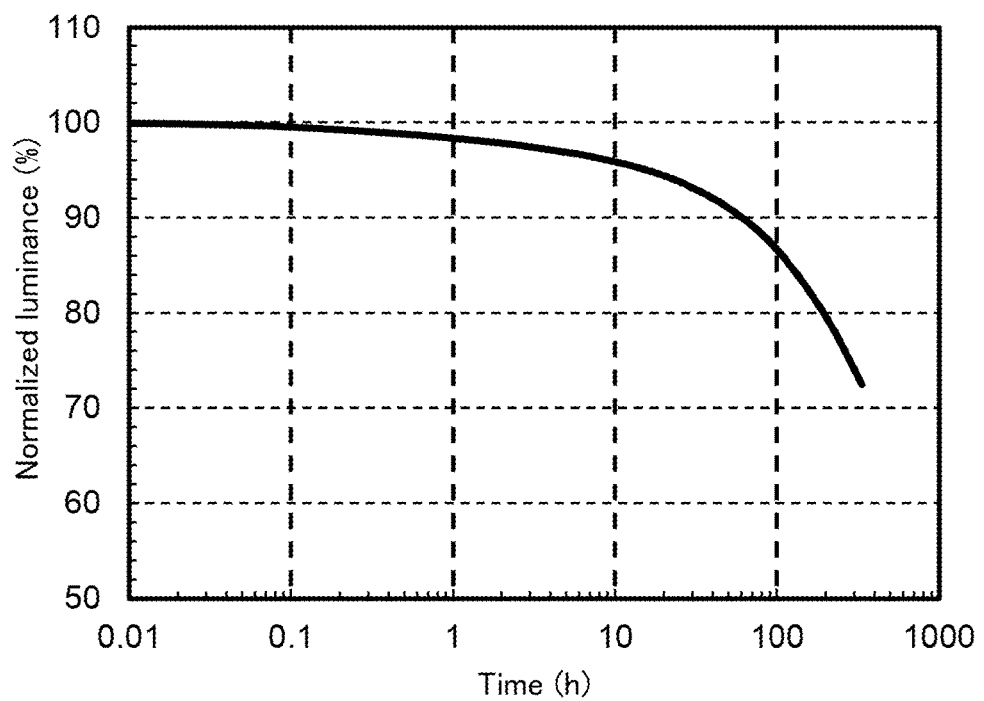
FIG. 34 shows time dependence of normalized luminance of the light-emitting element 4.

FIG. 34 shows a change in luminance of the light-emitting element with driving time under the conditions where the initial luminance was 5000 cd/m$^2$ and the current density was constant. As shown in FIG. 34, a decrease in luminance with accumulation of driving time of the light-emitting element 4 of one embodiment of the present invention is small; therefore, the light-emitting element 4 has a long lifetime.

The HOMO levels of the first to third hole-transport materials, the host material, and the light emitting material of the light-emitting element of this example are shown in the following table. Note that the HOMO level and the LUMO level were obtained through a cyclic voltammetry (CV) measurement. A calculation method was the same as that described in Example 1.

TABLE 10

| | First hole-tranport layer | Second hole-transport layer | Third hole-transport layer | Light-emitting layer | |
|---|---|---|---|---|---|
| | | | | Host material | Light-emitting material |
| Material | PCBBiF | αNBB1BP | PCPPn | cgDBCzPA | 1,6mMemFLPAPrn |
| HOMO level (eV) | −5.36 | −5.50 | −5.80 | −5.69 | −5.40 |

As shown in the above table, as for the materials used in the light-emitting element 4, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

The HOMO level of PCBBiF that is the first hole-transport material is as shallow as −5.36 eV and can easily cause charge separation by interacting with the LUMO level (−4.41 eV) of HAT-CN.

Here, the HOMO level of cgDBCzPA that is the host material is −5.69 eV and its difference from the HOMO level of PCBBiF is 0.33 eV. On the other hand, the HOMO level of 1,6mMemFLPAPrn that is the light-emitting material is −5.40 eV and its difference from the HOMO level of PCBBiF is 0.04 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting element 4, the second hole-transport material whose HOMO level is shallower than the HOMO level of the host material but deeper than the HOMO level of the first hole-transport material is used as the second hole-transport layer 112-2, whereby holes are first injected from the first hole-transport layer 112-1 to the second hole-transport layer 112-2. The HOMO level of αNBB1BP that is the second hole-transport material is −5.50 eV and its difference from the HOMO level of PCBBiF that is the first hole-transport material is as small as 0.14 eV. Accordingly, holes are smoothly injected from the first hole-transport layer 112-1 to the second hole-transport layer 112-2.

If holes are injected from the second hole-transport layer 112-2 to the light-emitting layer 113, a barrier of approximately 0.19 eV exists between the second hole-transport material and the host material. With such a difference, holes are usually injected without problems. Meanwhile, the HOMO level of the light-emitting material included in the light-emitting layer 113 is −5.40 eV, and thus a barrier to hole injection from the second hole-transport material to the light-emitting material does not exist. Therefore, holes are preferentially injected to the light-emitting material than to the host material eventually. As described above, direct injection of holes to the light-emitting material is likely to cause disadvantages such as acceleration of deterioration and reduction in emission efficiency.

Thus, in the light-emitting element 4 that was the light-emitting element of one embodiment of the present invention, the third hole-transport layer 112-3 was provided between the second hole-transport layer 112-2 and the light-emitting layer 113. The HOMO level of PCPPn that is the third hole-transport material included in the third hole-transport layer 112-3 is −5.80 eV, which is deeper than the HOMO level of the host material. Thus, holes are preferentially injected to the host material because there is no barrier to hole injection to the host material and also because of the mixing ratio between the host material and the light-emitting material. In addition, the difference in the HOMO level between the second hole-transport material and the third hole-transport material is 0.30 eV (less than or equal to 0.3 eV with one significant figure), and thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting element had favorable emission efficiency.

Example 4

In this example, a light-emitting element 5 that is one embodiment of the present invention described in Embodiment 1 is described. Structural formulae of organic compounds used in the light-emitting element 5 are shown below.

[Chemical Formulae 6]

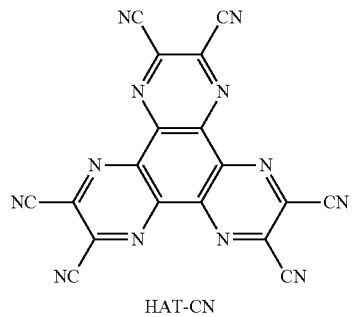

HAT-CN (i)

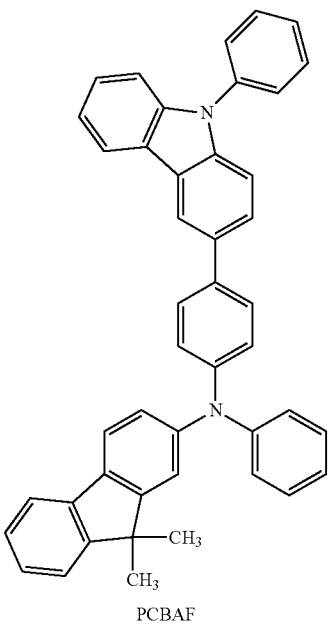

PCBAF (xi)

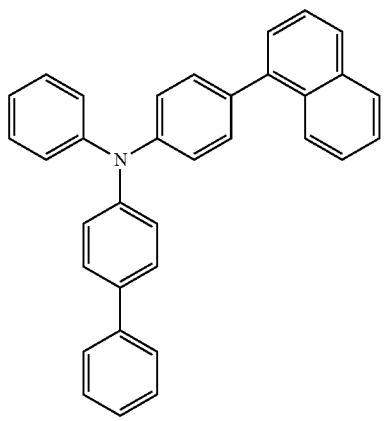

α NBA1 BP (iii)

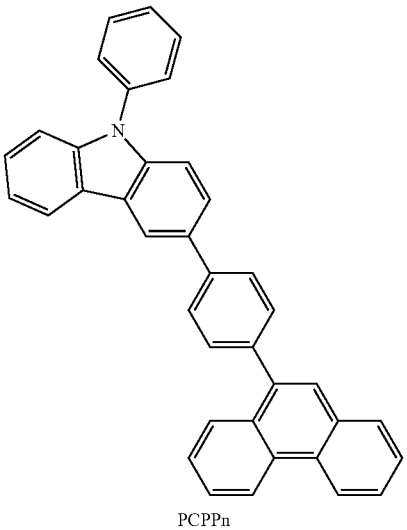

PCPPn (iv)

(v)

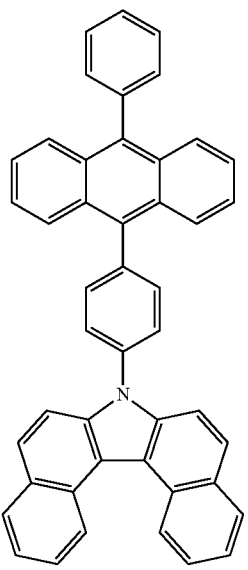

cgDBCzPA (vi)

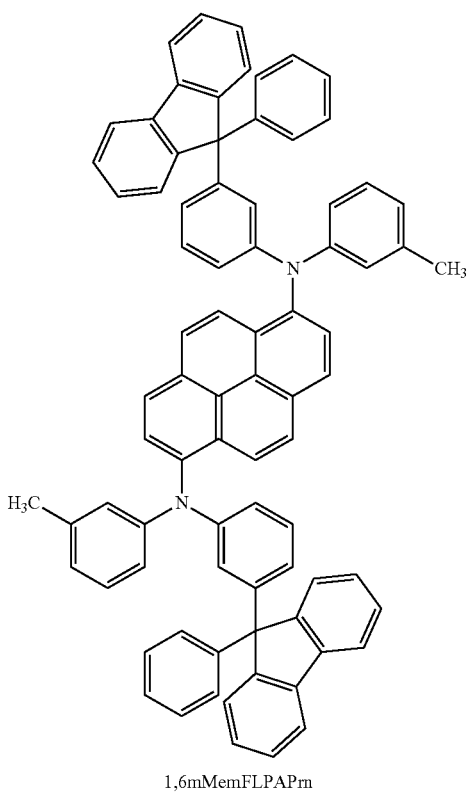

1,6mMemFLPAPrn (vii)

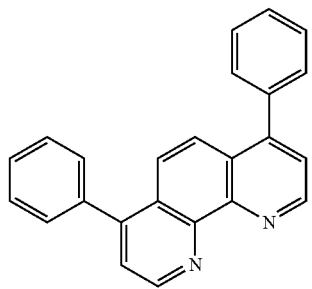

BPhen (Method for Fabricating Light-Emitting Element 5)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, 9,9-dimethyl-N-phenyl-N-[4-(9-phenyl-9H-carbazol-3-yl)phenyl]-fluoren-2-amine (abbreviation: PCBAF) represented by the structural formula (xi) was deposited to a thickness of 20 nm over the hole-injection layer 111 by evaporation, whereby the first hole-transport layer 112-1 was formed; 4-(1-naphthyl)-4'-phenyltriphenylamine (abbreviation: αNBA1BP) represented by the structural formula (iii) was deposited to a thickness of 5 nm over the first hole-transport layer 112-1 by evaporation, whereby the second hole-transport layer 112-2 was formed; and 3-[4-(9-phenanthryl)-phenyl]-9-phenyl-9H-carbazole (abbreviation: PCPPn) represented by the structural formula (iv) was deposited to a thickness of 5 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis (3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the second electrode 102. Through the above-described steps, the light-emitting element 5 of this example was fabricated.

The element structure of the light-emitting element 5 is shown in the following table.

TABLE 11

| Hole-injection layer | Hole-transport layer | | | Light-emitting layer | Electron-transport layer | | Electron-injection layer |
|---|---|---|---|---|---|---|---|
| | 1 | 2 | 3 | | | | |
| 5 nm | 20 nm | 5 nm | 5 nm | 25 nm | 10 nm | 15 nm | 1 nm |
| HAT-CN | PCBAF | αNBA1BP | PCPPn | cgDBCzPA:1,6mMemFLPAPrn (1:0.03) | cgDBCzPA | BPhen | LiF |

The light-emitting element 5 was sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of the light-emitting element were measured. Note that the measurements were performed at room temperature (in an atmosphere kept at 25° C.).

Figure 35:
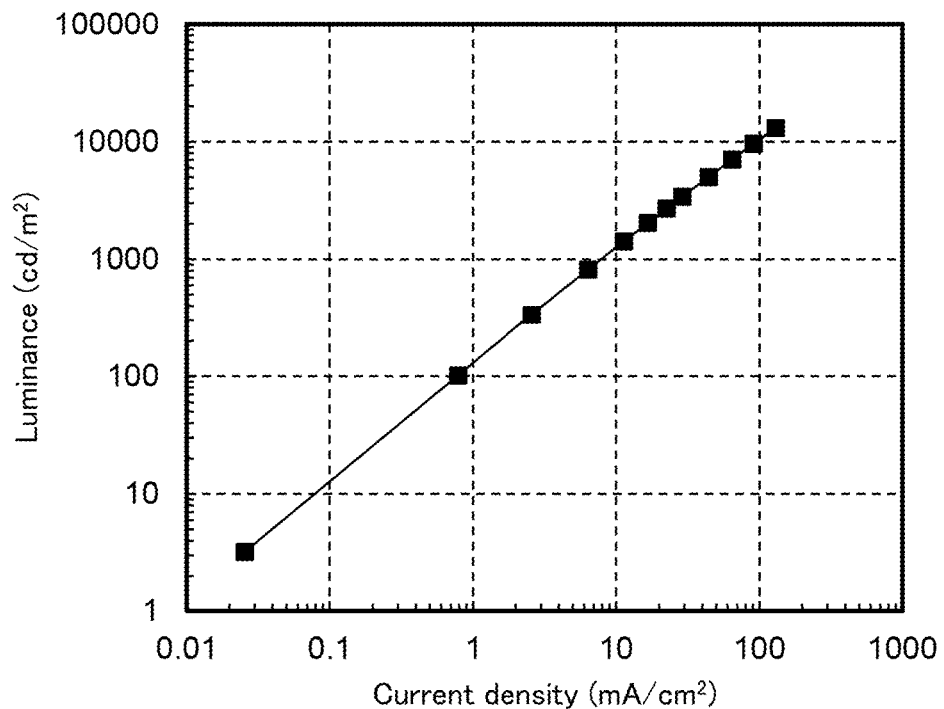
FIG. 35 shows luminance-current density characteristics of a light-emitting element 5.
Figure 36:
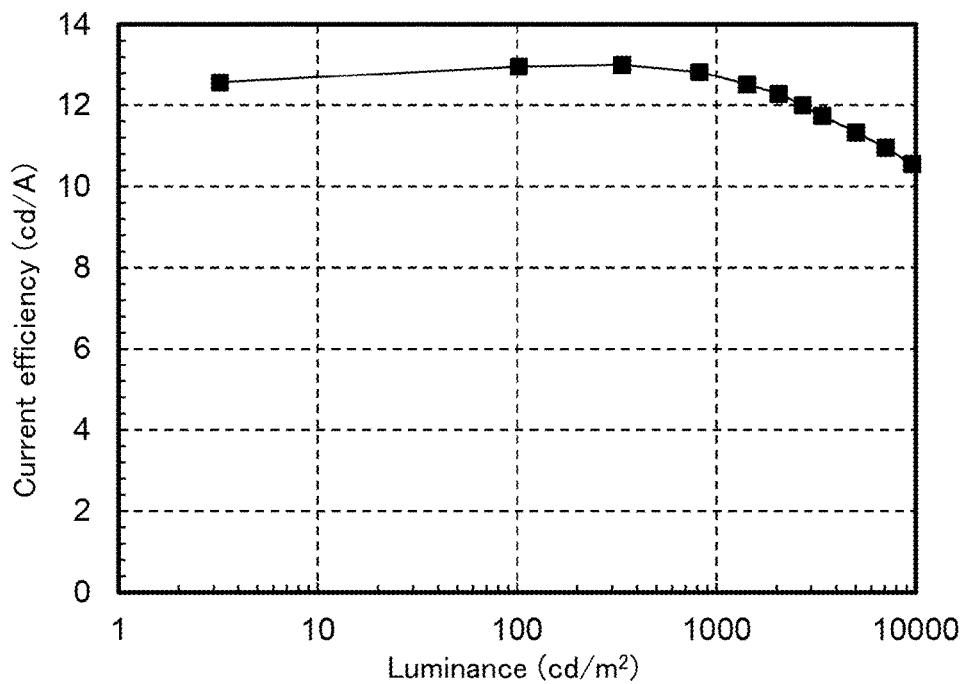
FIG. 36 shows current efficiency-luminance characteristics of the light-emitting element 5.
Figure 37:
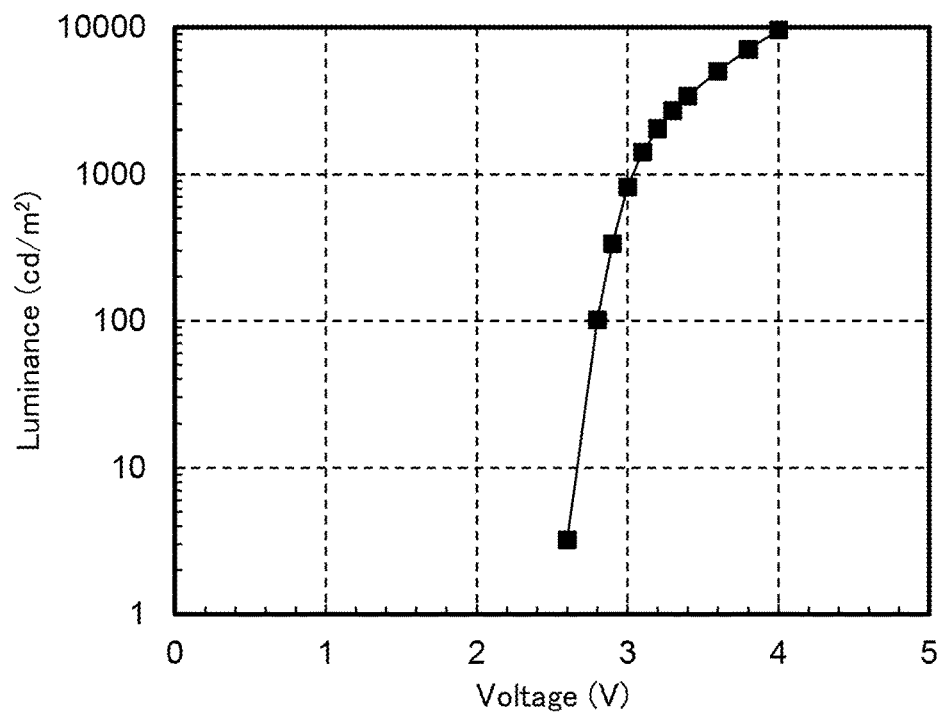
FIG. 37 shows luminance-voltage characteristics of the light-emitting element 5.
Figure 38:
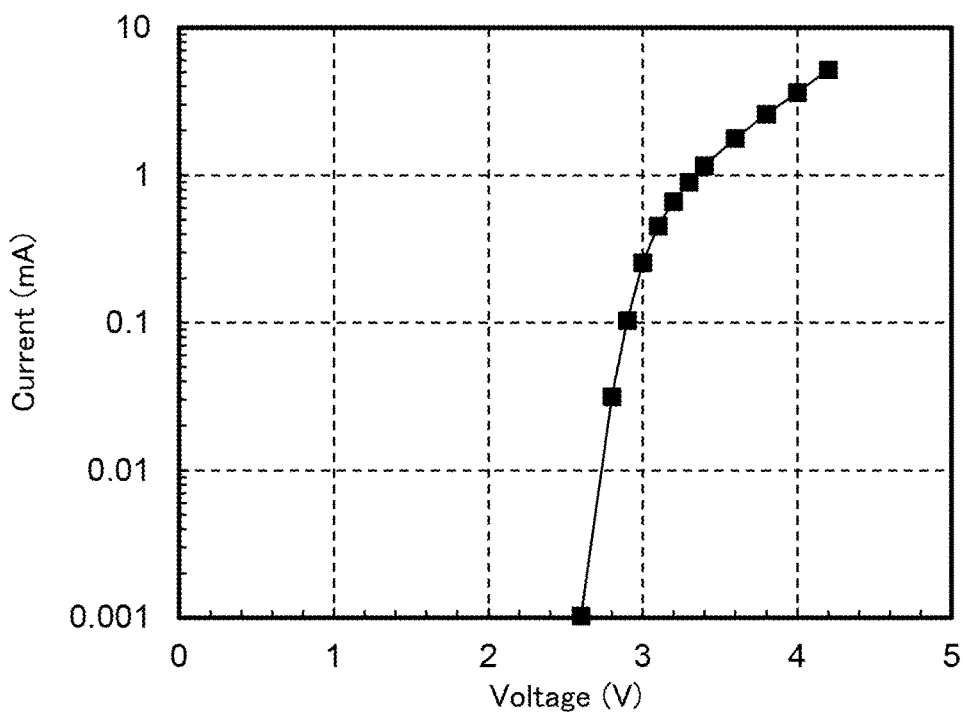
FIG. 38 shows current-voltage characteristics of the light-emitting element 5.
Figure 39:
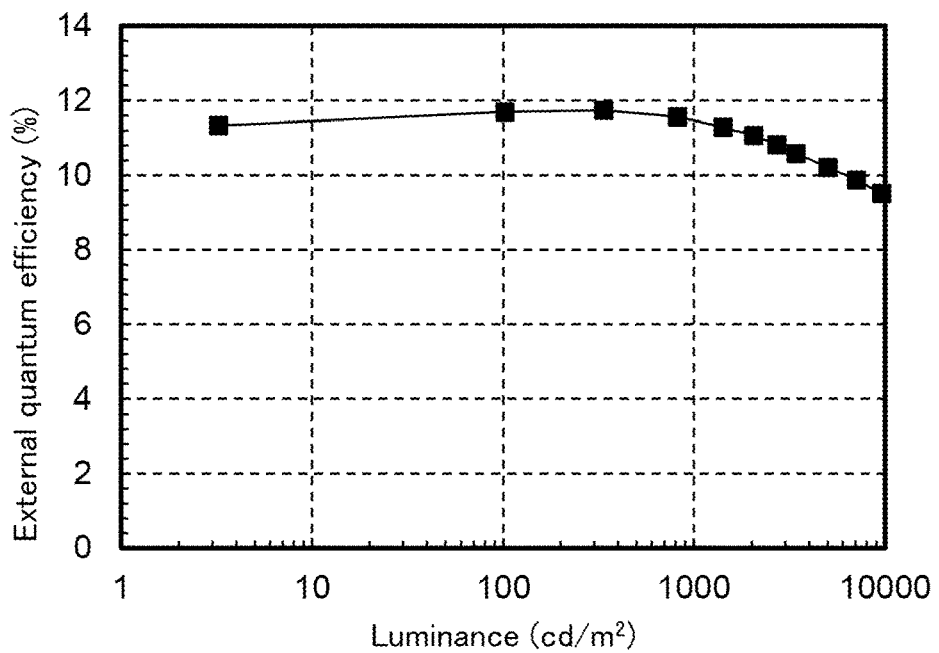
FIG. 39 shows external quantum efficiency-luminance characteristics of the light-emitting element 5.
Figure 40:
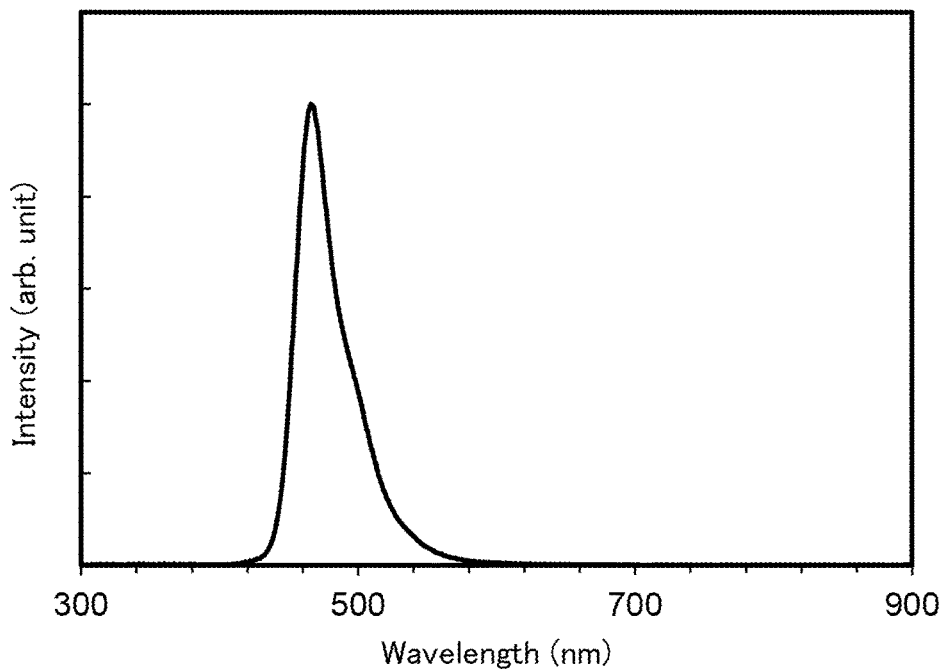
FIG. 40 shows an emission spectrum of the light-emitting element 5.

FIG. 35 shows luminance-current density characteristics of the light-emitting element 5. FIG. 36 shows current efficiency-luminance characteristics thereof. FIG. 37 shows luminance-voltage characteristics thereof. FIG. 38 shows current-voltage characteristics thereof. FIG. 39 shows external quantum efficiency-luminance characteristics thereof. FIG. 40 shows emission spectra thereof. Table 12 shows main characteristics of the light-emitting element at approximately 1000 cd/m².

TABLE 12

| Voltage (V) | Current (mA) | Current density (mA/cm²) | Chromaticity x | Chromaticity y | Current efficiency (cd/A) | External quantum efficiency (%) |
|---|---|---|---|---|---|---|
| 3.0 | 0.26 | 6 | 0.14 | 0.16 | 12.8 | 11.6 |

FIG. 35, FIG. 36, FIG. 37, FIG. 38, FIG. 39, FIG. 40, and Table 12 verify that the light-emitting element 5 was a blue light-emitting element which had favorable characteristics.

Figure 41:
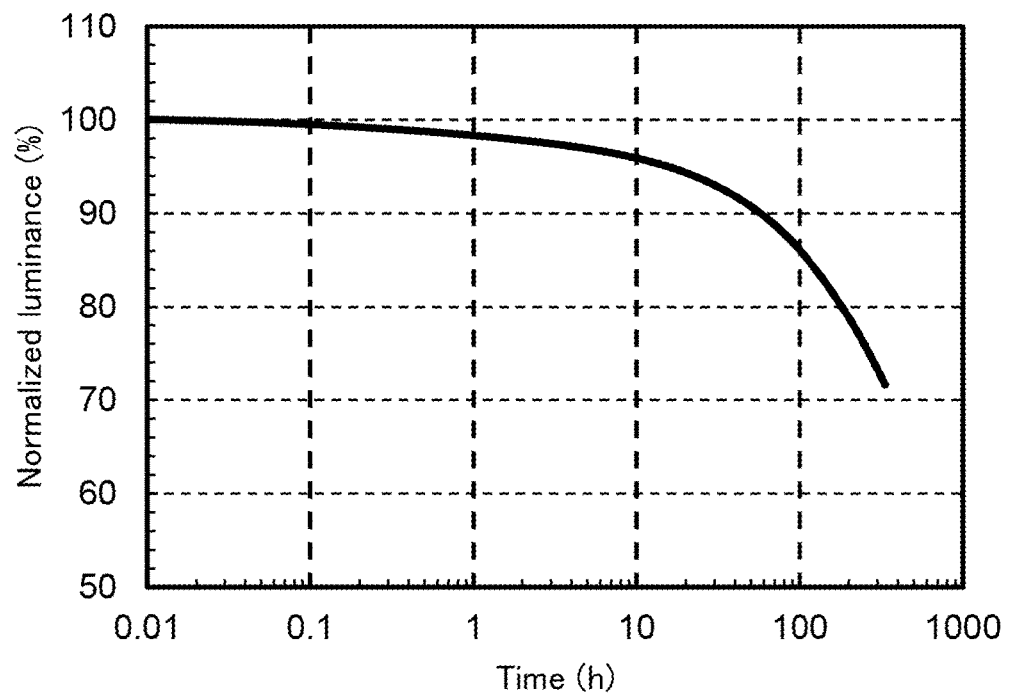
FIG. 41 shows time dependence of normalized luminance of the light-emitting element 5.

FIG. 41 shows a change in luminance of the light-emitting element with driving time under the conditions where the initial luminance was 5000 cd/m² and the current density was constant. As shown in FIG. 41, a decrease in luminance with accumulation of driving time of the light-emitting element 5 of one embodiment of the present invention is small; therefore, the light-emitting element 5 has a long lifetime.

The HOMO levels of the first to third hole-transport materials, the host material, and the light emitting material of the light-emitting element of this example are shown in the following table. Note that the HOMO level and the LUMO level were obtained through a cyclic voltammetry (CV) measurement. A calculation method was the same as that described in Example 1.

TABLE 13

| | First hole-tranport layer | Second hole-transport layer | Third hole-transport layer | Light-emitting layer | |
|---|---|---|---|---|---|
| | | | | Host material | Light-emitting material |
| Material | PCBAF | αNBAlBP | PCPPn | cgDBCzPA | 1,6mMemFLPAPrn |
| HOMO level (eV) | −5.38 | −5.52 | −5.80 | −5.69 | −5.40 |

As shown in the above table, as for the materials used in the light-emitting element 5, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

The HOMO level of PCBAF that is the first hole-transport material is as shallow as −5.38 eV and can easily cause charge separation by interacting with the LUMO level (−4.41 eV) of HAT-CN.

Here, the HOMO level of cgDBCzPA that is the host material is −5.69 eV and its difference from the HOMO level of PCBAF is 0.31 eV. On the other hand, the HOMO level of 1,6mMemFLPAPrn that is the light-emitting material is −5.40 eV and its difference from the HOMO level of PCBAF is 0.02 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting element 5, the second hole-transport material whose HOMO level is shallower than the HOMO level of the host material but deeper than the HOMO level of the first hole-transport material is used as the second hole-transport material 112-2, whereby holes are first injected from the first hole-transport layer 112-1 to the second hole-transport layer 112-2. The HOMO level of αNBA1BP that is the second hole-transport material is −5.52 eV and its difference from the HOMO level of PCBAF that is the first hole-transport material is as small as 0.14 eV. Accordingly, holes are smoothly injected from the first hole-transport layer 112-1 to the second hole-transport layer 112-2.

If holes are injected from the second hole-transport layer 112-2 to the light-emitting layer 113, a barrier of approximately 0.17 eV exists between αNBA1BP that is the second hole-transport material and the host material. With such a difference, holes are usually injected without problems. Meanwhile, the HOMO level of the light-emitting material included in the light-emitting layer 113 is −5.40 eV, and thus a barrier to hole injection from the second hole-transport material to the light-emitting material does not exist. Therefore, holes are preferentially injected to the light-emitting material than to the host material. As described above, direct injection of holes to the light-emitting material is likely to cause disadvantages such as acceleration of deterioration and reduction in emission efficiency.

Thus, in the light-emitting element 5 that was the light-emitting element of one embodiment of the present invention, the third hole-transport layer 112-3 was provided between the second hole-transport layer 112-2 and the light-emitting layer 113. The HOMO level of PCPPn that is the third hole-transport material included in the third hole-transport layer 112-3 is −5.80 eV, which is deeper than the HOMO level of the host material. Thus, holes are preferentially injected to the host material because there is no barrier to hole injection to the host material and also because of the mixing ratio between the host material and the light-emitting material. In addition, the difference in the HOMO level between the second hole-transport material and the third hole-transport material is 0.27 eV (less than or equal to 0.3 e V with one significant figure), and thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting element had favorable emission efficiency.

Example 5

In this example, light-emitting elements 6, 7, and 8 that are the light-emitting elements of embodiments of the present invention described in Embodiment 1 are described. Structural formulae of organic compounds used for the light-emitting elements 6 to 8 are shown below.

[Chemical Formulae 7]

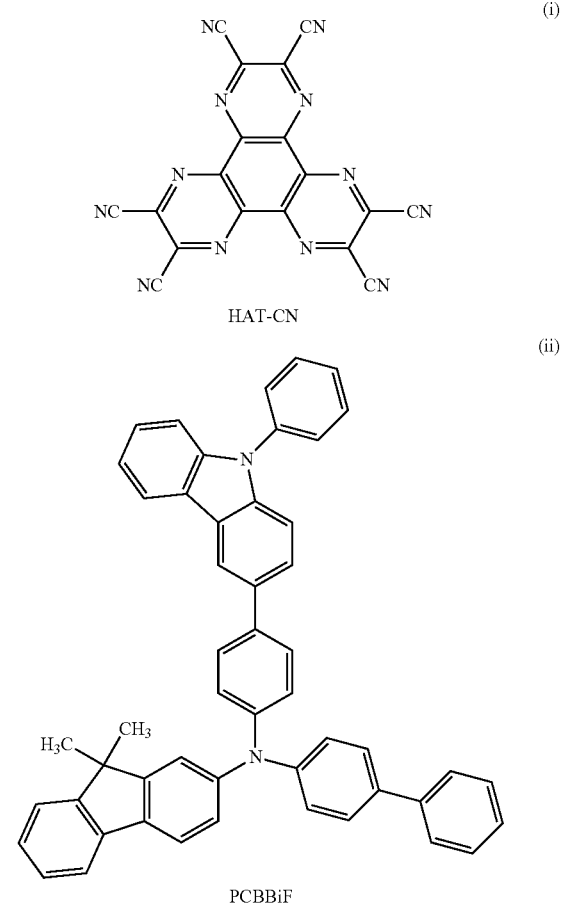

HAT-CN

PCBBiF (xii)
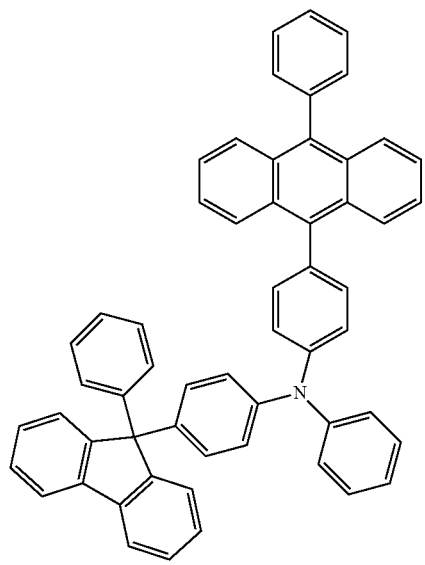
FLPAPA
(xiii)
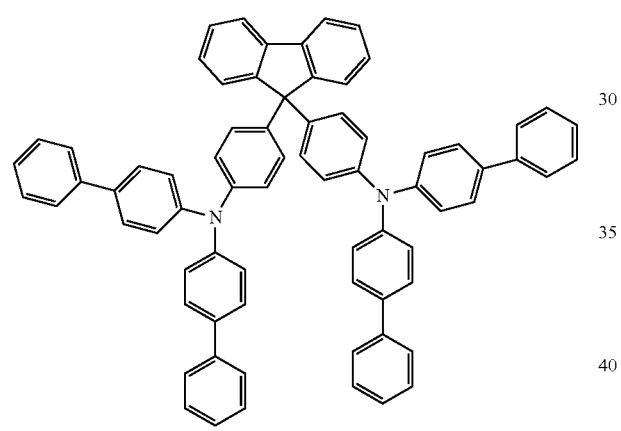
BPAPF
(xiv)
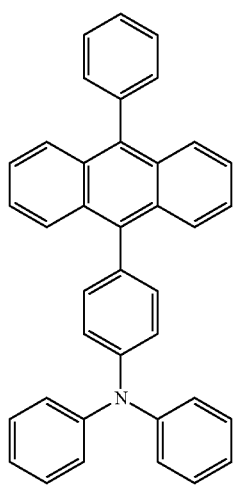
DPhPA
(iv)
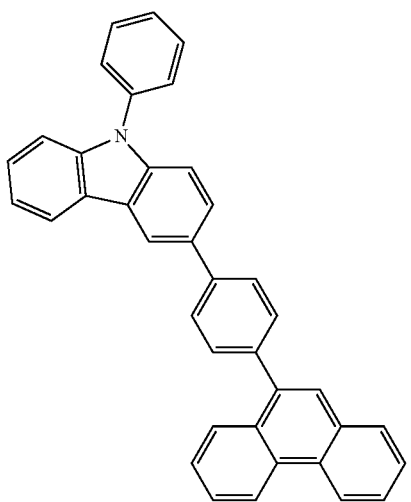
PCPPn
(v)
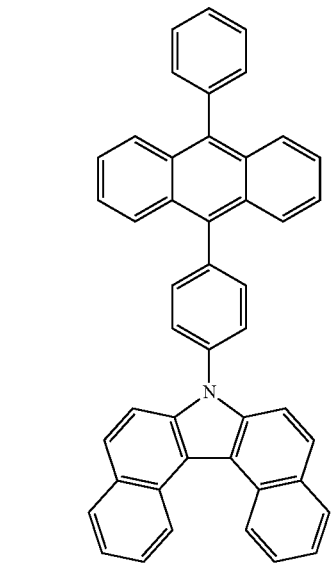
cgDBCzPA (vi)

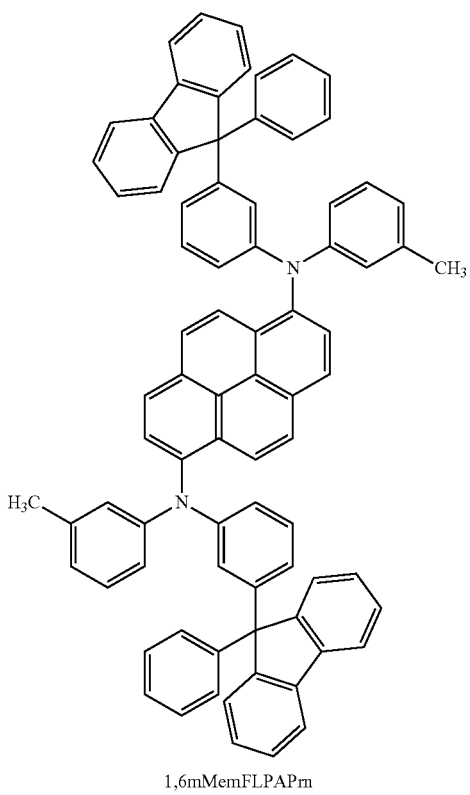

1,6mMemFLPAPrn (vii)

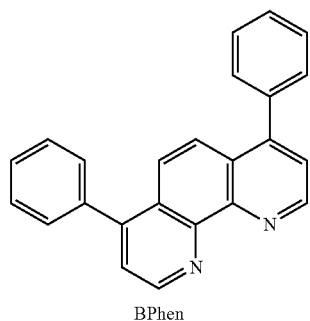

BPhen (Method for Fabricating Light-Emitting Element 6)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, N-(1,1'-biphenyl-4-yl)-9,9-dimethyl-N-[4-(9-phenyl-9H-carbazol-3-yl)phenyl]-9H-fluoren-2-amine (abbreviation: PCBBiF) represented by the structural formula (ii) was deposited to a thickness of 20 nm over the hole-injection layer 111 by evaporation, whereby the first hole-transport layer 112-1 was formed; 4-(10-phenyl-9-anthryl)-4'-(9-phenyl-9H-fluoren-9-yl)triphenylamine (abbreviation: FLPAPA) represented by the structural formula (xii) was deposited to a thickness of 5 nm over the first hole-transport layer 112-1 by evaporation, whereby the second hole-transport layer 112-2 was formed; and 3-[4-(9-phenanthryl)-phenyl]-9-phenyl-9H-carbazole (abbreviation: PCPPn) represented by the structural formula (iv) was deposited to a thickness of 5 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis (3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the second electrode 102. Through the above-described steps, the light-emitting element 4 of this example was fabricated.

(Method for Fabricating Light-Emitting Element 7)

A light-emitting element 7 was fabricated in a manner similar to that of the light-emitting element 6 except that 9,9-bis[4-(N,N-bis-biphenyl-4-yl-amino)phenyl]-9H-fluorene (abbreviation: BPAPF) represented by the structural formula (xiii) was used as the material of the second hole-transport layer 112-2.

(Method for Fabricating Light-Emitting Element 8)

A light-emitting element 8 was fabricated in a manner similar to that of the light-emitting element 6 except that 4-(10-phenyl-9-anthryl)triphenylamine (abbreviation: DPhPA) represented by the structural formula (xiv) was used as the material of the second hole-transport layer 112-2.

The element structures of the light-emitting elements 6, 7, and 8 are shown in the following table.

TABLE 14

| | Hole-injection layer | Hole-transport layer | | | Light-emitting layer | Electron-transport layer | | Electron-injection layer |
|---|---|---|---|---|---|---|---|---|
| | | 1 | 2 | 3 | | | | |
| | 5 nm | 20 nm | 5 nm | 5 nm | 25 nm | 10 nm | 15 nm | 1 nm |
| Light-emitting element 6 | HAT-CN | PCBBiF | FLPAPA | PCPPn | cgDBCzPA:1,6mMemFLPAPrn (1:0.03) | cgDBCzPA | BPhen | LiF |
| Light-emitting element 7 | | | BPAPF | | | | | |
| Light-emitting element 8 | | | DPhPA | | | | | |

The light-emitting elements 6 to 8 were each sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of these light-emitting elements were measured. Note that the measurements were performed at room temperature (in an atmosphere kept at 25° C.).

Figure 42:
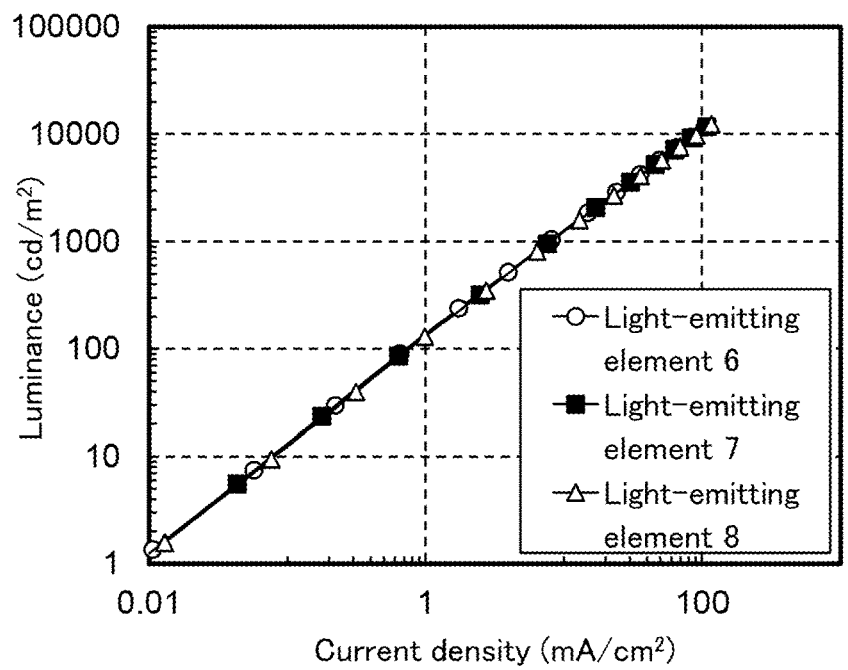
FIG. 42 shows luminance-current density characteristics of light-emitting elements 6 to 8.
Figure 43:
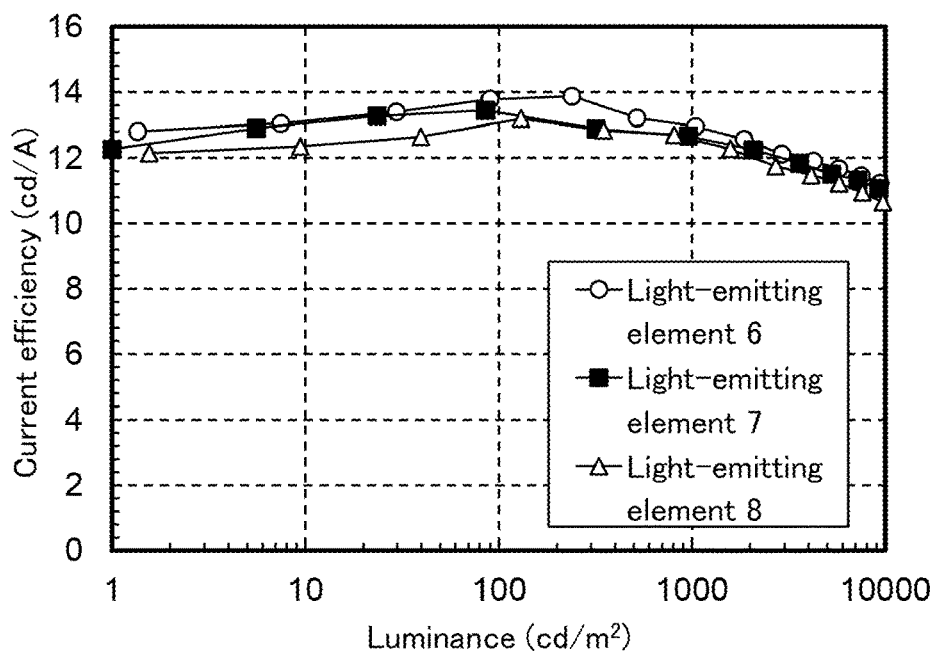
FIG. 43 shows current efficiency-luminance characteristics of the light-emitting elements 6 to 8.
Figure 44:
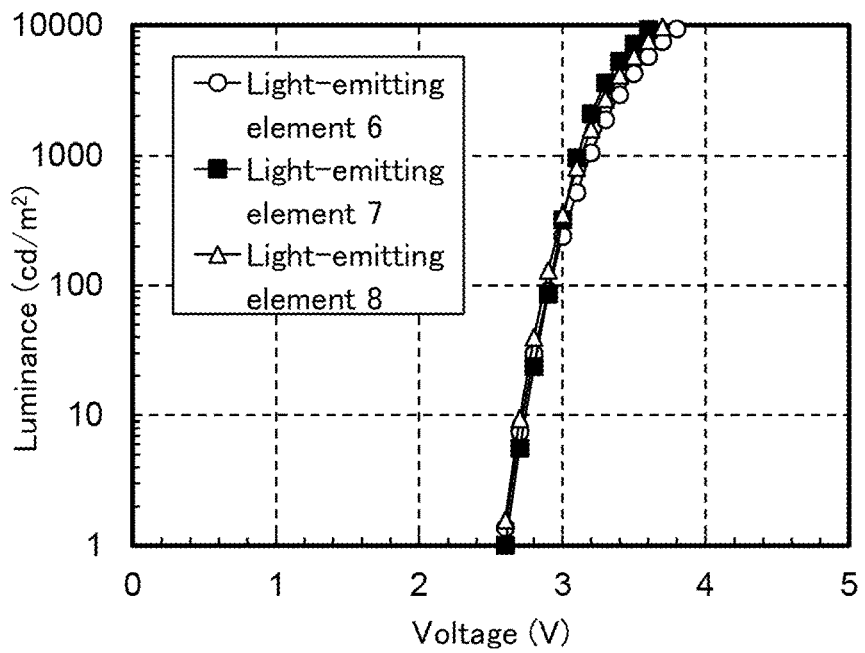
FIG. 44 shows luminance-voltage characteristics of the light-emitting elements 6 to 8.
Figure 45:
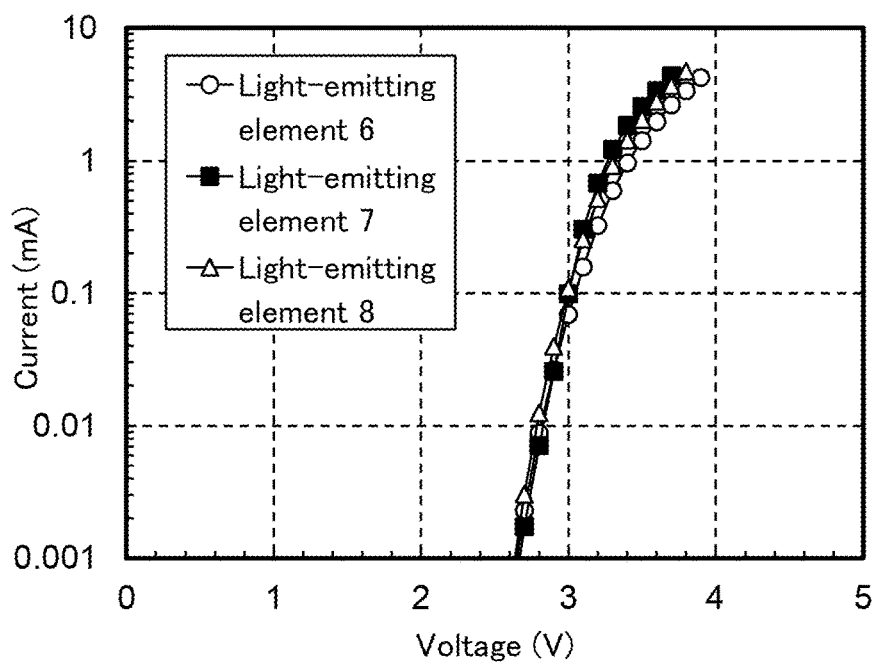
FIG. 45 shows current-voltage characteristics of the light-emitting elements 6 to 8.
Figure 46:
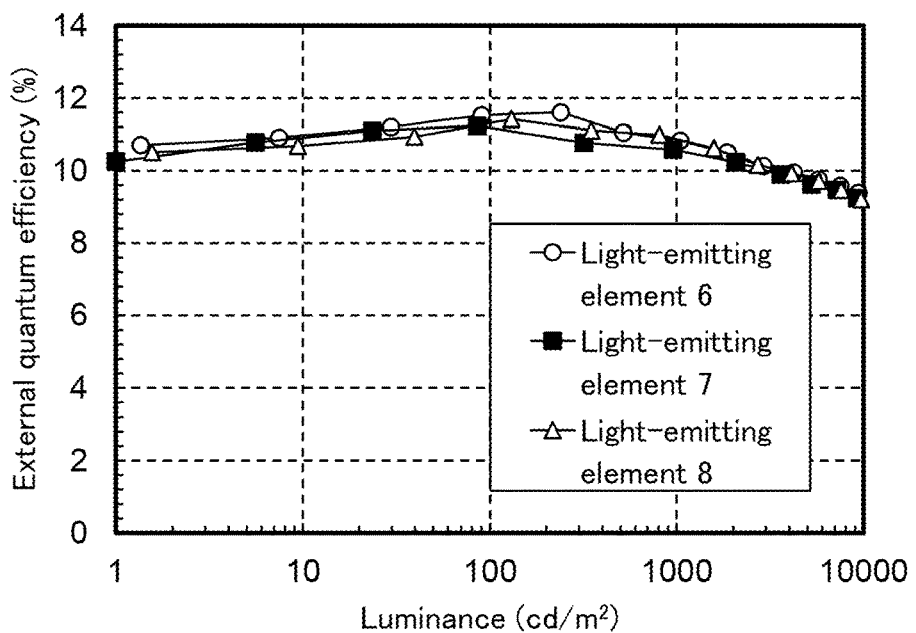
FIG. 46 shows external quantum efficiency-luminance characteristics of the light-emitting elements 6 to 8.
Figure 47:
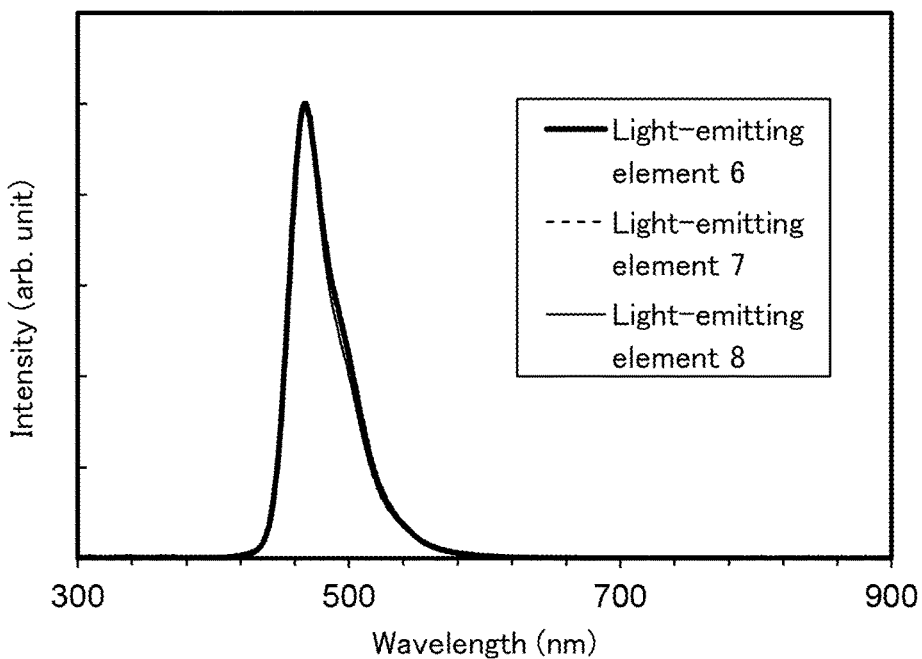
FIG. 47 shows emission spectra of the light-emitting elements 6 to 8.

FIG. 42 shows luminance-current density characteristics of the light-emitting elements 6 to 8. FIG. 43 shows current efficiency-luminance characteristics thereof. FIG. 44 shows luminance-voltage characteristics thereof. FIG. 45 shows current-voltage characteristics thereof. FIG. 46 shows external quantum efficiency-luminance characteristics thereof. FIG. 47 shows emission spectra thereof. Table 15 shows main characteristics of the light-emitting elements at approximately 1000 cd/m$^2$.

TABLE 15

| | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting element 6 | 3.2 | 0.32 | 8 | 0.14 | 0.18 | 13.0 | 10.8 |
| Light-emitting element 7 | 3.1 | 0.30 | 8 | 0.14 | 0.18 | 12.7 | 10.6 |
| Light-emitting element 8 | 3.1 | 0.25 | 6 | 0.14 | 0.17 | 12.7 | 11.0 |

It was found from FIG. 42, FIG. 43, FIG. 44, FIG. 45, FIG. 46, and FIG. 47 and Table 15 that the light-emitting elements 6 to 8 are blue light-emitting elements with favorable characteristics.

Figure 48:
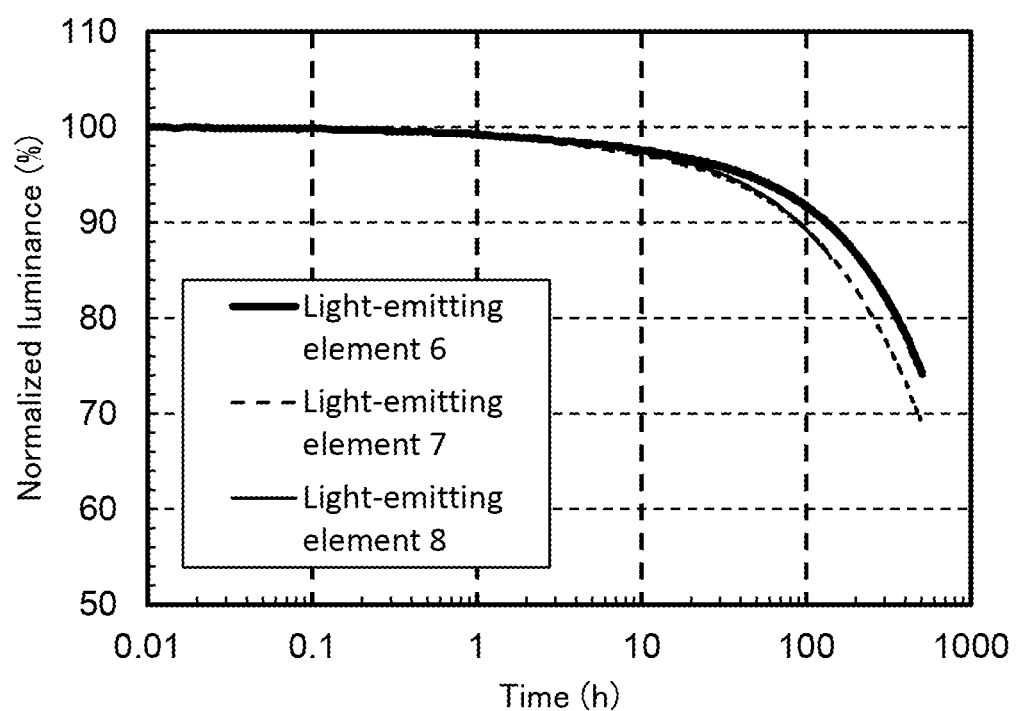
FIG. 48 shows time dependence of normalized luminance of the light-emitting elements 6 to 8.

FIG. 48 shows a change in luminance of the light-emitting elements with driving time under the conditions where the initial luminance was 5000 cd/m$^2$ and the current density was constant. As shown in FIG. 48, a decrease in luminance with accumulation of driving time of the light-emitting elements 6 to 8 of one embodiment of the present invention is small; therefore, the light-emitting elements 6 to 8 have a long lifetime.

In the light-emitting elements of this example, the HOMO levels of the first to third hole-transport materials, the host material, and the light-emitting material are shown in the following tables. Note that the HOMO level and the LUMO level were obtained through a cyclic voltammetry (CV) measurement. The calculation method is the same as that described in Example 1.

TABLE 16

| | Light-emitting element 6 | | | | |
|---|---|---|---|---|---|
| | | | | Light-emitting layer | |
| | First hole-tranport layer | Second hole-transport layer | Third hole-transport layer | Host material | Light-emitting material |
| Material | PCBBiF | FLPAPA | PCPPn | cgDBCzPA | 1,6mMemFLPAPrn |
| HOMO level (eV) | −5.36 | −5.54 | −5.80 | −5.69 | −5.40 |

TABLE 17

| | Light-emitting element 7 | | | | |
|---|---|---|---|---|---|
| | | | | Light-emitting layer | |
| | First hole-tranport layer | Second hole-transport layer | Third hole-transport layer | Host material | Light-emitting material |
| Material | PCBBiF | BPAPF | PCPPn | cgDBCzPA | 1,6mMemFLPAPrn |
| HOMO level (eV) | −5.36 | −5.50 | −5.80 | −5.69 | −5.40 |

TABLE 18

| | Light-emitting element 8 | | | | |
|---|---|---|---|---|---|
| | | | | Light-emitting layer | |
| | First hole-tranport layer | Second hole-transport layer | Third hole-transport layer | Host material | Light-emitting material |
| Material | PCBBiF | DPhPA | PCPPn | cgDBCzPA | 1,6mMemFLPAPrn |
| HOMO level (eV) | −5.36 | −5.53 | −5.80 | −5.69 | −5.40 |

As shown in the above tables, as for the materials used in the light-emitting elements 6 to 8, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

The HOMO level of PCBBiF that is the first hole-transport material is as shallow as −5.36 eV and can easily cause charge separation by interacting with the LUMO level (−4.41 eV) of HAT-CN.

Here, the HOMO level of cgDBCzPA that is the host material is −5.69 eV and its difference from the HOMO level of PCBBiF is 0.33 eV. On the other hand, the HOMO level of 1,6mMemFLPAPrn that is the light-emitting material is −5.40 eV and its difference from the HOMO level of PCBBiF is 0.04 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting elements 6 to 8, the second hole-transport material whose HOMO level is shallower than the HOMO level of the host material but deeper than the HOMO level of the first hole-transport material is used as the second hole-transport layer 112-2, whereby holes are first injected from the first hole-transport layer 112-1 to the second hole-transport layer 112-2. The HOMO levels of FLPAPA (the light-emitting element 6), BPAPF (the light-emitting element 7), and DphPA (the light-emitting element 8), which are the second hole-transport materials, are −5.54 eV, −5.50 eV, and −5.53 eV, respectively, and their differences from the HOMO level of PCBBiF that is the first hole-transport material are as small as 0.18 eV, 0.14 eV, and 0.17 eV, respectively. Accordingly, holes are smoothly injected from the first hole-transport layer 112-1 to the second hole-transport layer 112-2.

Here, when holes are injected from the second hole-transport layer 112-2 to the light-emitting layer 113, barriers existing between the second hole-transport material and the host material in the light-emitting elements 6, 7, and 8 are approximately 0.15 eV, 0.19 eV, and 0.16 eV, respectively. With such a difference, holes are usually injected without problems. Meanwhile, the HOMO level of the light-emitting material included in the light-emitting layer 113 is −5.40 eV, and thus a barrier to hole injection from the second hole-transport material to the light-emitting material does not exist. Therefore, holes are preferentially injected to the light-emitting material than to the host material eventually. As described above, direct injection of holes to the light-emitting material is likely to cause disadvantages such as acceleration of deterioration and reduction in emission efficiency.

Thus, in the light-emitting elements 6 to 8 that were the light-emitting elements of embodiments of the present invention, the third hole-transport layer 112-3 was further provided between the second hole-transport layer 112-2 and the light-emitting layer 113. The HOMO level of PCPPn that is the third hole-transport material included in the third hole-transport layer 112-3 is −5.80 eV, which is deeper than the HOMO level of the host material. Thus, holes are preferentially injected to the host material because there is no barrier to hole injection to the host material and also because of the mixing ratio between the host material and the light-emitting material. In addition, the difference in the HOMO level between the second hole-transport material and the third hole-transport material is 0.26 eV to 0.30 eV (less than or equal to 0.3 eV with one significant figure), and thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting elements 6 to 8 had favorable emission efficiency.

Example 6

In this example, light-emitting elements 9, 10, and 11 that are the light-emitting elements of embodiments of the present invention described in Embodiment 1 are described. Structural formulae of organic compounds used for the light-emitting elements 9 to 11 are shown below.

[Chemical Formulae 8]

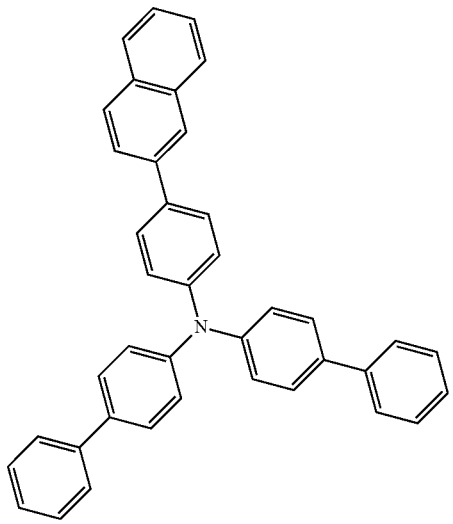

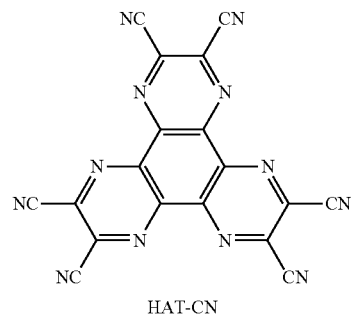

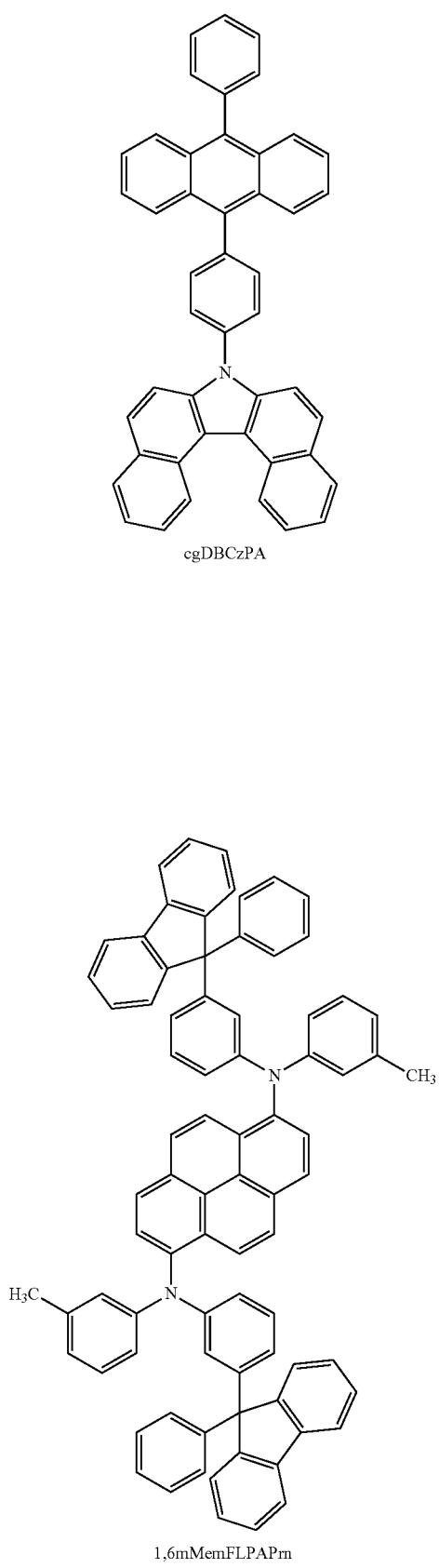

cgDBCzPA 1,6mMemFLPAPrn

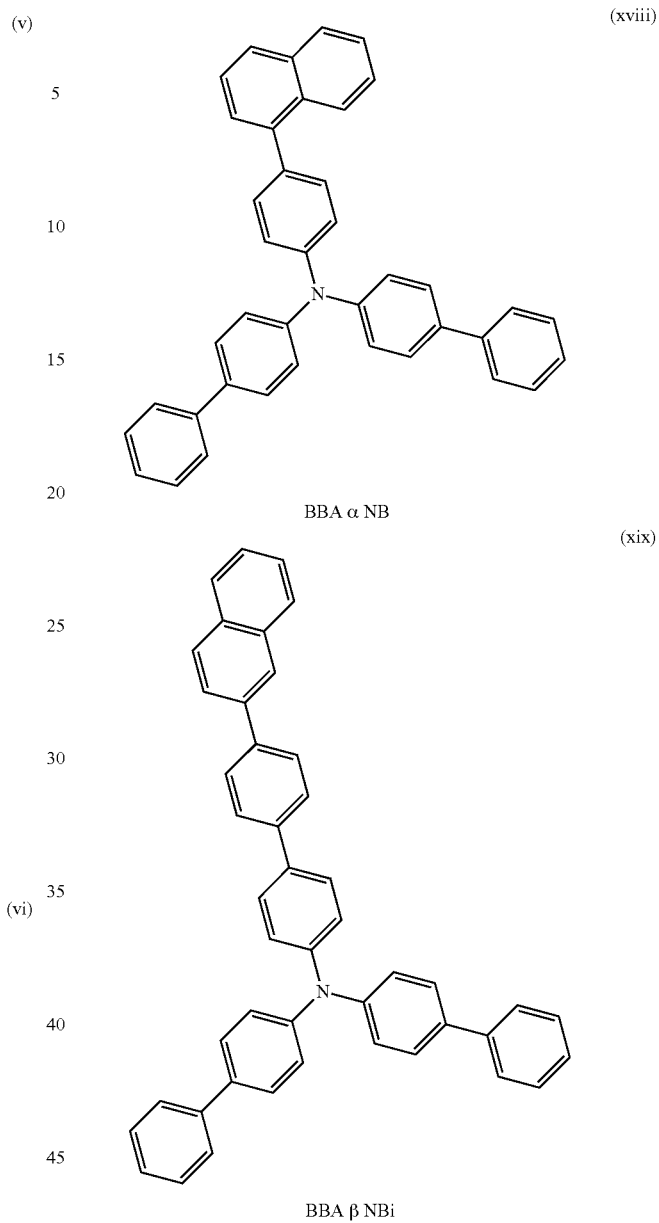

BBA α NB

BBA β NBi (Method for Fabricating Light-Emitting Element 9)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, 4,4'-bis[N-(1-naphthyl)-N-phenylamino]biphenyl (abbreviation: NPB) represented by the structural formula (xv) was deposited to a thickness of 10 nm over the hole-injection layer 111 by evaporation, whereby the first hole-transport layer 112-1 was formed; 4-(2-naphthyl)-4',4''-diphenyltriphenylamine (abbreviation: BBAβNB) represented by the structural formula (xvi) was deposited to a thickness of 10 nm over the first hole-transport layer 112-1 by evaporation, whereby the second hole-transport layer 112-2 was formed; and 3,6-bis[4-(2-naphthyl)phenyl]-9-phenyl-9H-carbazole (abbreviation: βNP2PC) represented by the structural formula (xvii) was deposited to a thickness of 10 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis (3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115. Then, aluminum was deposited to a thickness of 200 nm by evaporation to form the second electrode 102. Through the above-described steps, the light-emitting element 9 of this example was fabricated.

(Method for Fabricating Light-Emitting Element 10)

A light-emitting element 10 was fabricated in a manner similar to that of the light-emitting element 9 except that 4-(1-naphthyl)-4',4''-diphenyltriphenylamine (abbreviation: BBAαNB) represented by the structural formula (xviii) was used as the material of the second hole-transport layer 112-2 instead of BBAβNB of the light-emitting element 9.

(Method for Fabricating Light-Emitting Element 11)

A light-emitting element 11 was fabricated in a manner similar to that of the light-emitting element 9 except that 4-[4-(2-naphthyl)phenyl]-4',4''-diphenyltriphenylamine (abbreviation: BBAβNBi) represented by the structural formula (xix) was used as the material of the second hole-transport layer 112-2 instead of BBAβNB of the light-emitting element 9.

The element structures of the light-emitting elements 9 to 11 are shown in the following table.

TABLE 19

|  | Hole-injection layer | Hole-transport layer 1 | 2 | 3 | Light-emitting layer | Electron-transport layer | | Electron-injection layer |
|---|---|---|---|---|---|---|---|---|
|  | 5 nm | 10 nm | 10 nm | 10 nm | 25 nm | 10 nm | 15 nm | 1 nm |
| Light-emitting element 9 | HAT-CN | NPB | BBAβNB | βNP2PC | cgDBCzPA:1,6mMemFLPAPrn (1:0.03) | cgDBCzPA | BPhen | LiF |
| Light-emitting element 10 |  |  | BBAαNB |  |  |  |  |  |
| Light-emitting element 11 |  |  | BBAβNBi |  |  |  |  |  |

The light-emitting elements 9 to 11 were each sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of these light-emitting elements were measured. Note that the measurements were performed at room temperature (in an atmosphere kept at 25° C.).

Figure 49:
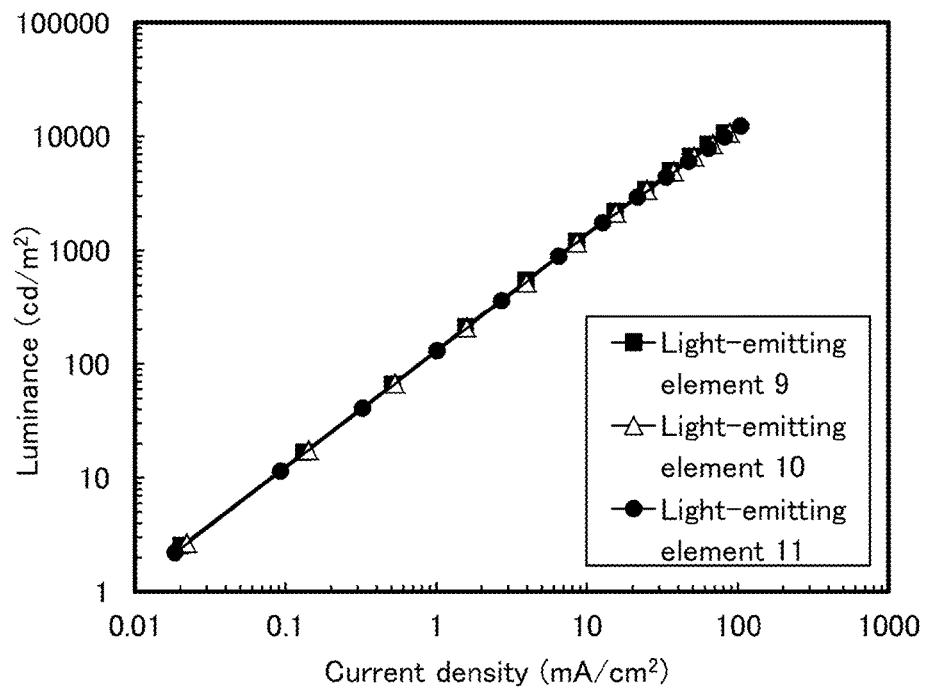
FIG. 49 shows luminance-current density characteristics of light-emitting elements 9 to 11.
Figure 50:
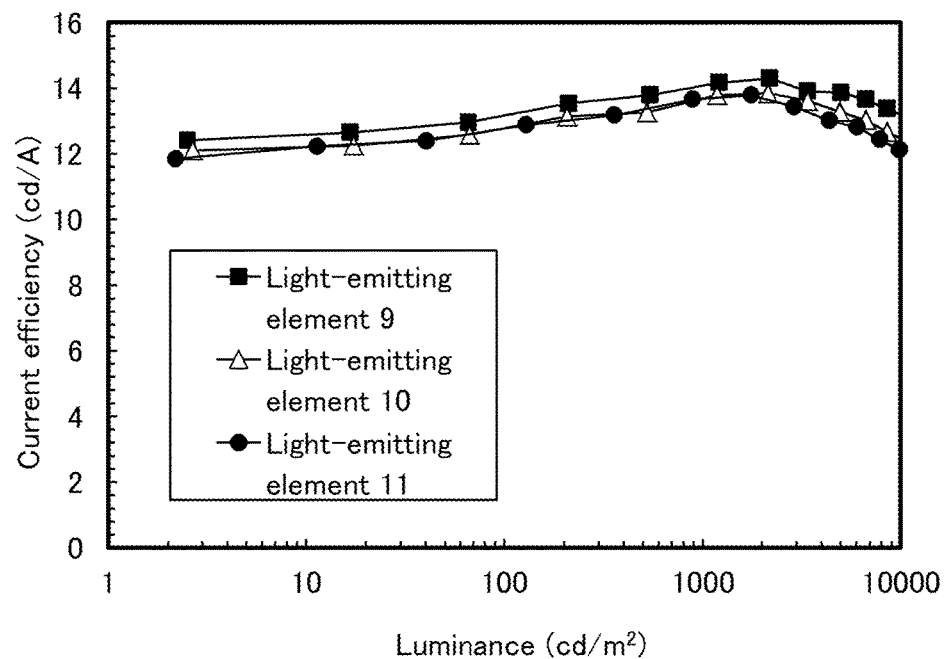
FIG. 50 shows current efficiency-luminance characteristics of the light-emitting elements 9 to 11.
Figure 51:
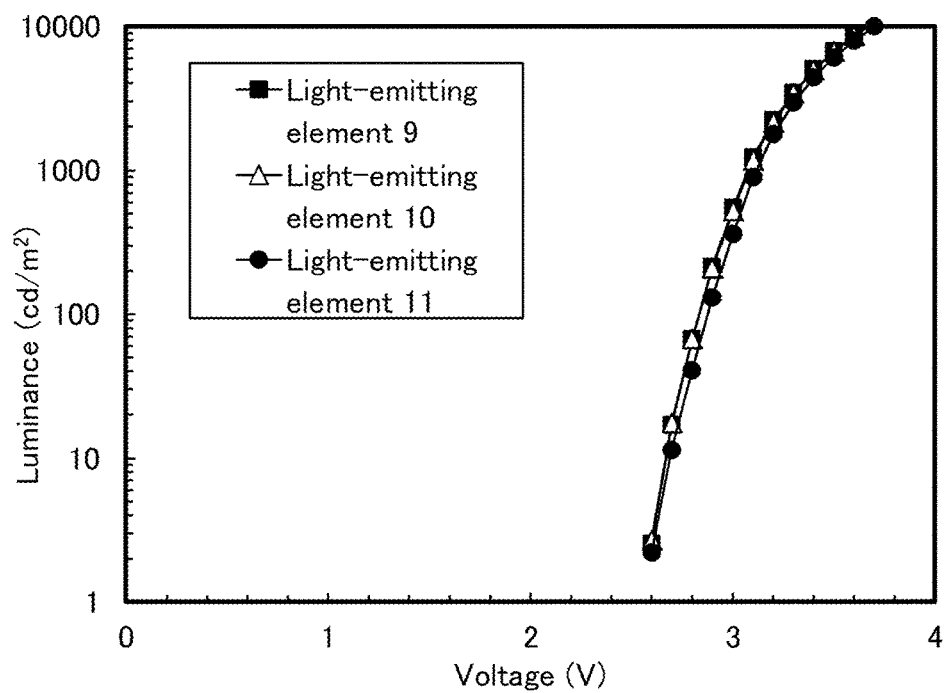
FIG. 51 shows luminance-voltage characteristics of the light-emitting elements 9 to 11.
Figure 52:
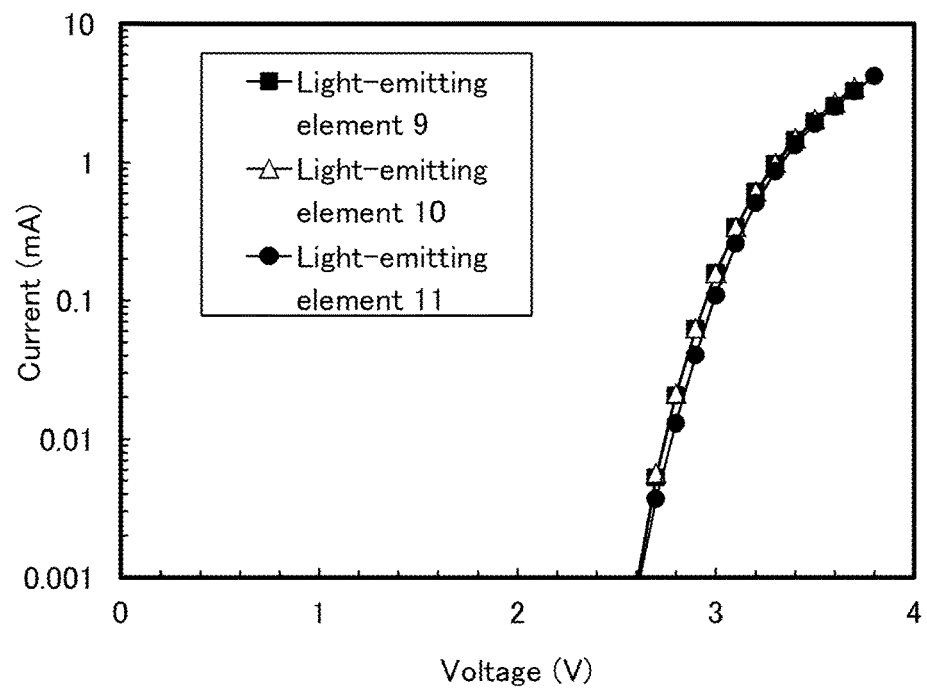
FIG. 52 shows current-voltage characteristics of the light-emitting elements 9 to 11.
Figure 53:
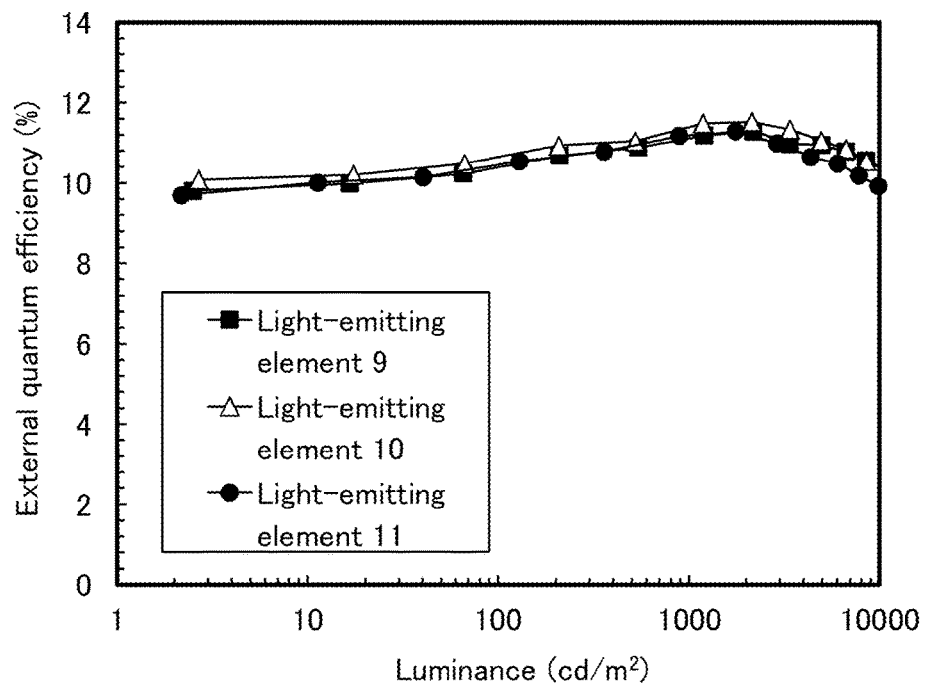
FIG. 53 shows external quantum efficiency-luminance characteristics of the light-emitting elements 9 to 11.
Figure 54:
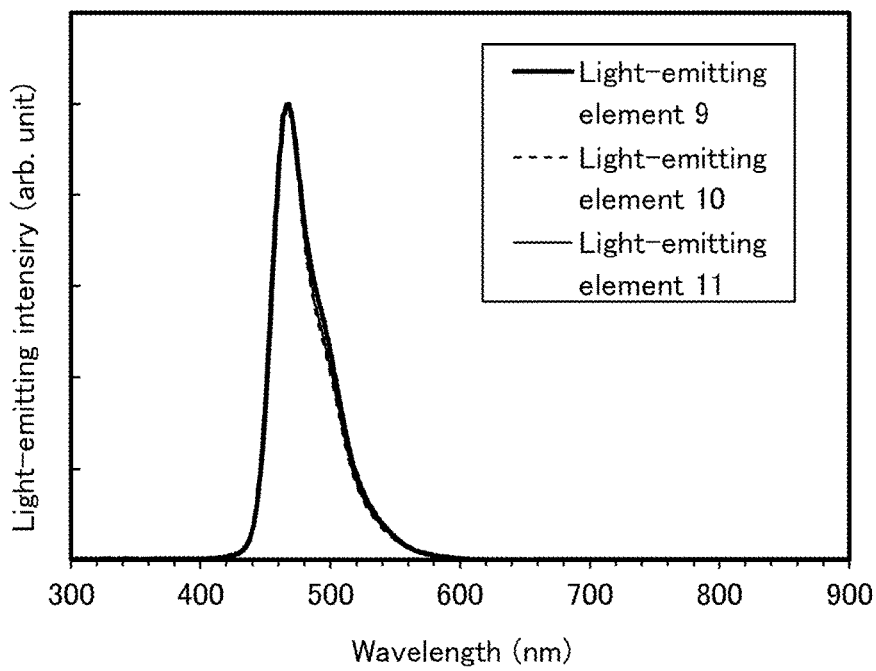
FIG. 54 shows emission spectra of the light-emitting elements 9 to 11.

FIG. 49 shows luminance-current density characteristics of the light-emitting elements 9 to 11. FIG. 50 shows current efficiency-luminance characteristics thereof. FIG. 51 shows luminance-voltage characteristics thereof. FIG. 52 shows current-voltage characteristics thereof. FIG. 53 shows external quantum efficiency-luminance characteristics thereof. FIG. 54 shows emission spectra thereof. Table 20 shows main characteristics of the light-emitting elements at approximately 1000 cd/m$^2$.

TABLE 20

|  | Voltage (V) | Current (mA) | Current density (mA/cm$^2$) | Chromaticity x | Chromaticity y | Current efficiency (cd/A) | External quantum efficiency (%) |
|---|---|---|---|---|---|---|---|
| Light-emitting element 9 | 3.1 | 0.34 | 8.5 | 0.14 | 0.19 | 14.2 | 11.2 |
| Light-emitting element 10 | 3.1 | 0.34 | 8.6 | 0.14 | 0.17 | 13.8 | 11.5 |
| Light-emitting element 11 | 3.1 | 0.26 | 6.5 | 0.14 | 0.17 | 13.7 | 11.2 |

It was found from FIG. 49, FIG. 50, FIG. 51, FIG. 52, FIG. 53, and FIG. 54 and Table 20 that the light-emitting elements 9 to 11 are blue light-emitting elements with favorable characteristics.

Figure 55:
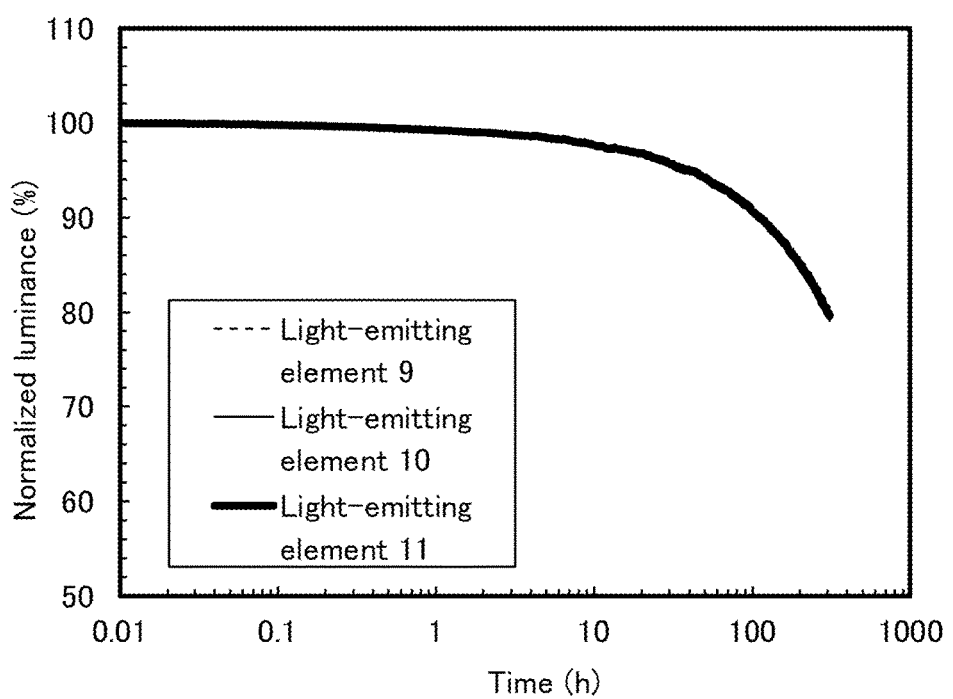
FIG. 55 shows time dependence of normalized luminance of the light-emitting elements 9 to 11.

FIG. 55 shows a change in luminance of the light-emitting elements with driving time under the conditions where the current value was 2 mA and the current density was constant. As shown in FIG. 55, a decrease in luminance with accumulation of driving time of the light-emitting elements 9 to 11 of one embodiment of the present invention is small; therefore, the light-emitting elements 9 to 11 have a long lifetime.

In the light-emitting elements of this example, the HOMO levels of the first to third hole-transport materials, the host material, and the light-emitting material are shown in the following tables. Note that the HOMO level and the LUMO level were obtained through a cyclic voltammetry (CV) measurement. The calculation method is the same as that described in Example 1.

The HOMO level of NPB that is the first hole-transport material is as shallow as −5.38 eV and can easily cause charge separation by interacting with the LUMO level (−4.41 eV) of HAT-CN.

Here, the HOMO level of cgDBCzPA that is the host material is −5.69 eV and its difference from the HOMO level of NPB is 0.31 eV. On the other hand, the HOMO level of 1,6mMemFLPAPrn that is the light-emitting material is −5.40 eV and its difference from the HOMO level of NPB is 0.02 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region

TABLE 21

Light-emitting element 9

| | First hole-transport layer | Second hole-transport layer | Third hole-transport layer | Light-emitting layer | |
| --- | --- | --- | --- | --- | --- |
| | | | | Host material | Light-emitting material |
| Material | NPB | BBAβNB | βNP2PC | cgDBCzPA | 1,6mMemFLPAPrn |
| HOMO level (eV) | −5.38 | −5.47 | −5.79 | −5.69 | −5.40 |

TABLE 22

Light-emitting element 10

| | First hole-transport layer | Second hole-transport layer | Third hole-transport layer | Light-emitting layer | |
| --- | --- | --- | --- | --- | --- |
| | | | | Host material | Light-emitting material |
| Material | NPB | BBAαNB | βNP2PC | cgDBCzPA | 1,6mMemFLPAPrn |
| HOMO level (eV) | −5.38 | −5.49 | −5.79 | −5.69 | −5.40 |

TABLE 23

Light-emitting element 11

| | First hole-transport layer | Second hole-transport layer | Third hole-transport layer | Light-emitting layer | |
| --- | --- | --- | --- | --- | --- |
| | | | | Host material | Light-emitting material |
| Material | NPB | BBAβNBi | βNP2PC | cgDBCzPA | 1,6mMemFLPAPrn |
| HOMO level (eV) | −5.38 | −5.47 | −5.79 | −5.69 | −5.40 |

As shown in the above tables, as for the materials used in the light-emitting elements 9 to 11, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting elements 9 to 11, the second hole-transport material whose HOMO level is shallower than the HOMO level of the host material but deeper than the HOMO level of the first hole-transport material is used as the second hole-transport layer 112-2, whereby holes are first injected from the first hole-transport layer 112-1 to the second hole-transport layer 112-2. The HOMO levels of BBAβNB (the light-emitting element 9), BBAαNB (the light-emitting element 10), and BBAβNBi (the light-emitting element 11), which are the second hole-transport materials, are −5.47 eV, −5.49 eV, and −5.47 eV, respectively, and their differences from the HOMO level of NPB that is the first hole-transport material are as small as 0.09 eV, 0.11 eV, and 0.09 eV, respectively. Accordingly, holes are smoothly injected from the first hole-transport layer 112-1 to the second hole-transport layer 112-2.

Here, when holes are injected from the second hole-transport layer 112-2 to the light-emitting layer 113, barriers existing between the second hole-transport material and the host material in the light-emitting elements 9, 10, and 11 are approximately 0.22 eV, 0.20 eV, and 0.22 eV, respectively. With such a difference, holes are usually injected without problems. Meanwhile, the HOMO level of the light-emitting material included in the light-emitting layer 113 is −5.40 eV, and thus a barrier to hole injection from the second hole-transport material to the light-emitting material does not exist. Therefore, holes are preferentially injected to the light-emitting material than to the host material eventually. As described above, direct injection of holes to the light-emitting material is likely to cause disadvantages such as acceleration of deterioration and reduction in emission efficiency.

Thus, in the light-emitting elements 9 to 11 that were the light-emitting elements of embodiments of the present invention, the third hole-transport layer 112-3 was further provided between the second hole-transport layer 112-2 and the light-emitting layer 113. The HOMO level of βNP2PC that is the third hole-transport material included in the third hole-transport layer 112-3 is −5.79 eV, which is deeper than the HOMO level of the host material. Therefore, holes are injected from the third hole-transport material to the light-emitting layer 113 without problems. In addition, holes are preferentially injected to the host material because there is no barrier to hole injection to the host material and also because of the mixing ratio between the host material and the light-emitting material. In addition, the difference in the HOMO level between the second hole-transport material and the third hole-transport layer is in the range of 0.30 eV to 0.32 eV (less than or equal to 0.3 eV with one significant figure), and thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting elements 9 to 11 had favorable emission efficiency.

Example 7

In this example, a light-emitting element 12 that is the light-emitting element of an embodiment of the present invention described in Embodiment 1 is described. Structural formulae of organic compounds used for the light-emitting element 12 are shown below.

[Chemical Formulae 9]

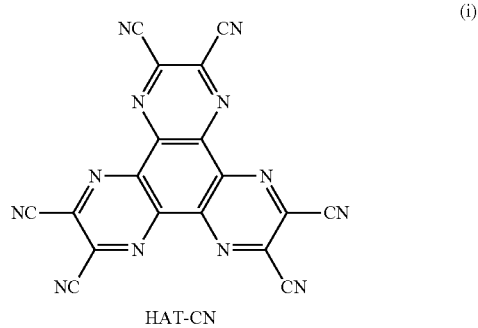

HAT-CN (i)

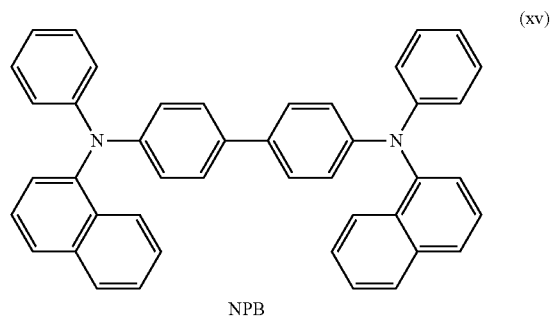

NPB (xv)

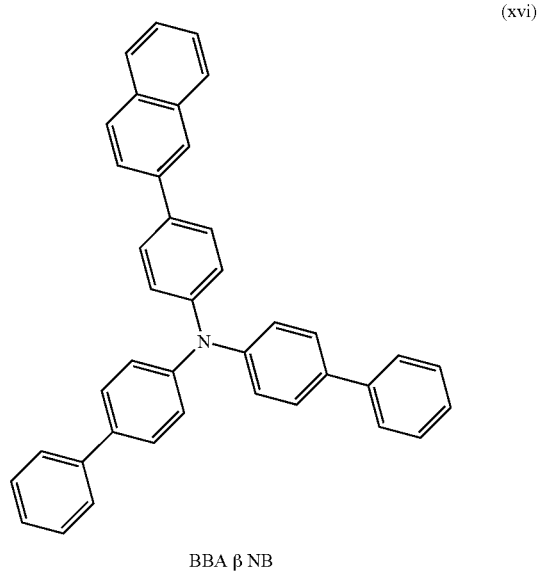

BBA β NB (xvi)

-continued

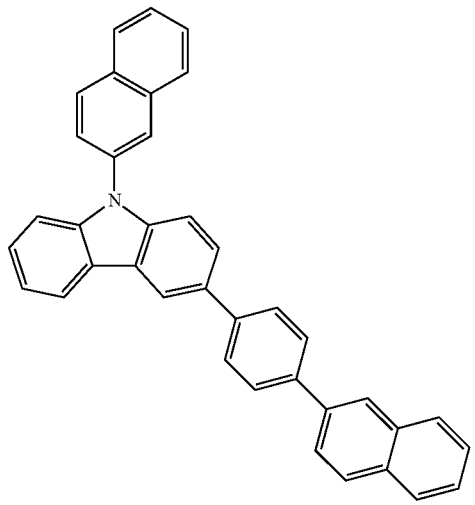

βNPβNC

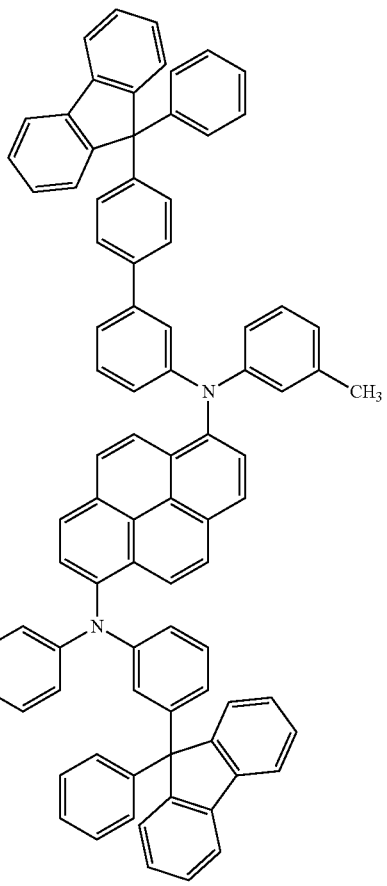

1,6mMemFLPAPrn

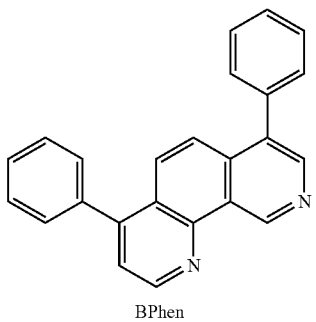

BPhen

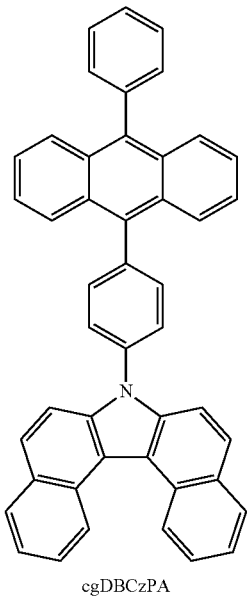

cgDBCzPA (Method for Fabricating Light-Emitting Element 12)

First, indium tin oxide containing silicon oxide (ITSO) was deposited over a glass substrate by a sputtering method to form the first electrode 101. Note that the film thickness of the first electrode 101 was 110 nm and that the area of the electrode was 2 mm×2 mm.

Next, in pretreatment for forming the light-emitting element over the substrate, a surface of the substrate was washed with water and baked at 200° C. for 1 hour, and then UV ozone treatment was performed for 370 seconds.

After that, the substrate was transferred into a vacuum evaporation apparatus whose pressure was reduced to about $10^{-4}$ Pa, vacuum baking was performed at 170° C. for 30 minutes in a heating chamber of the vacuum evaporation apparatus, and then the substrate was cooled down for approximately 30 minutes.

Next, the substrate provided with the first electrode 101 was fixed to a substrate holder provided in the vacuum evaporation device such that the side on which the first electrode 101 was formed faced downward. Then, 2,3,6,7,10,11-hexacyano-1,4,5,8,9,12-hexaazatriphenylene (abbreviation: HAT-CN) represented by the structural formula (i) was deposited to a thickness of 5 nm over the first electrode 101 by an evaporation method using resistance heating, whereby the hole-injection layer 111 was formed.

Next, 4,4'-bis[N-(1-naphthyl)-N-phenylamino]biphenyl (abbreviation: NPB) represented by the structural formula (xv) was deposited to a thickness of 10 nm over the hole-injection layer 111 by evaporation, whereby the first hole-transport layer 112-1 was formed; 4-(2-naphthyl)-4',4''-diphenyltriphenylamine (abbreviation: BBAβNB) represented by the structural formula (xvi) was deposited to a thickness of 10 nm over the first hole-transport layer 112-1 by evaporation, whereby the second hole-transport layer 112-2 was formed; and 3-[4-(2-naphthyl)phenyl]-9-(2-naphthyl)-9H-carbazole (abbreviation: βNPβNC) represented by the structural formula (xx) was deposited to a thickness of 10 nm over the second hole-transport layer 112-2 by evaporation, whereby the third hole-transport layer 112-3 was formed.

Subsequently, the light-emitting layer 113 was formed by co-evaporation of 7-[4-(10-phenyl-9-anthryl)phenyl]-7H-dibenzo[c,g]carbazole (abbreviation: cgDBCzPA) represented by the structural formula (v) and N,N'-bis (3-methylphenyl)-N,N'-bis[3-(9-phenyl-9H-fluoren-9-yl)phenyl]-pyrene-1,6-diamine (abbreviation: 1,6mMemFLPAPrn) represented by the structural formula (vi) in a weight ratio of 1:0.03 (=cgDBCzPA:1,6mMemFLPAPrn) to a thickness of 25 nm.

Then, over the light-emitting layer 113, cgDBCzPA was deposited to a thickness of 10 nm by evaporation, and bathophenanthroline (abbreviation: BPhen) represented by the structural formula (vii) was deposited to a thickness of 15 nm by evaporation to form the electron-transport layer 114.

After the formation of the electron-transport layer 114, lithium fluoride (LiF) was deposited to a thickness of 1 nm by evaporation to form the electron-injection layer 115.

Then, aluminum was deposited to a thickness of 200 nm by evaporation to form the second electrode 102. Through the above-described steps, the light-emitting element 12 of this example was fabricated.

The element structure of the light-emitting element 12 is shown in the following table.

TABLE 24

| Hole-injection layer | Hole-transport layer | | | Light-emitting layer | Electron-transport layer | | Electron-injection layer |
|---|---|---|---|---|---|---|---|
| | 1 | 2 | 3 | | | | |
| 5 nm | 10 nm | 10 nm | 10 nm | 25 nm | 10 nm | 15 nm | 1 nm |
| HAT-CN | NPB | BBAβNB | βNPβNC | cgDBCzPA:1,6mMemFLPAPrn (1:0.03) | cgDBCzPA | BPhen | LiF |

The light-emitting element 12 was sealed using a glass substrate in a glove box containing a nitrogen atmosphere so as not to be exposed to the air (specifically, a sealing material was applied to surround the elements and UV treatment and heat treatment at 80° C. for 1 hour were performed at the time of sealing). Then, initial characteristics and reliability of the light-emitting element were measured. Note that the measurements were performed at room temperature (in an atmosphere kept at 25° C.).

Figure 56:
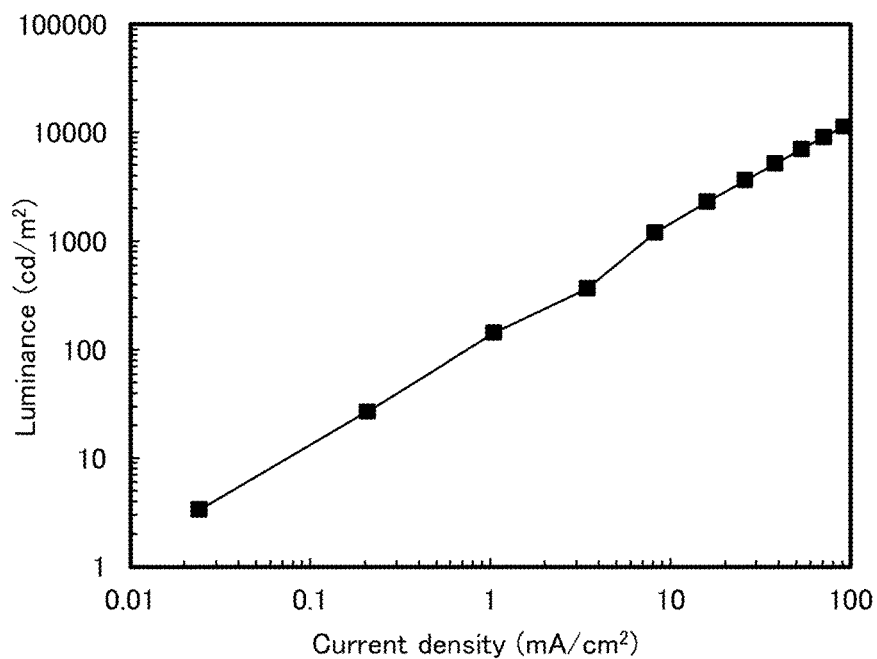
FIG. 56 shows luminance-current density characteristics of a light-emitting element 12.
Figure 57:
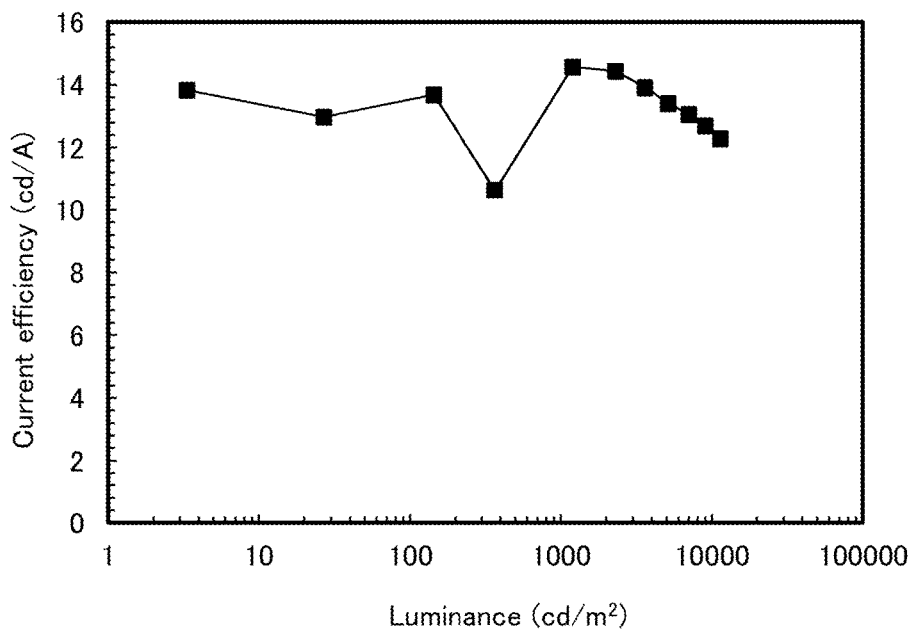
FIG. 57 shows current efficiency-luminance characteristics of the light-emitting element 12.
Figure 58:
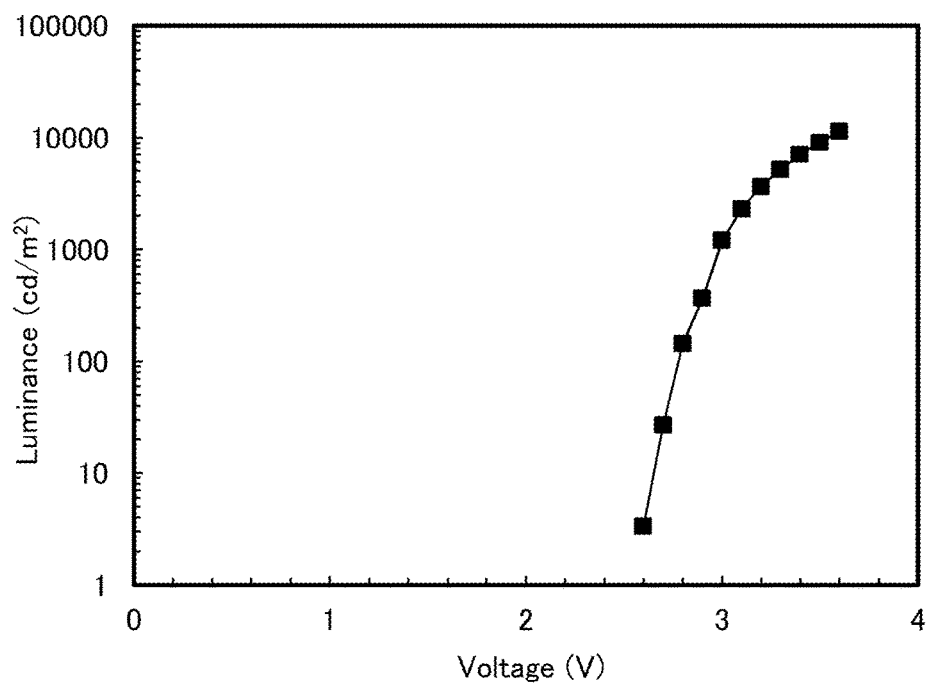
FIG. 58 shows luminance-voltage characteristics of the light-emitting element 12.
Figure 59:
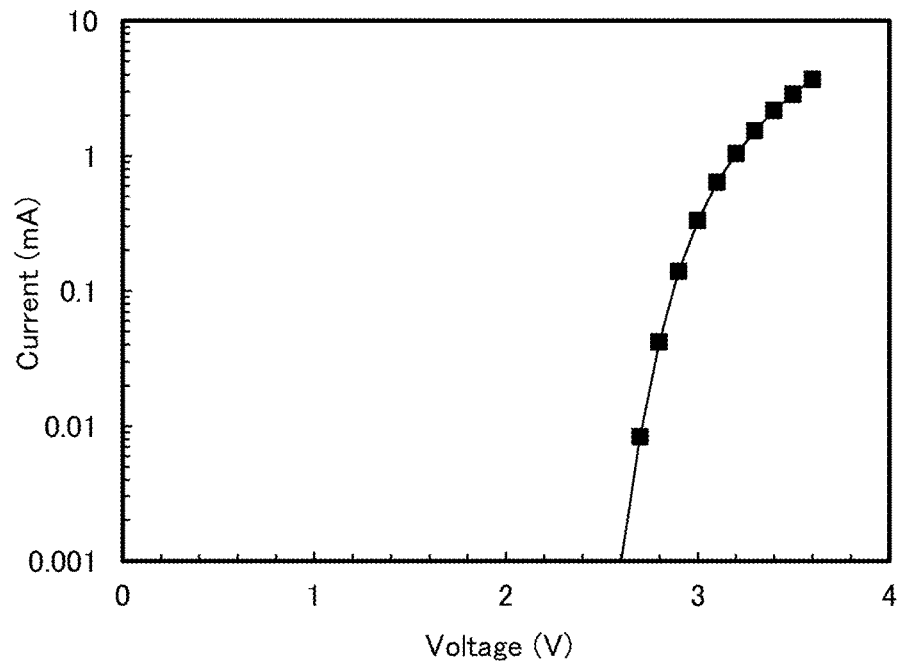
FIG. 59 shows current-voltage characteristics of the light-emitting element 12.
Figure 60:
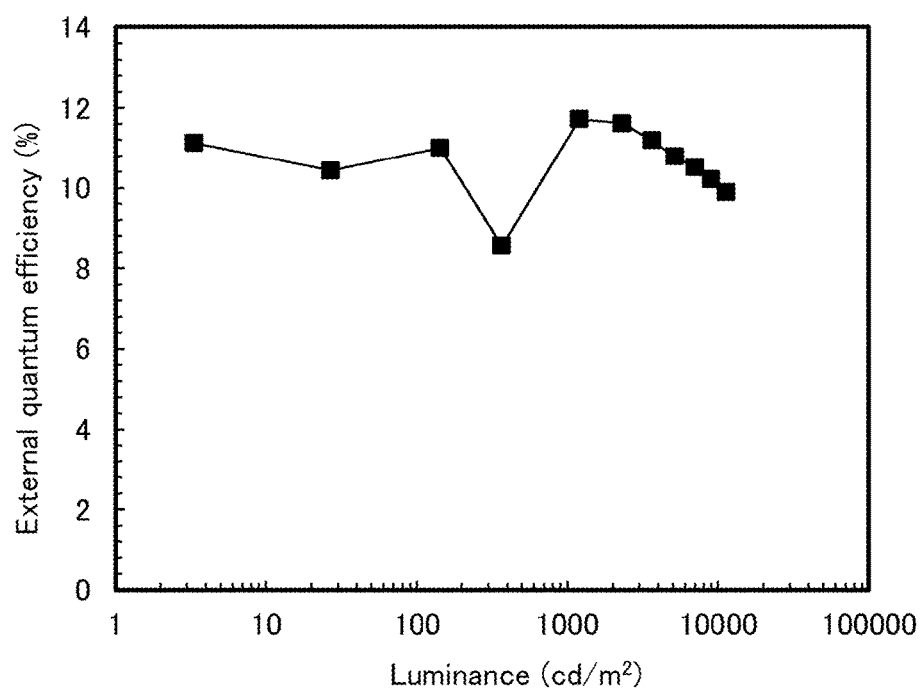
FIG. 60 shows external quantum efficiency-luminance characteristics of the light-emitting element 12.
Figure 61:
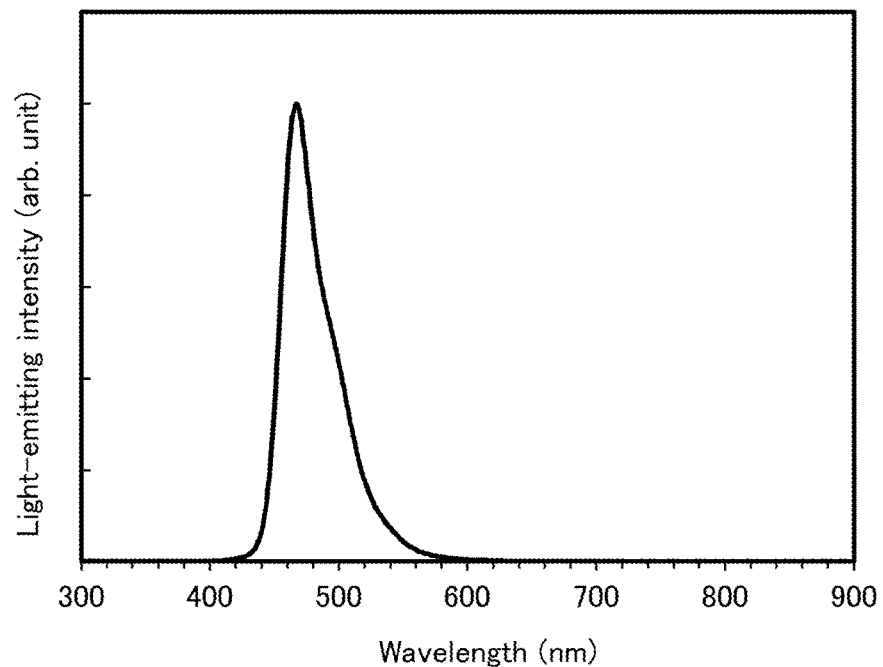
FIG. 61 shows an emission spectrum of the light-emitting element 12.

FIG. 56 shows luminance-current density characteristics of the light-emitting element 12. FIG. 57 shows current efficiency-luminance characteristics thereof. FIG. 58 shows luminance-voltage characteristics thereof. FIG. 59 shows current-voltage characteristics thereof. FIG. 60 shows external quantum efficiency-luminance characteristics thereof. FIG. 61 shows emission spectra thereof. Table 25 shows main characteristics of the light-emitting element at approximately 1000 cd/m².

TABLE 25

| Voltage (V) | Current (mA) | Current density (mA/cm²) | Chromaticity x | Chromaticity y | Current efficiency (cd/A) | External quantum efficiency (%) |
|---|---|---|---|---|---|---|
| 3.0 | 0.33 | 8.2 | 0.14 | 0.18 | 14.6 | 11.7 |

It was found from FIG. 56, FIG. 57, FIG. 58, FIG. 59, FIG. 60, and FIG. 61 and Table that the light-emitting element 12 is a blue light-emitting element with favorable characteristics.

Figure 62:
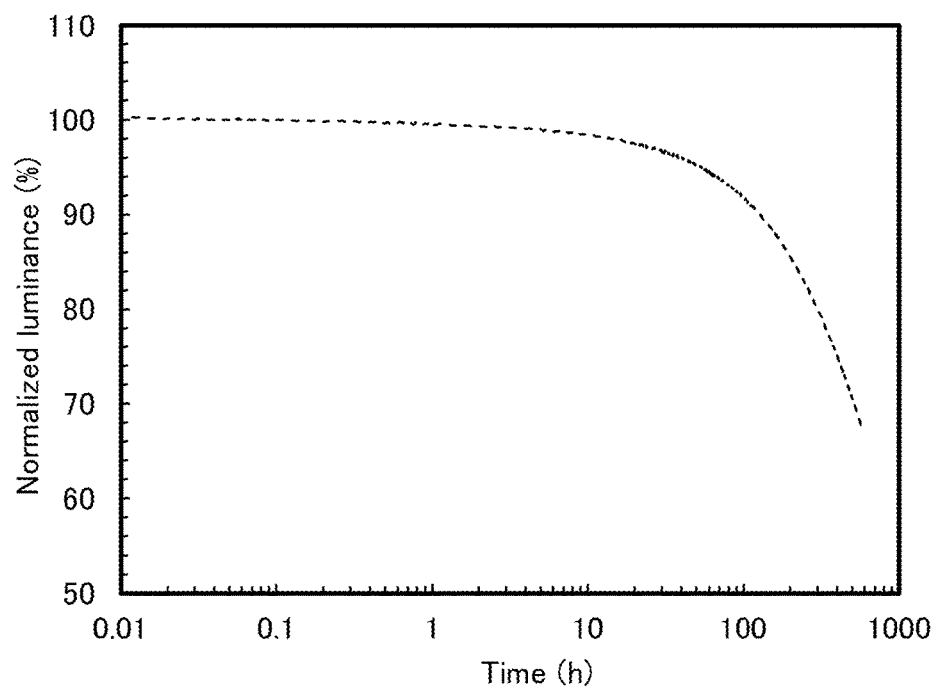
FIG. 62 shows time dependence of normalized luminance of the light-emitting element 12.

FIG. 62 shows a change in luminance of the light-emitting element with driving time under the conditions where the current value was 2 mA and the current density was constant. As shown in FIG. 62, a decrease in luminance with accumulation of driving time of the light-emitting element 12 of one embodiment of the present invention is small; therefore, the light-emitting element 12 have a long lifetime.

In the light-emitting element 12 of this example, the HOMO levels of the first to third hole-transport materials, the host material, and the light-emitting material are shown in the following tables. Note that the HOMO level and the LUMO level were obtained through a cyclic voltammetry (CV) measurement. The calculation method is the same as that described in Example 1.

TABLE 26

| | First hole-tranport layer | Second hole-transport layer | Third hole-transport layer | Light-emitting layer | |
|---|---|---|---|---|---|
| | | | | Host material | Light-emitting material |
| Material | NPB | BBAβNB | βNPβNC | cgDBCzPA | 1,6mMemFLPAPrn |
| HOMO level (eV) | −5.38 | −5.47 | −5.77 | −5.69 | −5.40 |

As shown in the above table, as for the materials used in the light-emitting element 12, the HOMO level of the second hole-transport material is deeper than the HOMO level of the first hole-transport material, the HOMO level of the host material is deeper than the HOMO level of the second hole-transport material, and the HOMO level of the third hole-transport material is deeper than the HOMO level of the host material. Furthermore, the HOMO level of the light-emitting material is shallower than the HOMO level of the host material.

The HOMO level of NPB that is the first hole-transport material is as shallow as −5.38 eV and can easily cause charge separation by interacting with the LUMO level (−4.41 eV) of HAT-CN.

Here, the HOMO level of cgDBCzPA that is the host material is −5.69 eV and its difference from the HOMO level of NPB is 0.31 eV. On the other hand, the HOMO level of 1,6mMemFLPAPrn that is the light-emitting material is −5.40 eV and its difference from the HOMO level of NPB is 0.02 eV. Since the difference in HOMO level between the light-emitting material and the first hole-transport material is small, when the light-emitting element has a structure in which the first hole-transport layer 112-1 is in contact with the light-emitting layer 113, it is assumed that holes are likely to be injected to the light-emitting material. When the holes are directly injected to the light-emitting material, the holes are trapped at the interface between the first hole-transport layer 112-1 and the light-emitting layer by the light-emitting material, whereby the light-emitting region might be localized to promote deterioration. Furthermore, holes of the hole-transport material of the first hole-transport layer 112-1 are less likely to enter the host material of the light-emitting layer. Therefore, holes and electrons are accumulated in the hole-transport material and the host material, respectively. Accordingly, an exciplex with lower energy than the light-emitting material might be formed between the hole-transport material and the host material, which tends to cause disadvantages such as reduction in emission efficiency.

In the light-emitting element 12, the second hole-transport material whose HOMO level is shallower than the HOMO level of the host material but deeper than the HOMO level of the first hole-transport material is used as the second hole-transport layer 112-2, whereby holes are first injected from the first hole-transport layer 112-1 to the second hole-transport layer 112-2. The HOMO levels of BBAβNB that is the second hole-transport material is −5.47 eV, and its differences from the HOMO level of NPB that is the first hole-transport material is as small as 0.09 eV. Accordingly, holes are smoothly injected from the first hole-transport layer 112-1 to the second hole-transport layer 112-2.

Here, on the assumption that the light-emitting element has a structure in which the second hole-transport layer 112-2 is in contact with the light-emitting layer 113, when holes are injected from the second hole-transport layer 112-2 to the light-emitting layer 113, a barrier of approximately 0.22 eV exists between the second hole-transport material and the host material. With such a difference, holes are usually injected without problems. Meanwhile, the HOMO level of the light-emitting material included in the light-emitting layer 113 is −5.40 eV, and thus a barrier to hole injection from the second hole-transport material to the light-emitting material does not exist. Therefore, holes are preferentially injected to the light-emitting material than to the host material eventually. As described above, direct injection of holes to the light-emitting material is likely to cause disadvantages such as acceleration of deterioration and reduction in emission efficiency.

Thus, in the light-emitting element 12 that was the light-emitting element of an embodiment of the present invention, the third hole-transport layer 112-3 was further provided between the second hole-transport layer 112-2 and the light-emitting layer 113. The HOMO level of βNPβNC that is the third hole-transport material included in the third hole-transport layer 112-3 is −5.77 eV, which is deeper than the HOMO level of the host material. Accordingly, holes are injected from the second hole-transport material to the third hole-transport material without problems. In addition, holes are preferentially injected to the host material because a barrier to hole injection from the third hole-transport material to the host material does not exist and also because of the mixing ratio between the host material and the light-emitting material. Therefore, holes are less likely to be directly injected to the light-emitting material. Note that the difference in HOMO level between the second hole-transport material and the third hole-transport material is 0.30 eV (less than or equal to 0.3 eV with one significant figure); thus, holes are injected from the second hole-transport material to the third hole-transport material without problems.

Although the holes injected to the host material are partly trapped in the light-emitting material, they can be moved toward the second electrode while being trapped moderately, and the host material is an anthracene compound, which also has an electron-transport property; accordingly, the driving voltage does not increase. In addition, the light-emitting region extends over the light-emitting layer 113 without being localized, and deterioration is not promoted. Therefore, the light-emitting element 12 had favorable emission efficiency.

Reference Example 1

In this reference example, a method for synthesizing 4-naphthyl-4',4''-diphenyltriphenylamine (abbreviation: BBAβNB) used in the light-emitting elements 9 and 12 is described. A structural formula of BBAβNB is shown below.

[Chemical Formula 10]

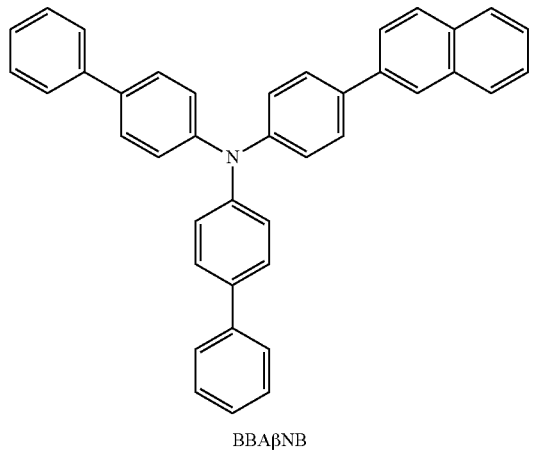

BBAβNB

Into a 200 mL three-neck flask were put 2.3 g (7.1 mmol) of bis(4-biphenylyl)amine, 2.0 g (7.1 mmol) of 2-(4-bromophenyl)naphthalene, 1.5 g (15 mmol) of sodium tert-butoxide (abbreviation: tert-BuONa), and 0.16 g (0.40 mmol) of 2-dicyclohexylphosphino-2',6'-dimethoxy-1,1'-biphenyl (abbreviation: SPhos). The air in the flask was replaced with nitrogen, and then 35 mL of xylene was added. After this mixture was degassed under reduced pressure, stirring was performed at 60° C. under a nitrogen stream, 0.12 g (0.20 mmol) of bis(dibenzylideneacetone)palladium (0) was added, and this mixture was stirred at 120° C. for 7 hours. After the stirring, the obtained mixture was washed with water and a saturated aqueous solution of sodium chloride, and the organic layer was dried with magnesium sulfate. The brown solid was purified by high performance liquid chromatography (mobile phase: chloroform) to give 3.5 g of an objective light yellow solid in a yield of 93%. The synthesis scheme of this reaction is shown below.

[Chemical Formulae 11]

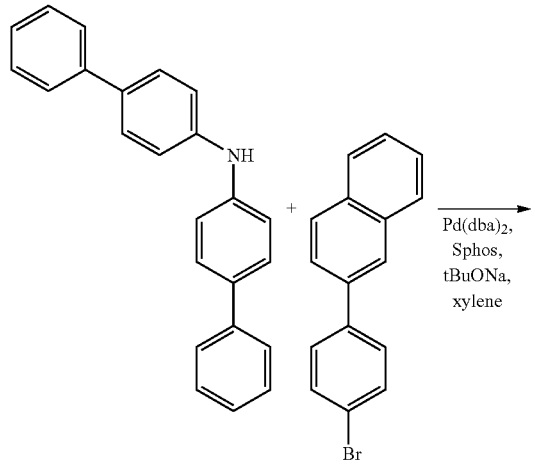

-continued

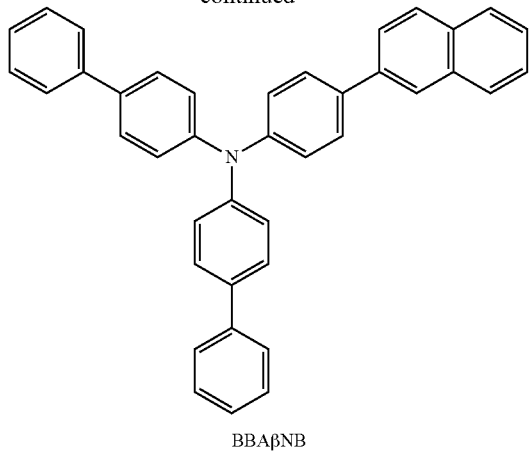

BBAβNB $^1$H NMR data of the obtained white solid are shown below. $^1$H NMR (dichloromethane-d2, 500 MHz): δ=7.24 (d, J=9.0 Hz, 4H), 7.26 (d, J=8.5 Hz, 2H), 7.31 (d, J=7.5 Hz, 2H), 7.42 (d, J=7.5 Hz, 4H), 7.45-7.50 (m, 2H), 7.55 (d, J=8.5 Hz, 4H), 7.60 (d, J=7.5 Hz, 4H), 7.68 (d, J=8.5 Hz, 2H), 7.76 (dd, J1=2.0 Hz, J2=8.5 Hz, 1H), 7.85 (d, J=8.0 Hz, 1H), 7.90 (t, J=8.05 Hz, 2H), 8.05 (s, 1H).

Figure 63A:
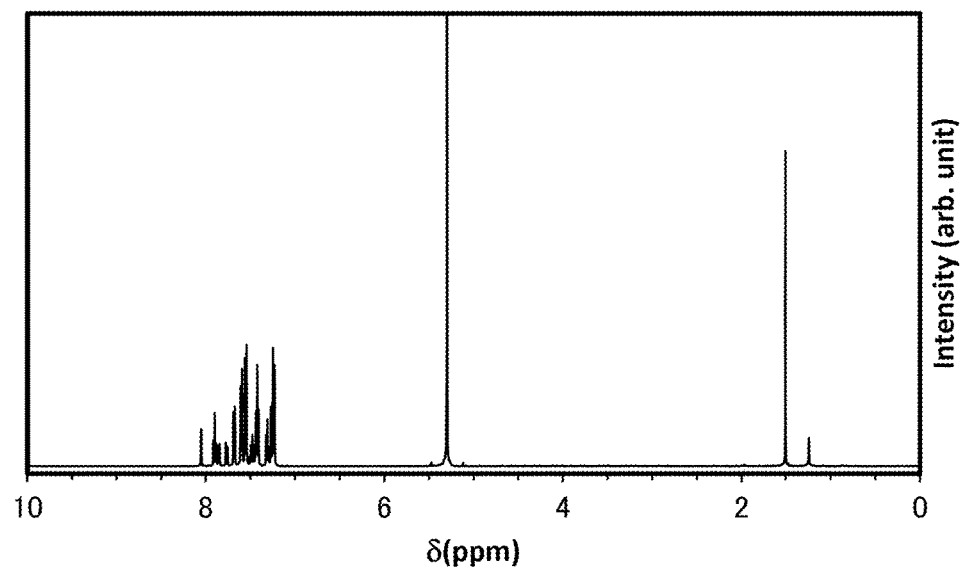
FIGS. 63A and 63B show $^1$H-NMR charts of BBAβNB.
Figure 63B:
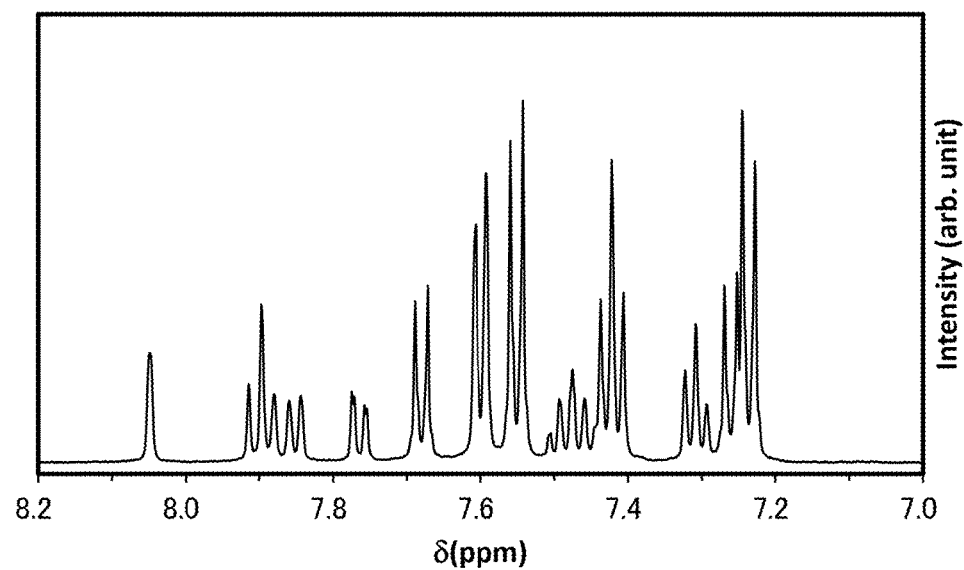

The $^1$H NMR charts are shown in FIGS. 63A and 63B. Note that FIG. 63B is an enlarged chart of a part in the range from 7.00 ppm to 8.20 ppm of FIG. 63A. The results indicate that BBAβNB was obtained by the synthesis reaction.

By train sublimation, 3.5 g of the obtained white solid (BBAβNB) was purified. The purification by sublimation was carried out under a pressure of 3.4 Pa, with a flow rate of argon gas of 15 mL/min, at a heating temperature of 265° C., and for 16 hours. After the sublimation purification, 2.8 g of a pale yellow glassy solid of a target substance was obtained at a collection rate of 81%.

The HOMO level and the LUMO level of BBAβNB were obtained through a cyclic voltammetry (CV) measurement. A calculation method is shown below.

An electrochemical analyzer (ALS model 600A or 600C, manufactured by BAS Inc.) was used as a measurement apparatus. As for a solution used for the CV measurement, dehydrated dimethylformamide (DMF, product of Sigma-Aldrich Inc., 99.8%, catalog No. 22705-6) was used as a solvent, and Tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration of tetra-n-butylammonium perchlorate was 100 mmol/L. Furthermore, the object to be measured was also dissolved in the solvent such that the concentration thereof was 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was performed at room temperature (20° C. to 25° C.). In addition, the scan speed at the CV measurement was set to 0.1 V/sec, and an oxidation potential Ea [V] and a reduction potential Ec [V] with respect to the reference electrode were measured. Note that Ea represents an intermediate potential of an oxidation-reduction wave, and Ec represents an intermediate potential of a reduction-oxidation wave. Here, the potential energy of the reference electrode used in this example with respect to the vacuum level is found to be −4.94 [eV], and thus, the HOMO level and the LUMO level can be obtained from the following formula: HOMO level [eV]=−4.94−Ea and LUMO level [eV]=−4.94−Ec. Furthermore, the CV measurement was repeated 100 times, and the oxidation-reduction wave at the hundredth cycle and the oxidation-reduction wave at the first cycle were compared with each other to examine the electric stability of the compound.

As a result, the HOMO level of BBAβNB was found to be −5.47 eV. In contrast, the LUMO level was found to be −2.28 eV. When the oxidation-reduction wave was repeatedly measured, in the Ea measurement, the peak intensity of the oxidation-reduction wave after the hundredth cycle was maintained to be 83% of that of the oxidation-reduction wave at the first cycle, and in the Ec measurement, the peak intensity of the oxidation-reduction wave after the hundredth cycle was maintained to be 92% of that of the oxidation-reduction wave at the first cycle; thus, resistance to oxidation and reduction of BBAβNB was found to be extremely high.

Further, differential scanning calorimetry (DSC measurement) of BBAβNB was performed by Pyris1DSC manufactured by PerkinElmer, Inc. In the differential scanning calorimetry, after the temperature was raised from −10° C. to 300° C. at a temperature increase rate of 40° C./min, the temperature was held for a minute and then cooled to −10° C. at a temperature reduction rate of 40° C./min. This operation was repeated twice successively. The DSC measurement result of a second cycle showed that the glass transition point of BBAβNB was 81° C. In addition, the result of the first cycle showed that the melting point of BBAβNB was 241° C.

The thermogravimetry-differential thermal analysis (TG-DTA) of BBAβNB was performed. The measurement was conducted by using a high vacuum differential type differential thermal balance (TG/DTA 2410SA, manufactured by Bruker AXS K.K.). The measurement was performed under atmospheric pressure at a temperature rising rate of 10° C./min under a nitrogen stream (a flow rate of 200 mL/min). In the thermogravimetry-differential thermal analysis, the temperature (decomposition temperature) at which the weight obtained by thermogravimetry was reduced by 5% of the weight at the beginning of the measurement was found to be 412° C., which shows that BBAβNB was a substance with high heat resistance.

Reference Example 2

In this reference example, a method for synthesizing 3,6-bis[4-(2-naphthyl)phenyl]-9-phenyl-9H-carbazole (abbreviation: βNP2PC) used for the light-emitting elements 9 to 11 is described. A structural formula of βNP2PC is shown below.

[Chemical Formula 12]

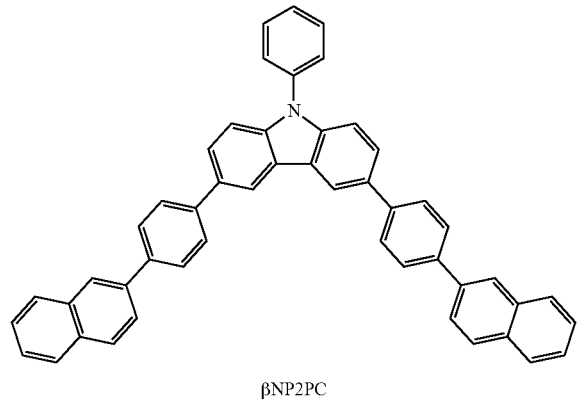

βNP2PC

Into a 200 mL three-neck flask were put 1.9 g (4.8 mmol) of 3,6-dibromo-9-phenyl-9H-carbazole, 2.4 g (9.7 mol) of 4-(2-naphthyl)phenylboronic acid, 0.12 g (0.40 mmol) of tri(o-tolyl)phosphine, and 2.7 g (19 mmol) of potassium carbonate. The air in the flask was replaced with nitrogen, and then 40 mL of toluene, 10 mL of ethanol, and 10 mL of water were added to the mixture. This mixture was degassed by being stirred while the pressure was reduced. After the degassing, 22 mg (0.10 mmol) of palladium(II) acetate was added to this mixture. This mixture was stirred at 80° C. for 4 hours under a nitrogen stream, so that a solid was precipitated. The precipitated solid was collected by suction filtration. The collected solid was dissolved in approximately 750 mL of hot toluene, and this solution was suction-filtered through Celite, alumina, and Florisil to give a filtrate. The resulting filtrate was concentrated to give a solid. The solid was washed with toluene to give 2.6 g of a target white powder in a yield of 99%. The synthesis scheme of this reaction is shown below.

[Chemical Formulae 13]

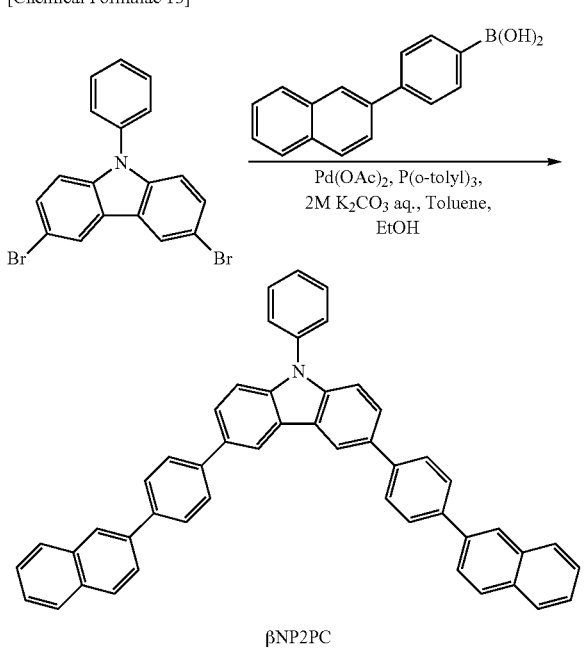

βNP2PC

By a train sublimation method, 2.6 g of the obtained white powder was purified. In the purification by sublimation, the white powder was heated at 350° C. under a pressure of 3.0 Pa with a flow rate of argon gas of 5.0 mL/min. After the purification by sublimation, 2.0 g of a white solid was obtained at a collection rate of 77%.

The obtained substance was analyzed by $^1$H NMR. The measurement result is shown.

$^1$H NMR (CDCl$_3$, 300 MHz): δ=7.47-7.55 (m, 7H), 7.65 (s, 2H), 7.67 (d, J=2.4 Hz, 2H), 7.76 (dd, J$_1$=8.4 Hz, J$_2$=1.8 Hz, 2H), 7.75-7.97 (m, 16H), 8.14 (d, J=1.8 Hz, 2H), 8.51 (d, J=1.5 Hz, 2H).

Figure 64A:
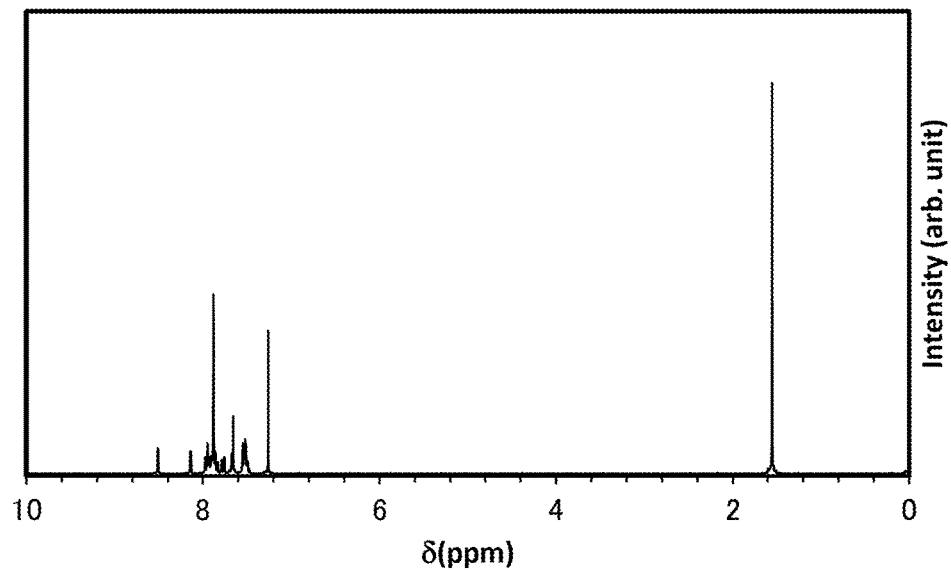
FIGS. 64A and 64B show $^1$H-NMR charts of βNP2PC.
Figure 64B:
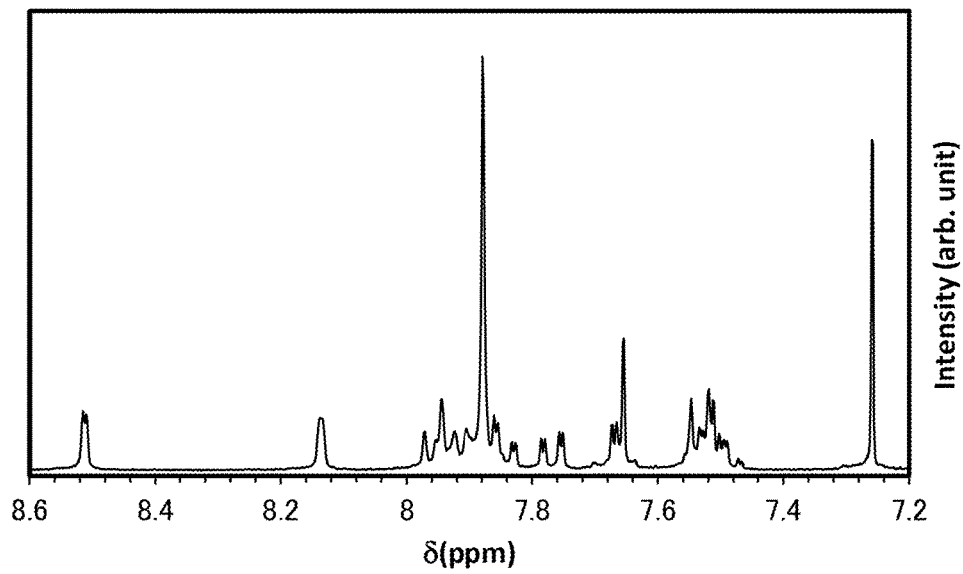

FIGS. 64A and 64B show the $^1$H-NMR charts. Note that FIG. 64B is an enlarged chart of a part in the range of 7.20 ppm to 8.60 ppm in FIG. 64A. The results indicated that βNP2PC was obtained by the synthesis reaction.

The thermogravimetry-differential thermal analysis (TG-DTA) of βNP2PC was performed. The measurement was conducted by using a high vacuum differential type differential thermal balance (TG/DTA 2410SA, manufactured by Bruker AXS K.K.). The measurement was carried out under a nitrogen stream (a flow rate of 200 mL/min) and a normal pressure at a temperature rising rate of 10° C./min. The relationship between weight and temperature (thermogravimetry) shows that the 5% weight loss temperature of βNP2PC is higher than or equal to 500° C. The result showed that βNP2PC had favorable heat resistance.

Reference Example 3

In this reference example, a method for synthesizing 4-(1-naphthyl)-4',4"-diphenyltriphenylamine (abbreviation: BBAαNB) used in the light-emitting element 10 is described. A structural formula of BBAαNB is shown below.

[Chemical Formula 14]

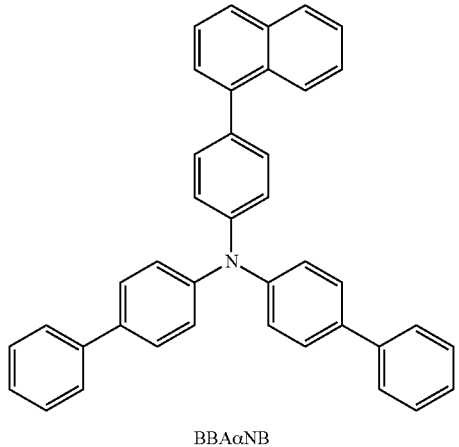

BBAαNB

Into a 200 mL three-neck flask were put 4.8 g (10 mmol) of 4-bromo-4',4"-diphenyltriphenylamine, 1.8 g (10 mmol) of 2-naphthylboronic acid, 0.31 g (1.0 mmol) of tris(2-methylphenyl)phosphine, 40 mL of toluene, 10 mL of ethanol, and 10 mL (2.0 mol/L) of a potassium carbonate solution. The mixture was degassed by being stirred while the pressure in the flask was reduced. After the degassing, the atmosphere in the flask was replaced with nitrogen, and this mixture was heated to 60° C. After the heating, 0.12 g (0.5 mmol) of palladium(II) acetate was added to this mixture, and the resulting mixture was stirred at 80° C. for 1.5 hours. After the stirring, the mixture was cooled down to room temperature, and an organic layer of the mixture was washed with water, the obtained aqueous layer was subjected to extraction with toluene. The extracted solution and the organic layer were combined, and the mixture was washed with saturated saline. Then, magnesium sulfate is added for drying. This mixture was gravity-filtered, and the obtained filtrate was concentrated to give a target brown solid. The obtained solid was dissolved in chloroform, and the resulting solution was purified by high performance liquid chromatography (recycling preparative HPLC using LC-SakuraNEXT manufactured by Japan Analytical Industry Co., Ltd., developing solvent: chloroform) to obtain 3.9 g of a target white solid at a yield of 75%. The synthesis scheme of this reaction is shown below.

[Chemical Formulae 15]

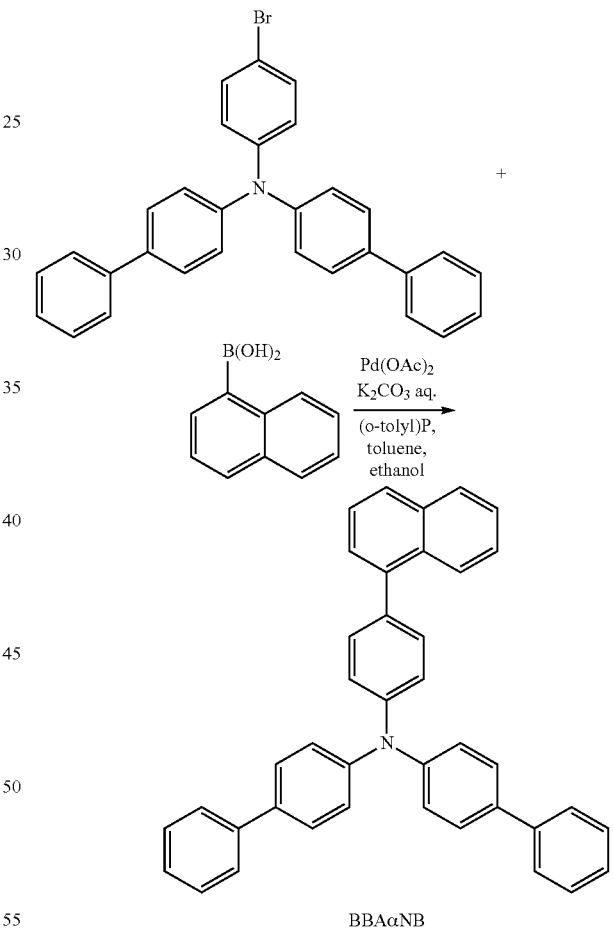

BBAαNB $^1$H NMR data of the obtained white solid were measured. The obtained data are shown below.

$^1$H NMR (dichloromethane-d$_2$, 500 MHz): δ=7.26-7.29 (m, 6H), 7.31 (t, J=7.0 Hz, 2H), 7.41-7.54 (m, 10H), 7.56 (d, J=8.5 Hz, 4H), 7.60 (d, J=7.0 Hz, 4H), 7.84 (d, J=8.0 Hz, 1H), 7.90 (d, J=7.0 Hz, 1H), 8.03 (d, J=9.0 Hz, 1H).

Figure 65A:
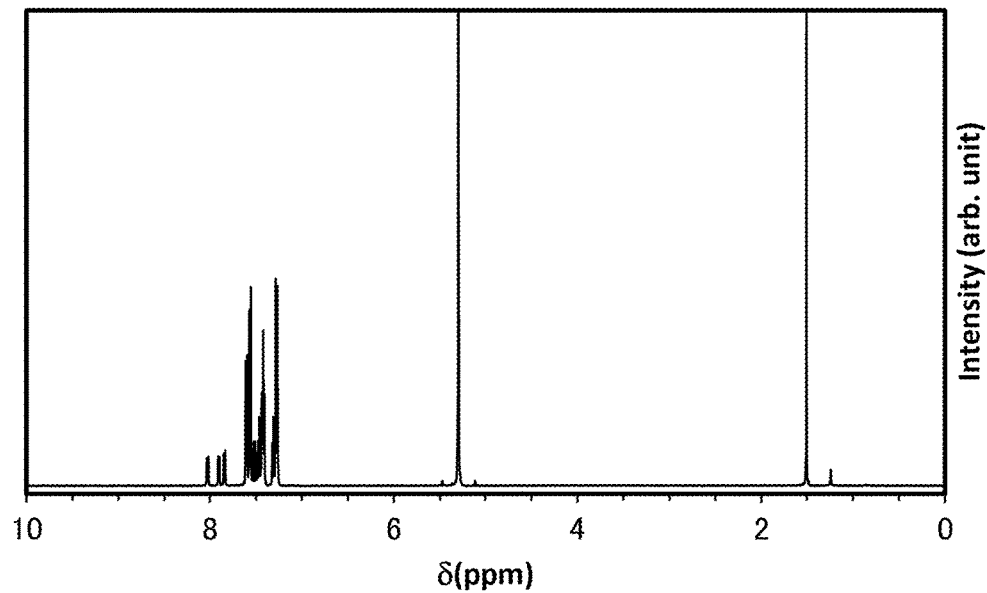
FIGS. 65A and 65B show $^1$H-NMR charts of BBAαNB.
Figure 65B:
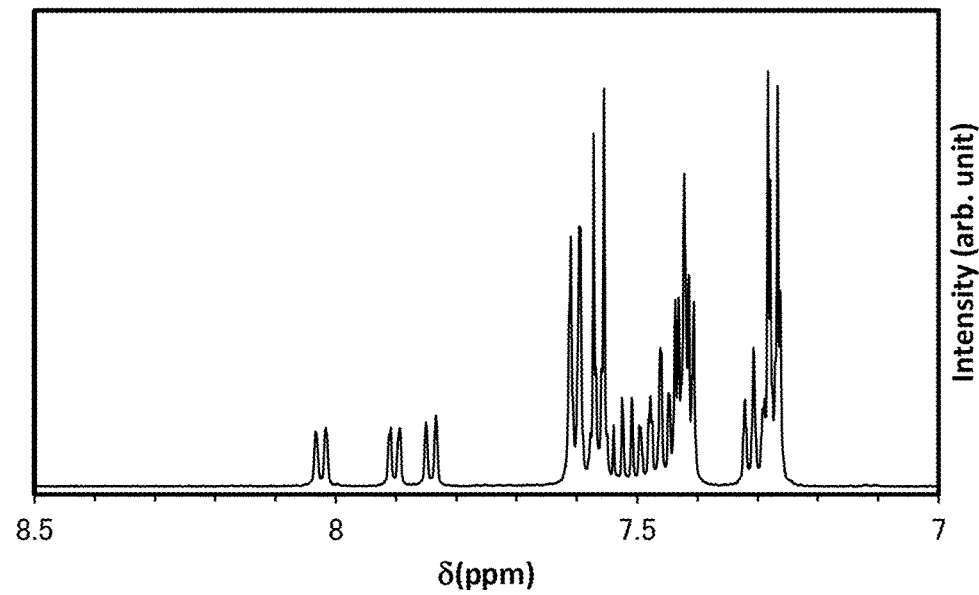

The $^1$H NMR charts are shown in FIGS. 65A and 65B. Note that FIG. 65B is an enlarged chart of a part in the range of 7.0 ppm to 8.5 ppm in FIG. 65A. The results indicate that BBAαNB was obtained by the synthesis.

Then, 3.9 g of the obtained solid (BBAαNB) was purified by a train sublimation method. In the purification, the solid was heated at 250° C. under a pressure of 3.4 Pa for 16 hours with a flow rate of argon of 15 mL/min to give 2.4 g of a target solid at a correction rate of 62%.

The HOMO level and the LUMO level of BBAαNB were obtained through a cyclic voltammetry (CV) measurement. A calculation method is shown below.

An electrochemical analyzer (ALS model 600A or 600C, manufactured by BAS Inc.) was used as a measurement apparatus. As for a solution used in the CV measurement, dehydrated dimethylformamide (DMF) (manufactured by Aldrich, 99.8%, catalog number: 22705-6) was used as a solvent, and tetra-n-butylammonium perchlorate (n-Bu$_4$NClO$_4$, product of Tokyo Chemical Industry Co., Ltd., catalog No. T0836), which was a supporting electrolyte, was dissolved in the solvent such that the concentration thereof was 100 mmol/L. Further, the object to be measured was also dissolved in the solvent such that the concentration thereof was 2 mmol/L. A platinum electrode (PTE platinum electrode, manufactured by BAS Inc.) was used as a working electrode, another platinum electrode (Pt counter electrode for VC-3 (5 cm), manufactured by BAS Inc.) was used as an auxiliary electrode, and an Ag/Ag$^+$ electrode (RE7 reference electrode for nonaqueous solvent, manufactured by BAS Inc.) was used as a reference electrode. Note that the measurement was performed at room temperature (20° C. to 25° C.). In addition, the scan speed at the CV measurement was set to 0.1 V/sec, and an oxidation potential Ea[V] and a reduction potential Ec [V] with respect to the reference electrode were measured. Note that Ea represents an intermediate potential of an oxidation-reduction wave, and Ec represents an intermediate potential of a reduction-oxidation wave. Here, the potential energy of the reference electrode used in this example with respect to the vacuum level is found to be −4.94 [eV], and thus, the HOMO level and the LUMO level can be obtained from the following formula: HOMO level [eV]=−4.94−Ea and LUMO level [eV]=−4.94−Ec. Furthermore, the CV measurement was repeated 100 times, and the oxidation-reduction wave at the hundredth cycle and the oxidation-reduction wave at the first cycle were compared with each other to examine the electric stability of the compound.

As a result, in the measurement of an oxidation potential Ea [V] of BBAαNB, the HOMO level was −5.49 eV. Meanwhile, the LUMO level was −2.24 eV. When the oxidation-reduction wave was repeatedly measured, in the Ea measurement, the peak intensity of the oxidation-reduction wave after the hundredth cycle was maintained to be 93% of that of the oxidation-reduction wave at the first cycle, and in the Ec measurement, the peak intensity of the oxidation-reduction wave after the hundredth cycle was maintained to be 92% of that of the oxidation-reduction wave at the first cycle; thus, resistance to oxidation and reduction of BBAαNB was found to be extremely high.

Differential scanning calorimetry (DSC measurement) of BBAαNB was performed by Pyris1DSC manufactured by PerkinElmer, Inc. In the differential scanning calorimetry, after the temperature was raised from −10° C. to 270° C. at a temperature increase rate of 40° C./min, the temperature was held for a minute and then cooled to −10° C. at a temperature reduction rate of 40° C./min. This operation was repeated twice successively and the second measurement result was employed. The DSC measurement showed that the glass transition point of BBAαNB was 84° C.

Reference Example 4

In this reference example, a method for synthesizing 4-[4-(2-naphthyl)phenyl]-4',4"-diphenyltriphenylamine (abbreviation: BBAβNBi) used in the light-emitting element 11 is described. A structural formula of BBAβNBi is shown below.

[Chemical Formula 16]

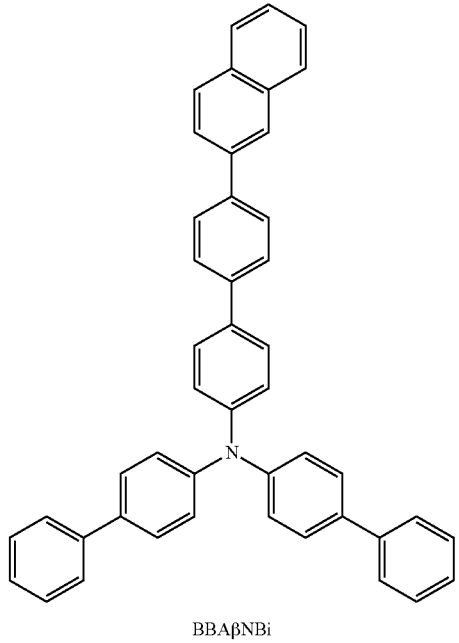

BBAβNBi

Into a 200 mL three-neck flask were put 4.8 g (10 mmol) of 4-bromo-4',4"-diphenyltriphenylamine, 2.5 g (10 mmol) of 4-(2-naphthyl)phenylboronic acid, 0.31 g (1.0 mmol) of tris(2-methylphenyl)phosphine, 40 mL of toluene, 10 mL of ethanol, and 10 mL (2.0 mol/L) of a potassium carbonate solution. The mixture was degassed by being stirred while the pressure in the flask was reduced. After the degassing, the atmosphere in the flask was replaced with nitrogen, and this mixture was heated to 60° C. After the heating, 0.11 g (0.5 mmol) of palladium(II) acetate was added, and the resulting mixture was stirred at 80° C. for 1.5 hours. After the stirring, the mixture was cooled down to room temperature, and a precipitated solid was collected by suction filtration and washed with toluene, ethanol, and water. The obtained solid was washed with chloroform and collected by suction filtration, whereby 2.9 g of a target brown solid was obtained at a yield of 49%. A reaction scheme of this synthesis reaction is shown below.

[Chemical Formulae 17]

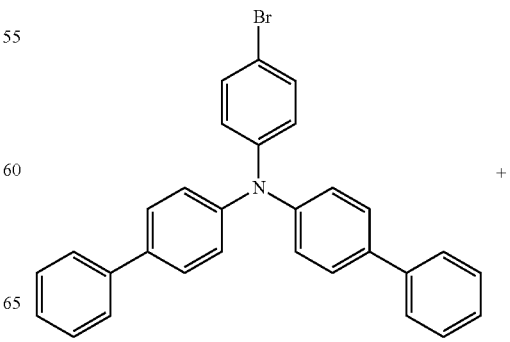

-continued

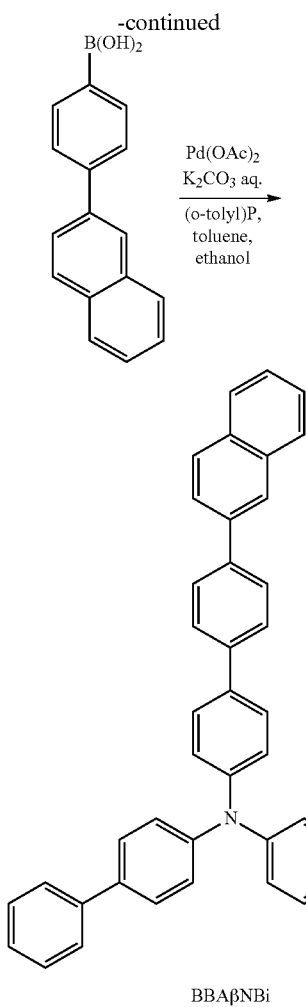

BBAβNBi

¹H NMR data of the obtained brown solid were measured. The obtained data are shown below.

¹H NMR (dichloromethane-$d_2$, 500 MHz, 500 MHz): δ=7.22-7.25 (m, 6H), 7.31 (t, J=7.3 Hz, 2H), 7.42 (t, J=7.8 Hz, 4H), 7.46-7.52 (m, 2H), 7.55 (d, J=7.5 Hz, 4H), 7.59-7.63 (m, 6H), 7.74 (d, J=8.0 Hz, 2H), 7.18-7.83 (m, 3H), 7.87 (d, J=7.5 Hz, 1H), 7.93 (t, J=8.7 Hz, 2H), 8.11 (s, 1H).

Figure 66A:
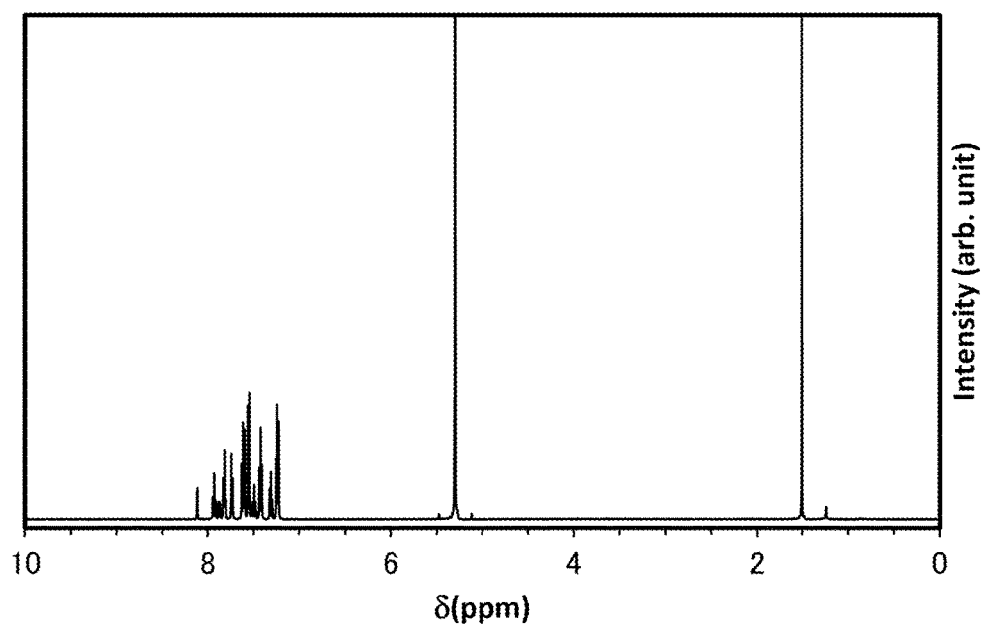
FIGS. 66A and 66B show $^1$H-NMR charts of BBAβNBi.
Figure 66B:
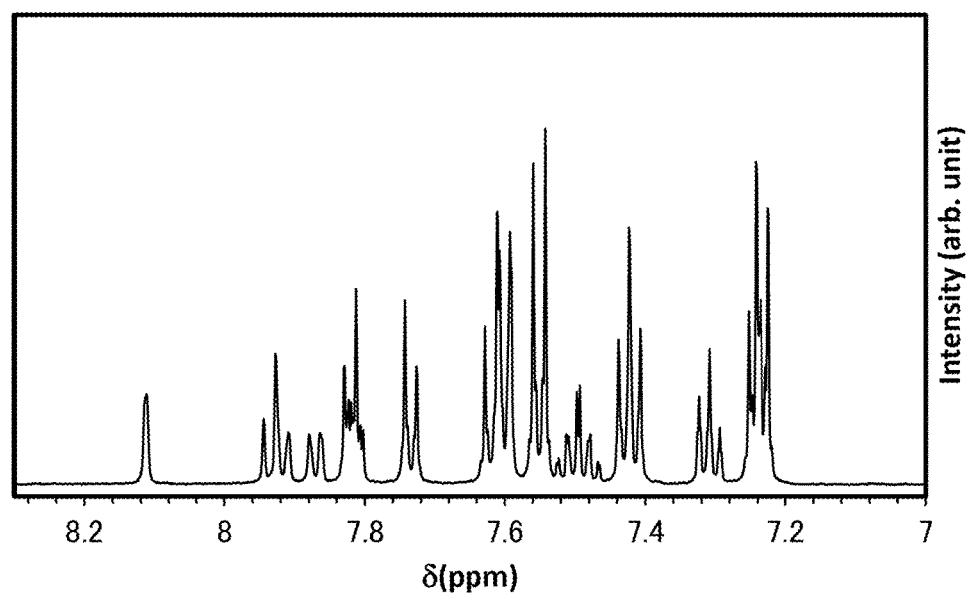

The ¹H NMR charts are shown in FIGS. 66A and 66B. Note that FIG. 66B is an enlarged chart of a part in the range of 7.0 ppm to 8.3 ppm in FIG. 66A. The results indicate that BBAβNBi was obtained by the synthesis.

Then, 2.9 g of the obtained solid (BBAβNBi) was purified by a train sublimation method. In the purification, the solid was heated at 300° C. under a pressure of 4.0 Pa for 16 hours with a flow rate of argon of 15 mL/min to give 1.9 g of a target white solid at a correction rate of 65%.

The HOMO level and the LUMO level of BBAβNBi were obtained through a cyclic voltammetry (CV) measurement. A calculation method is the same as that described in Reference example 3.

As a result, in the measurement of an oxidation potential Ea [V] of BBAβNBi, the HOMO level was −5.47 eV. Meanwhile, the LUMO level was −2.38 eV. When the oxidation-reduction wave was repeatedly measured, in the Ea measurement, the peak intensity of the oxidation-reduction wave after the hundredth cycle was maintained to be 82% of that of the oxidation-reduction wave at the first cycle, and in the Ec measurement, the peak intensity of the oxidation-reduction wave after the hundredth cycle was maintained to be 67% of that of the oxidation-reduction wave at the first cycle; thus, resistance to oxidation and reduction of BBAβNBi was found to be extremely high.

Differential scanning calorimetry (DSC measurement) of BBAβNBi was performed by Pyris1DSC manufactured by PerkinElmer, Inc. In the differential scanning calorimetry, after the temperature was raised from −10° C. to 270° C. at a temperature increase rate of 40° C./min, the temperature was held for a minute and then cooled to −10° C. at a temperature reduction rate of 40° C./min. This operation was repeated twice successively and the second measurement result was employed. The DSC measurement showed that the glass transition point of BBAβNBi was 97° C., which revealed that BBAβNBi is a compound which has favorable heat resistance.

Reference Example 5

In this reference example, a method for synthesizing 3-[4-(2-naphthyl)phenyl]-9-(2-naphthyl)-9H-carbazole (abbreviation: βNPβNC) used in the light-emitting element 12 is described. A structural formula of βNPβNC is shown below.

[Chemical Formula 18]

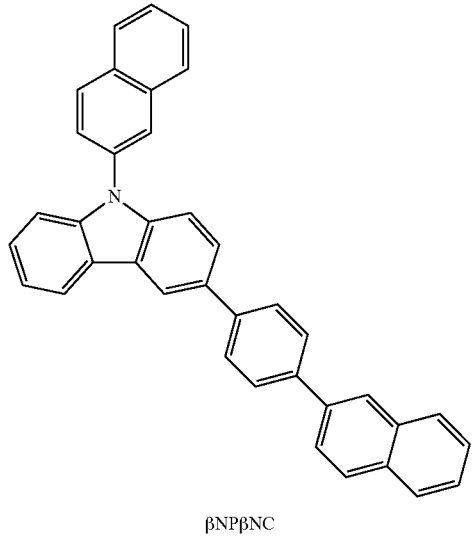

βNPβNC

Into a 200 mL three-neck flask were put 2.3 g (8.1 mmol) of 2-(4-Bromophenyl)naphthalene, 3.4 g (8.1 mmol) of 4,4,5,5-tetramethyl-2-[9-(2-naphthyl)-9H-carbazol-3-yl]-1,3,2-dioxaborolane, 50 mg (0.16 mmol) of tri(o-tolyl)phosphine, and 2.2 g (16 mmol) of potassium carbonate. The air in the flask was replaced with nitrogen, and then 30 mL of toluene, 10 mL of ethanol, and 8.0 mL of water were added to the mixture. This mixture was degassed by being stirred while the pressure was reduced. After the degassing, 18 mg (0.081 mmol) of palladium(II) acetate was added to the mixture. This mixture was stirred at 80° C. for 4 hours under a nitrogen stream, so that a solid was precipitated. The precipitated solid was collected by suction filtration. The aqueous layer of the obtained filtrate was subjected to extraction with toluene, and the extracted solution and the organic layer were combined and washed with saturated brine. The organic layer was dried with magnesium sulfate, and this mixture was gravity-filtered. A solid obtained by concentrating the resulting filtrate and the collected solid were dissolved in approximately 200 mL of heated toluene. This solution was suction-filtered through Celite (Catalog No. 537-02305, produced by Wako Pure Chemical Industries, Ltd.), alumina, and Florisil (Catalog No. 066-05265, produced by Wako Pure Chemical Industries, Ltd.). The resulting filtrate was concentrated to give a solid. The solid was recrystallized with toluene to give 2.9 g of a target white powder in a yield of 72%. A reaction scheme of this synthesis reaction is shown below.

[Chemical formulae 19]

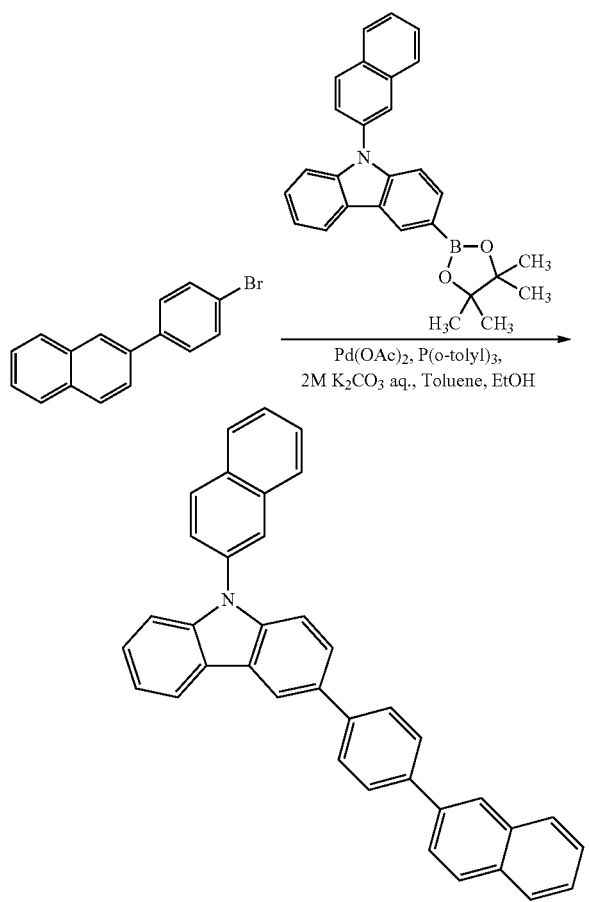

The 2.9 g of the obtained white powder was purified by sublimation using a train sublimation method. In the purification, the white powder was heated at 280° C. under a pressure of 3.9 Pa with a flow rate of argon gas of 5.0 mL/min. After the purification by sublimation, 2.1 g of a white solid of βNPβNC was obtained at a collection rate of 72%.

The obtained substance was analyzed by $^1$H NMR. The measurement results are shown below.

$^1$H NMR (CDCl$_3$, 300 MHz): δ=7.35 (ddd, $J_1$=6.6 Hz, $J_2$=1.2 Hz, 1H), 7.42-7.63 (m, 5H), 7.60 (dd, $J_1$=9.6 Hz, $J_2$=6.3 Hz, 2H), 7.69-7.76 (m, 2H), 7.82-8.01 (m, 10H), 8.08-8.13 (m, 3H), 8.25 (d, J=7.8 Hz, 1H), 8.46 (d, J=1.5 Hz, 1H).

Figure 67A:
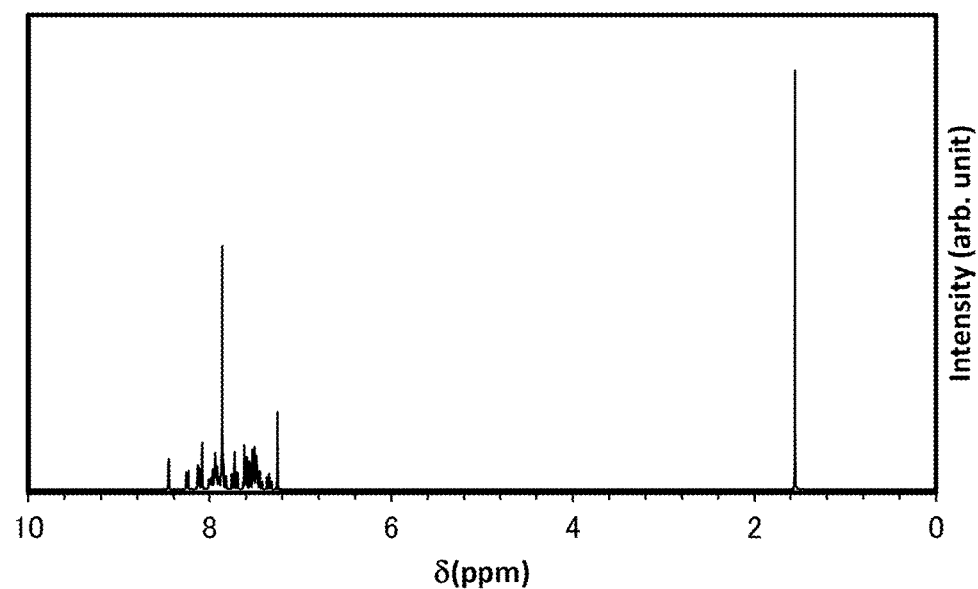
FIGS. 67A and 67B show $^1$H-NMR charts of βNPβNC.
Figure 67B:
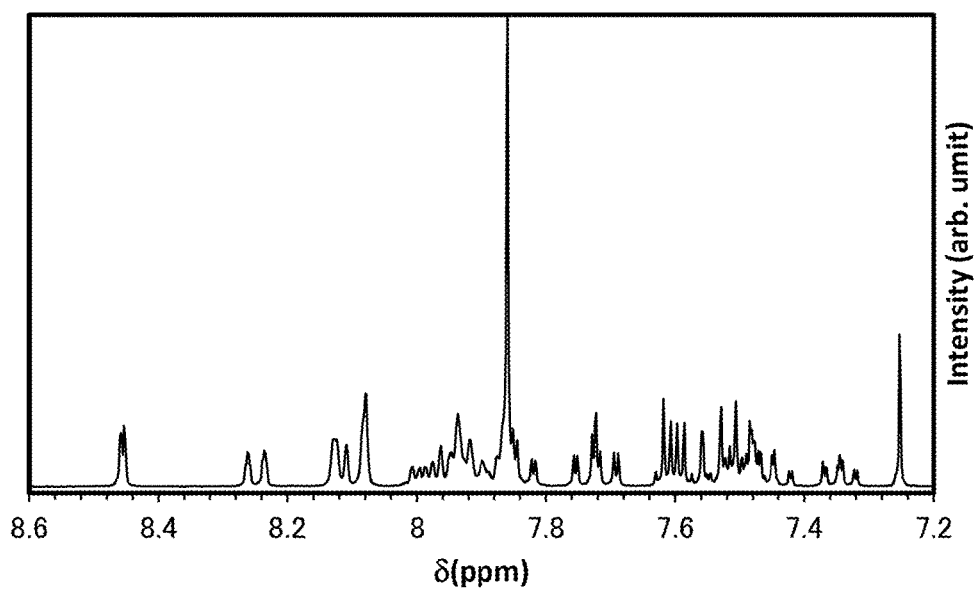

The $^1$H NMR charts are shown in FIGS. 67A and 67B. Note that FIG. 67B is an enlarged chart of a part in the range of 7.20 ppm to 8.60 ppm in FIG. 67A. The results indicate that βNPβNC was obtained by the synthesis reaction.

The thermogravimetry-differential thermal analysis (TG-DTA) of βNPβNC was performed. The measurement was conducted by using a high vacuum differential type differential thermal balance (TG/DTA 2410SA, manufactured by Bruker AXS K.K.). The measurement was conducted under a nitrogen stream (flow rate: 200 mL/min) at normal pressure at a temperature rising rate of 10° C./min. It was found from the relationship between weight and temperature (thermogravimetry) that the 5% weight loss temperature of βNPβNC was 431° C. The result showed that the βNPβNC had favorable heat resistance.

REFERENCE NUMERALS

101: first electrode; 102: second electrode; 103: EL layer; 111: hole-injection layer; 112-1: first hole-transport layer; 112-2: second hole-transport layer; 112-3: third hole-transport layer; 113: light-emitting layer; 114: electron-transport layer; 115: electron-injection layer; 116: charge-generation layer 116; 117: p-type layer; 118: electron-relay layer; 119: electron-injection buffer layer; 400: substrate; 401: first electrode; 403: EL layer; 404: second electrode; 405: sealing material; 406: sealing material; 407: sealing substrate; 412: pad; 420: IC chip; 501: first electrode; 502: second electrode; 511: first light-emitting unit; 512: second light-emitting unit; 513: charge-generation layer; 601: driver circuit portion (source line driver circuit); 602: pixel portion; 603: driver circuit portion (gate line driver circuit); 604: sealing substrate; 605: sealing substrate; 607: space; 608: wiring; 609: flexible printed circuit (FPC); 610: element substrate; 611: switching FET; 612: current controlling FET; 613: first electrode; 614: insulator; 616: EL layer; 617: second electrode; 618: light-emitting element; 901: housing; 902: liquid crystal layer; 903: backlight unit; 904: housing; 905: driver IC; 906: terminal; 951: substrate; 952: electrode; 953: insulating layer; 954: partition layer; 955: EL layer; 956: electrode; 1001 substrate; 1002 base insulating film; 1003 gate insulating film; 1006 gate electrode; 1007 gate electrode; 1008 gate electrode; 1020 first interlayer insulating film; 1021 second interlayer insulating film; 1022 electrode; 1024W first electrode; 1024R first electrode; 1024G first electrode; 1024B first electrode; 1025 partition; 1028 EL layer; 1029 second electrode; 1031 sealing substrate; 1032 sealing material; 1033 transparent base material; 1034R red coloring layer; 1034G green coloring layer; 1034B blue coloring layer; 1035 black matrix; 1036 overcoat layer; 1037 third interlayer insulating film; 1040 pixel portion; 1041 driver circuit portion; 1042 peripheral portion; 2001: housing; 2002: light source; 3001: lighting device; 5000: display region; 5001: display region; 5002: display region; 5003: display region; 5004: display region; 5005: display region; 7101: housing; 7103: display portion; 7105: stand; 7107: display portion; 7109: operation key; 7110: remote controller; 7201: main body; 7202: housing; 7203: display portion; 7204: keyboard; 7205: external connection port; 7206: pointing device; 7210: second display portion; 7301: housing; 7302: housing; 7303: joint portion; 7304: display portion; 7305: display portion; 7306: speaker portion; 7307: recording medium insertion portion; 7308: LED lamp; 7309: operation key; 7310: connection terminal; 7311: sensor; 7400: mobile phone; 7401: housing; 7402: display portion; 7403: operation button; 7404: external connection port; 7405: speaker; 7406: microphone; 9033: clasp; 9034: switch; 9035: power switch; 9036: switch; 9038: operation switch; 9310: portable information terminal; 9311: display panel; 9312: display region; 9313: hinge; 9315: housing; 9630: housing; 9631: display portion; 9631a: display portion; 9631b: display portion; 9632a: touchscreen region; 9632b: touchscreen region; 9633: solar cell; 9634: charge and discharge control circuit; 9635: battery; 9636: DCDC converter; 9637: operation key; 9638: converter; 9639: button.

This application is based on Japanese Patent Application serial No. 2015-168476 filed with Japan Patent Office on Aug. 28, 2015, and No. 2015-203894 filed with Japan Patent Office on Oct. 15, 2015, the entire contents of which are hereby incorporated by reference.

The invention claimed is:

1. A light-emitting element comprising:
a first electrode;
a second electrode; and
an EL layer,
wherein the EL layer is positioned between the first electrode and the second electrode,
wherein the EL layer includes a hole-injection layer, a first layer, a second layer, a third layer, and a fourth layer,
wherein the hole-injection layer includes an organic acceptor,
wherein the hole-injection layer is positioned between the first electrode and the first layer,
wherein the second layer is positioned between the first layer and the third layer,
wherein the fourth layer is positioned between the third layer and the second electrode,
wherein the first layer includes a first hole-transport material,
wherein the second layer includes a second hole-transport material,
wherein the third layer includes a third hole-transport material,
wherein the fourth layer includes a host material and a light-emitting material,
wherein a HOMO level of the second hole-transport material is deeper than a HOMO level of the first hole-transport material,
wherein a HOMO level of the host material is deeper than the HOMO level of the second hole-transport material,
wherein a HOMO level of the third hole-transport material is deeper than or equal to the HOMO level of the host material, and
wherein a difference between the HOMO level of the second hole-transport material and the HOMO level of the third hole-transport material is less than or equal to 0.3 eV.

2. The light-emitting element according to claim 1, wherein the organic acceptor is 2,3,6,7,10,11-hexacyano-1,4,5,8,9,12-hexaazatriphenylene.

3. The light-emitting element according to claim 1, wherein the HOMO level of the first hole-transport material is greater than or equal to −5.4 eV.

4. The light-emitting element according to claim 1, wherein a difference between the HOMO level of the first hole-transport material and the HOMO level of the second hole-transport material is less than or equal to 0.3 eV.

5. The light-emitting element according to claim 1, wherein the difference between the HOMO level of the second hole-transport material and the HOMO level of the third hole-transport material is less than or equal to 0.2 eV.

6. The light-emitting element according to claim 4, wherein the difference between the HOMO level of the first hole-transport material and the HOMO level of the second hole-transport material is less than or equal to 0.2 eV.

7. The light-emitting element according to claim 1, wherein a HOMO level of the light-emitting material is higher than the HOMO level of the host material.

8. The light-emitting element according to claim 1, wherein the first hole-transport material is triarylamine and has a fluorenylamine skeleton.

9. The light-emitting element according to claim 1, wherein the second hole-transport material is triarylamine and has a triphenylamine skeleton.

10. The light-emitting element according to claim 1, wherein the third hole-transport material is a substance which does not include amine.

11. The light-emitting element according to claim 10, wherein the third hole-transport material includes a carbazole skeleton.

12. The light-emitting element according to claim 11, wherein the carbazole skeleton is a phenylcarbazole skeleton.

13. The light-emitting element according to claim 10, wherein the third hole-transport material includes a triphenylene skeleton.

14. The light-emitting element according to claim 10, wherein the third hole-transport material includes a naphthalene skeleton.

15. The light-emitting element according to claim 1, wherein the host material includes an anthracene skeleton.

16. The light-emitting element according to claim 15, wherein the host material includes a diphenylanthracene skeleton.

17. The light-emitting element according to claim 15, wherein the host material includes a carbazole skeleton.

18. The light-emitting element according to claim 17, wherein the carbazole skeleton is a benzocarbazole skeleton.

19. The light-emitting element according to claim 17, wherein the carbazole skeleton is a dibenzocarbazole skeleton.

20. The light-emitting element according to claim 1, wherein the light-emitting material is a fluorescent substance.

21. The light-emitting element according to claim 1, wherein the light-emitting material emits blue fluorescence.

22. The light-emitting element according to claim 1, wherein the light-emitting material is a condensed aromatic diamine compound.

23. The light-emitting element according to claim 1, wherein the light-emitting material is a pyrenediamine compound.

24. A light-emitting device comprising a transistor over a substrate, and the light-emitting element according to claim 1.

25. An electronic device comprising a sensor, an operation button, a speaker or a microphone, and the light-emitting device according to claim 24.

26. A lighting device comprising a housing, and the light-emitting device according to claim 24.

27. A light-emitting element comprising:
a first electrode;
a second electrode; and
an EL layer,
wherein the EL layer is positioned between the first electrode and the second electrode,
wherein the EL layer includes a hole-injection layer, a first layer, a second layer, a third layer, and a fourth layer,
wherein the hole-injection layer includes an organic acceptor,
wherein the hole-injection layer is positioned between the first electrode and the first layer, wherein the second layer is positioned between the first layer and the third layer, wherein the fourth layer is positioned between the third layer and the second electrode, wherein the first layer includes a first hole-transport material, wherein the second layer includes a second hole-transport material, wherein the third layer includes a third hole-transport material, wherein the fourth layer includes a host material and a light-emitting material, wherein a HOMO level of the second hole-transport material is deeper than a HOMO level of the first hole-transport material, wherein a HOMO level of the host material is deeper than the HOMO level of the second hole-transport material, and wherein a difference between the HOMO level of the second hole-transport material and the HOMO level of the third hole-transport material is less than or equal to 0.3 eV.

28. The light-emitting element according to claim 27, wherein the organic acceptor is 2,3,6,7,10,11-hexacyano-1,4,5,8,9,12-hexaazatriphenylene.

* * * * *